(12) United States Patent
Kakimoto et al.

(10) Patent No.: US 6,868,885 B2
(45) Date of Patent: Mar. 22, 2005

(54) APPARATUS FOR MANUFACTURING LAMINATED MEMBER

(75) Inventors: Masakazu Kakimoto, Aichi-ken (JP); Fumiaki Matsumoto, Aichi-ken (JP); Hisashi Yasoda, Ishikawa-ken (JP); Makoto Furuta, Aichi-ken (JP)

(73) Assignee: UHT Corporation, Aichi-ken (JP)

( * ) Notice: Subject to any disclaimer, the term of this patent is extended or adjusted under 35 U.S.C. 154(b) by 30 days.

(21) Appl. No.: 10/102,746

(22) Filed: Mar. 22, 2002

(65) Prior Publication Data

US 2003/0159783 A1 Aug. 28, 2003

(51) Int. Cl.$^7$ .............................................. B32B 31/20
(52) U.S. Cl. ...................... 156/379; 156/513; 156/578; 156/580; 118/314; 118/323
(58) Field of Search ................................ 156/379, 578, 156/513, 385, 386, 387; 118/314, 323

(56) References Cited

U.S. PATENT DOCUMENTS

| | | | |
|---|---|---|---|
| 5,059,266 A | | 10/1991 | Yamane et al. |
| 5,126,529 A | * | 6/1992 | Weiss et al. .............. 219/121.6 |
| 5,196,064 A | * | 3/1993 | Branderhorst et al. ....... 118/313 |
| 5,260,009 A | * | 11/1993 | Penn ........................... 264/401 |
| 5,681,757 A | * | 10/1997 | Hayes .......................... 257/778 |
| 5,833,914 A | * | 11/1998 | Kawaguchi .................. 264/400 |
| 6,159,772 A | * | 12/2000 | Vinciarelli et al. .......... 438/115 |
| 6,177,714 B1 | | 1/2001 | Nagai |
| 6,503,831 B2 | | 1/2003 | Speakman |
| 2003/0183165 A1 | | 10/2003 | Kakimoto et al. |

FOREIGN PATENT DOCUMENTS

| | | |
|---|---|---|
| EP | 1074355 | 2/2001 |
| JP | 9232174 | 9/1997 |
| JP | 1015929 | 1/1998 |

OTHER PUBLICATIONS

English Language Abstract for 10–15929.
English Language Abstract for 9–232174.

* cited by examiner

*Primary Examiner*—Chris Fiorilla
*Assistant Examiner*—George R. Koch, III
(74) *Attorney, Agent, or Firm*—Greenblum & Bernstein, P.L.C.

(57) ABSTRACT

A manufacturing speed for a laminated member for every layer is increased to improve productivity and at the same time a small-sized manufacturing apparatus capable of being practically realized is provided. A base plate is mounted at a linear predetermined segment path in such a way that it can be reciprocated and moved up and down, each of one to a plurality of an insulating layer forming means for discharging ceramics slurry or insulating resin paste, conductive layer forming means for injecting conductive paste by an ink jet system and drying means for drying said slurry, paste are arranged side by side on the segment path, the thin film layer having a predetermined electrode pattern arranged thereon is formed on the ceramics insulating layer while the base plate reciprocates by once to several times over the segment path, and these operations are repeated to form the laminated member.

6 Claims, 53 Drawing Sheets

APPARATUS FOR MANUFACTURING LAMINATED MEMBER

BACKGROUND OF THE INVENTION

1. Field of the Invention

This invention relates to an apparatus for manufacturing a laminated member, and more particularly an apparatus for manufacturing some laminated electronic component parts such as a capacitor, an inductor or a resistor, a magnetic member and a filter or the like installed on the laminated substrate.

2. Description of the Related Art

As a usual method for manufacturing a typical ceramics laminated member of laminated members, it is well known in the art to provide some steps of coating ceramics slurry by a doctor blade process onto a carrier film composed of a long polyethylene terephthalate or the like; drying it; then printing a conductive paste onto the upper surface of dried slurry by a screen printing process; drying it to form a ceramics thin film layer; thereafter peeling off the thin film layer from the carrier film; cutting it into a predetermined shape in reference to a position of its inner electrode pattern; and laminating the cut thin film layers in sequence (refer to Japanese Patent Laid-Open No. Hei 10-15929).

However, in accordance with this prior art manufacturing method, after the thin film layers formed on a carrier film are peeled off by every one layer, they are laminated, so that it becomes necessary to arrange both a peeling mechanism and a laminating mechanism not only to cause a manufacturing device to become large in size but also to reduce its productivity, and it shows a problem in accuracy in positional alignment due to the fact that the thin film layers once peeled off are laminated.

In addition, it is also known as another manufacturing system to repeat a step for forming a ceramics insulating layer and a predetermined electrode Pattern on a metallic base plate so as to perform a direct lamination of the thin film layers (refer to a gazette of Japanese Patent Laid-Open No. Hei 9-232174).

In accordance with the gazette described above, the gazette illustrates the facts that although the base plate can be moved in both X-axis direction and Y-axis direction by a mechanism using a servo-motor and a ball screw or the like, a metallic endless belt is used in place of the base plate and in this case a desired number of slurry injection heads and a desired number of paste injection heads or the like are arranged in a predetermined order along an advancing direction of the endless belt, and the laminated members are manufactured in sequence as the endless belt advances in one direction.

However, even in the case that the metallic endless belt is used in place of the base plate, this system provides some inconveniences that it needs a large mounting floor area to cause the device to become large in size and its facility expenditure is increased in the same manner as found in the aforesaid prior art in reference to the number of arrangement of the slurry injection heads or the paste injection heads, addition of drying means for drying an insulation layer and an electrode layer, a temporary pressing means or a main pressing means for increasing a productivity and the recovering segment for the formed laminated member.

In addition, both ceramics slurry and the functional material paste were injected in a repetitive manner through the slurry injection head and the paste injection head above the base plates moving in both X-axis and Y-axis directions to form a laminated member, so that it was difficult to assure a flatness at each of the layers.

That is, the aforesaid prior art had a problem that a flatness of the surface became a deteriorated state due to a formation of some fine corrugations at the surface of a thin film layer formed under injection of either the ceramics slurry or functional material paste, and also showed a certain problem in an inner accuracy of the completed laminated member. Additionally, the prior art also had a problem that an injection work took much time due to the fact that the flat ceramics layer was formed by injecting ceramics slurry.

In addition, when a layer composed of some inner circuit elements is formed on the ceramics layer to form one thin film layer, a notch fitting segment is produced between the electrode layers at a layer composed of the inner circuit elements to deteriorate a flatness of the thin film layer, resulting in that when the thin film layers are laminated, a clearance is generated by the notch fitting segment and it may become a cause of generating a void in the electronic parts after baking operation.

The present invention has been invented in view of the aforesaid circumstances in the prior art and it is an object of the present invention to provide a small-sized manufacturing apparatus in a less-expensive manner capable of improving a productivity by increasing a manufacturing speed for every layer of the laminated member (including the laminated substrate) and at the same time capable of practically applying it.

It is another object of the present invention to provide an apparatus for manufacturing a laminated member producing no trouble at all for its practical application even if its working surface is of a rotary type for attaining a small size.

It is a still further object of the present invention to provide an apparatus for manufacturing a laminated member capable of producing a high quality laminated member having a high inner accuracy while increasing its manufacturing speed by forming a thin film layer having an electrode pattern in a well-flatness and high precision manner.

SUMMARY OF THE INVENTION

The apparatus for manufacturing a laminated member of the present invention described above is an apparatus for manufacturing a laminated member in which a base plate is mounted at a linear predetermined segment path in such a way that it can be reciprocated and moved up and down, one or a plurality of an insulating layer forming means for discharging ceramics slurry or insulating resin paste, a conductive layer forming means for injecting conductive paste by an ink jet system and a drying means for drying said slurry, paste are arranged side by side, and a thin film layer having a predetermined conductive pattern arranged thereon is formed on an insulating layer during a time in which said base plate reciprocates in said segment path by once to several times and these operations are repeated to form the laminated member (1st aspect).

That is, the present invention is characterized in that one or a plurality of requisite minimum number of an insulation layer forming means, a conductive layer forming means and a drying means are arranged side by side, and a base plate is reciprocated in a linear segment path where they are arranged and their predetermined works are effectively carried out at each of the steps during its forwarding operation and during its returning operation, respectively.

Although the arrangement of the insulation layer forming means, the conductive layer forming means and the drying means are properly set in response to some working steps such as an insulation layer forming step with the ceramics slurry or the insulating resin paste and an electrode layer forming step with the conductive paste or the like, the drying step with the drying means is frequently required, so that an arrangement of at least one or a plurality of these drying means at a substantial central part of the segment path is effective in view of working efficiency (2nd aspect).

This drying means can be optionally realized by any one of a heating or hot air system, a light radiation system, a laser radiation system or a hot plate press contacting system also acting as a temporary press contacting means to be described later, and further this drying means causes the insulating layer and the electrode layer to be semi-hardened state not sticking to each other.

Although, a well-known doctor blade system, an ink-jet system or a roller coating system or the like is employed as the insulating layer forming means, it is preferable to employ the ink jet system for at least one of the insulating layers so as to increase an accuracy in response to a dense formation of the insulating layer (3rd aspect). However, it is also optional to employ either the doctor blade system or the roller coating system at a portion where the insulating layer is formed at an entire surface of the thin film layer, i.e. to combine the ink jet system with another system.

For example, when electrode layers (conductive layers) are formed on the insulating layer to form one thin film layer, a notch fitting segment is generated between the electrode layers to cause a flatness of the thin film layer to be deteriorated and when these thin film layers are laminated to each other, a clearance is generated by the notch fitting segment and this becomes a cause for generating a void in an electronic parts after its baking operation.

In order to assure a flatness of the thin film layer, it is necessary to fill the notch fitting segment with the insulating layer and thus it contains a filling of ceramics slurry or insulating resin paste within a predetermined region except a region where eitner the notch fitting segment between the electrode layers formed by the conductive layer forming means or the electrode layer is formed (4th aspect). It is suitable to employ the ink jet system as the insulating layer forming means in that case.

In addition, when the laminated members are used for an inductor, it is necessary to form a bier electrode for connecting the electrode layers in the upper and lower thin film layers.

Since the conductive layer forming means is of an ink jet system, it is also possible to form the bier electrode with the conductive layer forming means. That is, it is satisfactory for the conductive layer forming means to inject the conductive paste through the ink jet system onto the electrode pattern and to form the bier electrode (5th aspect).

Further, it is satisfactory for the bier electrode to open a bier hole at an insulating layer through an ink jet system for the thin film layer and fill the conductive paste in the hole as usually performed. In addition, as a punching means, it is also preferable to employ the laser punching system. In this case, the laser punching means are added to the segment path and arranged side by side, the conductive paste is filled in the bier hole punched by the punching means under application of the conductive layer forming means of the ink jet system so as to form the bier electrode (6th aspect).

In addition, it is preferable to press the upper surface of the thin film layer at a proper time such as every time one thin film layer is formed so as to keep the uniform flatness from the fine corrugations generated at the ceramics slurry, insulating resin paste, conductive paste of the thin film layer, make a uniform laminated layer and increase an accuracy of lamination. In order to attain this effect, the temporary press contacting means comprised of a heating plate or a roll and the like are added to and arranged side by side against the segment path where the base plate is moved (7th aspect).

Then, as described above, if as the temporary press contacting means, the heating plate were used, this means could be used as both the drying means and the temporary press contacting means.

Further, a timing in which the temporary press contacting means is operated can be selected from any of timings, i.e. every time one thin film layer is formed, or every time several thin film layers are formed, further every time the reciprocating base plate goes forward or every time the reciprocating base plate returns back. Further, as described in Claim 4, in the case that ceramics slurry or insulating resin paste is filled in the notch fitting segment between the electrodes, flatness is assured to a certain degree, so that the temporary press contacting means is not necessarily required.

A preferred practical configuration of the temporary press contacting means is a pressing roll contacted with the ceramics slurry, the insulating resin paste, the conductive paste dried by the drying means and having a quite fine adhering characteristic at its surface and then a dust removing roller having an adhesive characteristic is contacted with the pressing roll (8th aspect).

With such an arrangement as above, after the ceramics slurry, insulating resin paste, conductive paste coated by the ink jet system or the like is dried by the drying means to such a degree as one in which it may not be adhered, some fine corrugations are made flat through contact with the pressing roll and at the same time some fine particle pieces peeled off from the convex portions are adhered to the pressing roll and removed, and the fine particle pieces adhered to the roll are adhered to the dust removing roll and removed.

In addition, it may also be applicable that the base plate is mounted on a worktable in such a way that it may be reciprocated and moved up and down at a predetermined segment, a plurality of supporting members are arranged side by side above the worktable, each of one of or a plurality of insulating layer forming unit for discharging the ceramics slurry or insulating resin paste, a conductive layer forming unit for injecting the conductive paste and a drying machine unit are removably fixed to these supporting members, a thin film layer having a predetermined conductive pattern arranged thereon is formed on the insulating layer while the base plate reciprocates one time or several times in the predetermined segment, these operations are repeated to form the ceramics laminated member (9th aspect).

Although a well-known doctor blade system and an ink jet system or a roller coating system or the like are employed as the insulating layer forming unit and the conductive layer forming unit, it is preferable that the ink jet system is employed in the conductive layer forming unit and the ink jet system is employed in at least one of the insulating layer forming units so as to correspond to a fine condensation of either the conductive layer or the insulating layer and increase its accuracy (10th aspect).

However, it is optional that either the doctor blade system or the roller coating system is employed at the portion where the insulating layer is formed on the entire one surface of the thin film layer, i.e. the ink jet system is combined with another system.

In the case that the conductive layer forming unit is formed as an ink jet system, it is also possible to form the bier electrode connecting the electrode layers of the upper and lower layers by the ink jet system. That is, it is possible to manufacture the laminated member for inductor having the bier electrode.

Then, it may also be applicable that the bier electrode is formed such that a bier hole is opened at the insulating layer of the thin film layer to fill the conductive paste to the hole and in this case, it is preferable that a laser punching system is employed as the punching means. More practically, it is constructed such that the laser punching unit for use in punching the bier hole is removably attached to the insulating layer (11th aspect).

In addition, in order to make some fine corrugations flat that are generated at either the ceramics slurry or conductive paste in the thin film layer, assure its flatness, make the laminated layer uniform and increase an accuracy in laminating layers, it is preferable to press the upper surface of the layer at a proper time such as every time one thin film layer is formed. Due to this fact, the temporary press contacting unit is removably attached for pressing the upper surface at a proper time in which the thin film layers are laminated (12th aspect).

This temporary press contacting means is provided with a heating plate or a roll and the like, and in the case of the temporary press contacting unit having the heating plate therein, the temporary press contacting unit may also provide a function of the drying machine unit, so that it is also possible to eliminate the drying machine unit.

In addition, as the timing in which the temporary press contacting unit is operated, any one of the timings, i.e. every time one thin film layer is formed, or every time several thin film layers are formed, or every time the reciprocating base plate moves forward or returns back can be selected.

Further, there is provided a CCD camera unit for inspecting an accuracy in finished states of the insulating layer and the conductive layer formed by the insulating layer forming unit and the conductive layer forming unit. That is, an image taking CCD camera unit is removably attached for inspecting the state of the thin film layer (13th aspect).

An image of the surface of the formed thin film layer is taken at a proper time with this camera unit and the taken image is processed to detect a presence or a non-presence of a pinhole in the insulating layer, or a cut line in the conductive layer (for example, electrode layer) which is generated by a clogging at the ink jet nozzle or the like.

Then, it is also applicable that a polygonal-shaped rotary drum having a flat work surface defined in a continuous manner at its outer circumference is mounted in such a way that it can be intermittently rotated, there is provided a film supplying mechanism for winding a carrier film around the outer circumference of the rotary drum and laying it onto each of the work surfaces, each of one or a plurality of insulating layer forming means for discharging the ceramics slurry or insulating resin paste, conductive layer forming means for injecting the conductive paste through the ink jet system and drying means for drying the slurry, paste are arranged at the work stage opposing against the work surface under the stopped state of the rotary drum, at least one thin film layer having a predetermined coductive pattern arranged on the insulating layer is formed on the carrier film at the work surface every time the rotary drum rotates once and at the same time the laminated member is formed through repetitive action of the rotating operation (14th aspect).

That is, the present invention is characterized in that the work stage is constituted for every work surface at the outer circumference of the rotary drum intermittently rotated, either a forming work or a drying work for the insulating layer and/or the conductive layer is applied at each of the stages to cause the thin film layer of the laminated member to be formed and at the same time the laminated state of the thin film layer is held positively by the carrier film arranged at each of the work surfaces.

The rotary drum is provided with a suction hole where it is sucked with vacuum in an inward direction at the work surface of the rotary drum for closely contacting the carrier film with each of the work surfaces under its tensioned state (15th aspect).

In addition, it is preferable to dry the upper surface of the thin film layer just after either the insulating layer or the conductive layer is formed for increasing a manufacturing speed of the thin film layer, in other words, for shortening a required time for one rotation of the rotary drum and then the drying means is arranged at each of the work stages just after the insulating layer forming means or the conductive layer forming means (16th aspect).

It is optional for the drying means to employ any one of the heating or hot air heating system, a light radiation system, a laser beam radiation system or the heating plate press contacting system also acting as the temporary press contacting means or the press contacting means (the main press contacting) and this drying means causes the insulating layer and the conductive layer to be semi-hardened state nor sticking by themselves.

Although a well-known doctor blade system, an ink jet system or a roller coating system and the like are employed as the insulating layer forming means, it is preferable for the work stage increasing an accuracy in correspondence with a fine condensation of the insulating layer to employ the ink jet system for at least one of the stages (17th aspect). However, it is also optional that either the doctor blade system or the roller coating system is employed at the portion where the insulating layer is formed in an entire surface of one layer of the thin film layers, i.e. the ink jet system is combined with another system.

Then, in the case that both the conductive layer forming means and the insulating layer forming means are of an ink jet system, it is important in particular to control a position of the ink jet nozzle. As its positional control, when the conductive layer forming means operates at first at each of the work surfaces, a reference mark is applied on the carrier film by the conductive layer forming means, a CCD camera is arranged in opposition to the work stage where the conductive layer forming means and the insulating layer forming means of the ink jet system are arranged, and the reference mark of which image is taken with the camera is processed for its image to cause the conductive layer forming means and the insulating layer forming means to be set for their position (18th aspect).

In addition, in the case that the insulating layer forming means forms the insulating layer through the ink jet system, it is preferable to arrange the temporary press contacting means for pressing against the insulating layer at a work stage of its subsequent step, thereby the upper surface of the insulating layer is made flat (19th aspect).

In addition, in the case that the laminated member is for an inductor, it is necessary to form the bier electrode connecting the electrode layers (conductive layers) in the upper and lower thin film layers.

Since the conductive layer forming means is of an ink jet system, it is also possible to form the bier electrode by the conductive layer forming means. That is, the conductive layer forming means may inject the conductive paste through the ink jet system onto the electrode pattern to form the bier electrode. In this case, it is also possible that the conductive layer forming means and the insulating layer forming means are arranged at the same work stage, and ceramics slurry or insulating resin paste is filled by the insulating layer forming means between the electrode layers Formed by the conductive layer forming means to form the insulating layer (20th aspect).

In addition, it is preferable that the upper surface of the thin film layer is pressed for making some fine corrugations generated at the ceramics slurry, insulating resin paste, conductive paste in the thin film layer flat, assuring its flatness, unifying the laminated layers and increasing an accuracy in lamination. Due to this fact, the temporary press contacting means for pressing the upper surface at a proper time when the thin film layers are laminated is added to and arranged at one work stage of the rotary drum (21st aspect).

Additionally, the timing when the temporary press contacting means can be selected from any one of every time when one thin film layer is formed or every time when several thin film layers are formed and the like.

Further, after the rotary drum is rotated by predetermined times and the laminated member is formed at each of the work surfaces, it is necessary to recover the laminated members from the rotary drum. Due to this fact, a cutting means for cutting the carrier film for every work surface and separately dividing the laminated member is arranged at the work stage for the rotary drum and at the same time the laminated member recovering mechanism for recovering the divided laminated member (22nd aspect).

Then, the preferable arrangement for the cutting means and the laminated member recovering mechanism is set such that the cutting means is a next work stage subsequent to the work stage where the temporary press contacting means is arranged, and the laminated member recovering mechanism is a work stage where the work surface of the rotary drum is stopped at the lower-most end of it (23rd aspect).

In addition, each of the insulating layer forming means for discharging ceramics slurry or insulating resin paste, the conductive layer forming means for injecting the conductive paste through the ink jet system and the drying means for drying either the slurry, the paste is mounted above the work stage in such a way that they can be loaded or unloaded; the insulating layer forming means, the drying means and the conductive layer forming means are loaded or unloaded above the work stage, thereby the thin film layer having a predetermined coductive pattern arranged on the insulating layer is formed on the work stage, the loading or unloading of the insulating layer forming means, the drying means and the conductive layer forming means are repeated to form the laminated member comprised of the predetermined thin film layer (24th aspect)

That is, the present invention is characterized in that the worktable is of a fixed type, the insulating layer forming means, the conductive layer forming means and the drying means loaded into or unloaded from above the worktable perform forming of the insulating layer above the work table, forming of the conductive layer on the insulating layer and drying of the insulating layer and the conductive layer, these operations are repeated to laminate the laminated members on the fixed type work table.

It is optional that as the drying means, any one of a heating or hot air system, a light radiation system, a laser radiation system or a heating plate press contacting system can be applied and the insulating layer and the conductive layer are set to such a semi-hardened state as one in which they are not adhered to each other.

In addition, although as the insulating layer forming means and the conductive layer forming means, a commercially available doctor blade system, the ink jet system or the roller coating system or the like are employed, it is preferable to employ the ink jet system in order to adapt for a density formation of the conductive layer or the insulating layer and increase accuracy (24th, 27th and 32nd aspects).

Further, when the conductive layers are formed on the insulating layer to form one thin film layer, the notch fitting segment is generated between the conductive layers, resulting in that a flatness of the thin film layer is damaged and this becomes a cause for producing a void in an electronic parts after baking while producing a clearance by the notch fitting segment when these thin film layers are laminated. In order to assure a flatness of the thin film layer, it is necessary to fill the notch fitting segment with the insulating layer, so that the insulating layer forming means fills ceramics slurry or insulating resin paste through an ink jet system between the conductive layers formed by the conductive layer forming means (28th aspect).

In addition, it is also applicable that the ceramics slurry or insulating resin paste is injected through an ink jet system to form an insulating layer having a bier hole, a conductive pattern is formed in the bier hole with the conductive paste injected from the conductive layer forming means comprised of the ink jet system and a bier electrode is formed in the bier hole (34th, 35th aspects). With such an arrangement as above, any additional punching means is not required and the present invention becomes more preferable in view of facility cost and an occupied area of an installing area.

It is of course apparent that the doctor blade system, ink jet system or roller coating system is employed at a segment where the insulating layer is formed on the entire one surface of the thin film layer, and in this case, the bier hole is punched with a laser punching system and the bier electrode is formed with the conductive paste infected from the conductive layer forming means comprised of the ink jet system into the bier hole (29th, 33rd aspects).

Then, assembling the insulating layer forming means, drying means, conductive layer forming means and laser punching means around the work stage is preferable for making a small space of the installing space (30th, 36th aspects).

In this case, when the four corners on the work stage are released, the insulating layer forming means, drying means, conductive layer forming means and laser punching means can be loaded onto or unloaded from above the work stage independently from each of the released segments, or when the laser punching means is not required, each of the insulating layer forming means, drying means and conductive layer forming means can be loaded onto or unloaded from above the work stage independently from three released segments, and further when only two released segments above the work table are released, the insulating layer forming means, drying means, conductive layer forming means and laser punching means can be dispersed at two segments, arranged side by side in forward or rearward or rightward or leftward direction and can be loaded onto or unloaded from above the work stage independently. That is, a mounting pattern of each of the means is set in reference to a layout of the released segment on the worktable.

In addition, when there is provided a temporary press contacting means for pressing the thin film layer every time one or a plurality of thin film layers are formed, this means is effective for unifying some corrugations generated at the upper surface of the thin film layer and for increasing a close fitness of each of the thin film layers (25th aspect).

This temporary press contacting operation enables some fine corrugations generated on the upper surface of the thin film layer by each of the layers in the insulating layer, conductive layer and thin film to be made flat to attain a degree of flatness and a degree of horizontal state and further and further enables a shape deterioration of the laminated member under a main press contacting operation to be prevented in advance.

Additionally, as the temporary press contacting timing when the press contacting means is operated, it is optional that any one of every time one thin film layer is formed or every time several thin film layers are formed may be selected.

Then, it would be preferable in view of making a small-sized device if the press contacting means is mounted above the work stage while assuring a layer laminating space for the thin film layers between it and the work stage (26th aspect).

Then, a preferable and practical configuration of the press contacting means is a structure in which a pressing is carried with a predetermined light pressing force by a press plate controlled to be enabled to move up and down, i.e. a pressing is carried out with a predetermined light pressing force by a presser roll reciprocated in rightward and leftward directions.

Then, although a main press fitting is carried out after the temporary press fitting operation, means for performing the main press fitting operation is constituted such that;

a press contacting means is arranged above the work stage, and each of the insulating layer forming means for discharging ceramics slurry or insulating resin paste, the conductive layer forming means for injecting the conductive paste through an ink jet system and the drying means for drying either the slurry, the paste is mounted between the work stage and the press contacting means in such a way that they can be loaded into or unloaded from it;

there are provided a shielding means to cause a layer laminating space at least above the work stage to be non-communicated with surrounding atmosphere and a vacuum applying means for changing at least an inner space of a layer laminating space into a vacuum atmosphere when the insulating layer forming means, drying means and conductive layer forming means are retracted;

when temporary press contacting operation is carried out with the press contacting means every time the loading or unloading of the insulating layer forming means, drying means and conductive layer forming means is repeated to form the desired number of thin film layers, and the laminated member is temporarily press contacted with the predetermined number of thin film layers, the layer laminating space is closed with the shielding means and the laminated member is mainly press contacted while the vacuum applying means is being operated, resulting in that a more effective operation can be carried out (31st aspect).

The press contacting means described in 31st aspect may be formed into a structure that can be acted for both the temporary press contacting and the main press contacting, or a structure in which the press contacting means at the time of temporary press contacting and the press contacting means at the time of main press contacting are separately arranged. In the case that they are separately arranged, as the temporary press contacting means, for example, the pressing roller system reciprocated while being loaded into or unloaded from the layer laminating space is employed, and as the main press contacting means, the press plate pressing system is employed. In the case that Whey are acted together, the press plate pressing system can be applied, for example.

An object of the main press contacting operation consists in removing air left between the insulating layer and the conductive layer as described above and each of the layers is fixed.

Due to this fact, after the laminated member having a predetermined number of thin film layers is formed while one or a plurality of thin film layers are temporarily press contacted every time they are formed as described above, a layer laminating space above the work stage is closed with the shielding means to cause the laminated member to be mainly press contacted by a predetermined pressing force while operating the vacuum applying means such as a fan or the like to enable the apparatus of the present invention to be used for both the temporary press contacting machine and the main press contacting machine.

As the shielding means, an upward or downward sliding window and a shutter can be applied as its one example.

The press contacting means is not limited to the press plate, but as described above, it may be a reciprocating press roll. Since one pressing force at the time of temporary press contacting operation and the other pressing force at the time of main press contacting operation are different from each other, it is satisfactory in the case of the pressing roll that as an actuator for supporting the pressing roll in such a way that it can be controlled for its upward or downward motion, an actuator capable of changing the pressing force is used.

In addition, the laminated member which becomes an object of manufacturing is constructed such that the insulating layer and the conductive layer are laminated alternatively up to a predetermined number of thin film layers, so that more practically it may be constituted such that the work stage described above or the insulating layer forming means, conductive layer forming means and drying means can be controlled for their upward or downward motion. In the case that it is adapted by the work stage, the work stage is controlled to descend by a predetermined amount every time the ceramics slurry or insulating resin paste is discharged (injected) and every time the conductive paste is injected and in turn in the case that it is adapted by the insulating layer forming means, conductive layer forming means and drying means, they are controlled to ascend by a predetermined amount every time the ceramics slurry or insulating resin paste is similarly discharged (injected) and every time conductive paste is injected.

Then, there is provided an apparatus for manufacturing the laminated member comprised of an insulating sheet laminating means for overlapping the insulating sheets; a conductive layer forming means for injecting conductive paste onto the insulating sheets; and an insulating layer forming means for discharging the ceramics slurry or insulating resin paste onto the insulating sheets, wherein it may also be applicable that the laminated member having the thin film layers with a predetermined conductive pattern arranged therein is formed between each of the sheets of a plurality of insulating sheets under repetition of each of the means (37th aspect).

That is, the present invention is characterized in that one or a plurality of minimum requisite number of insulating layer forming means and conductive layer forming means are arranged side by side, the base plate is reciprocated at a linear segment path where they are arranged, and a predetermined work is carried out effectively at each of the steps at the time of forwarding operation and at the time of returning operation.

Although a well-known doctor blade system, ink jet system or roller coating system and the like are employed as the insulating layer forming means, it is preferable to employ the ink jet system for increasing an accuracy while adapting for a density formation of the insulating layer.

In addition, it is preferable that the base plate is mounted at a linear predetermined segment path in such a way that it may be reciprocated and moved in an upward or downward direction, one or a plurality of conductive layer forming means and insulating layer forming means are arranged side by side on the segment path, the insulating sheet is supplied by the insulating sheet laminating means while the base plate reciprocates at the segment path by one or several times, the insulating sheet is supplied by the insulating sheet laminating means, a thin film layer having a predetermined conductive pattern arranged by the conductive layer forming means and the insulating layer forming means is formed on the insulating sheet, and they are repeated to form the laminated member (38th aspect).

Then, the conductive layer forming means is an conductive layer forming unit for injecting the conductive paste, the insulating layer forming means is an insulating layer forming unit for discharging the ceramics slurry or insulating resin paste, the base plate is mounted on the work table at a predetermined segment in such a way that it may be reciprocated and moved up and down, a plurality of supporting members are arranged side by side above the work table and each of one or a plurality of the insulating layer forming unit and the conductive layer forming unit is removably attached to these supporting members (39th aspect).

Additionally, a polygonal-shaped rotary drum having the flat work surface defined in a continuous manner at its outer circumference in such a way that it can be intermittently rotated, each of one or a plurality of the insulating sheet laminating means, insulating layer forming means and conductive layer forming means are arranged at the work stage opposing against the work surface under a stopped state of the rotary drum, at least one thin film layer having a predetermined conductive pattern is formed on the insulating sheet of the work surface supplied by the insulating sheet laminating means every time the rotary drum once rotates and at the same time the laminated member is formed under repetition of the rotating operation (40th aspect).

In addition, if the work surface of the rotary drum were provided with an suction hole which is vacuum sucked from inside and the insulating sheet were adsorbed and held at the work surface, the carrier film could be closely contacted with each of the work surfaces under its tensioned state.

Further, it is also applicable that the insulating laminated layer means, the insulation layer forming means and the conductive layer forming means are mounted in such a way that they may be loaded in or unloaded from above the base plate, these insulating sheet laminating means, insulating layer forming means and conductive layer forming means are loaded in or unloaded from above the base plate, the thin film layer having a predetermined conductive pattern arranged on the insulating sheet is formed on the base plate, and the laminated member is formed through repetition of loading or unloading of each of these means (41st aspect).

If any one of the aforesaid inventions were provided with a pressing means for pressing upper surfaces of the insulating sheets at a proper time when the insulating sheets are overlapped to each other, the upper surface of the insulating sheet might be made flat due to the fact that the upper surface of the insulating sheet is pressed by the pressing means, thereby an accuracy in lamination of subsequent thin film layer could be increased, a close fitness between the insulating sheet and the thin film layer could be increased to cause each of the layers to be uniformly integrated and at the same time a high quality laminated member could be attained.

It is also applicable that the pressing means for pressing the upper surfaces of the insulating sheets at a proper time when the insulating sheets are overlapped to each other is arranged above the base plate; the insulating sheet laminating means, the conductive layer forming means and the insulating layer forming means are mounted above the base plate in such a way that each of them may be loaded or unloaded; there ace provided a shielding means for making at least the laminating space above the base plate non-communicated with surrounding atmosphere when these insulating sheet laminating means, conductive layer forming means and insulating layer forming means are retracted, and vacuum applying means for changing at least the inner side of the laminating space into vacuum atmosphere; the ceramics laminating member formed under repetitive loading or unloading of the insulating sheet laminating means, insulating layer forming means and conductive layer forming means is pressed by the pressing means while the laminating space is closed by the shielding means and the vacuum applying means is being operated (42nd aspect)

Further, as the ceramics slurry, raw material of mixtures composed of glass powder having additive substances (for example, MgO, CaO, $Al_2O_3$, $K_2O$, ZnO or the like) added to borosilicate glass forming substance and ceramics such as alumina, mullite, cordierite, quartz or the like as glass complex-oriented material and raw material composed of cordierite-oriented and a spodumene-oriented crystallized glass powder as crystalline glass-oriented material are used.

In addition, copper-oriented conductive material, for example, or tungsten W, molybdenum Mo and manganese Mn or the like are used as the conductive paste for the electrode pattern, and further silver-oriented conductive material having a low conductive resistance, for example, silver, silver-palladium, silver-platinum, silver-palladium-platinum or the like are used as conductive paste for a bier electrode.

Further, as the conductive paste with a resistor pattern, carbon, carbon-silver or the like is applied.

Further, it is also applicable that, as materials of ceramics slurry, insulating resin paste and conductive paste, an optical-hardening material for promoting drying state through an optical radiation is included.

DESCRIPTION OF THE PREFERRED EMBODIMENTS

Figure 1:
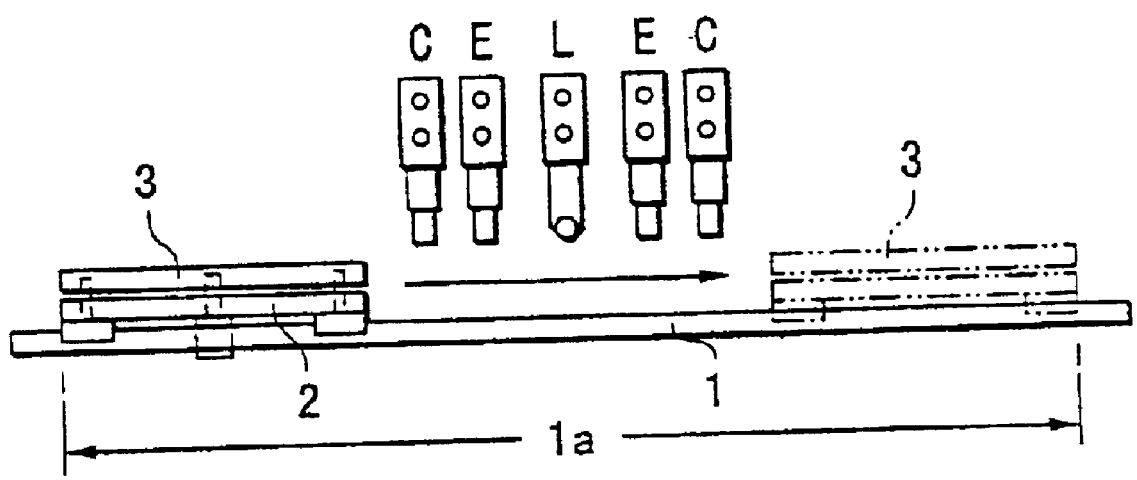
FIG. 1 is a side elevational view for showing a schematic configuration of a first invention.

Referring now to the drawings, some preferred embodiments of the present invention will be described as follows.

Then, some preferred embodiments of the present invention will be described as follows, wherein in the case of the present preferred embodiments, the laminated type capacitor and laminated type inductor of the laminated type electronic component parts are described.

That is, the preferred embodiments illustrate a manufacturing apparatus for manufacturing the laminated capacitor and laminated inductor by coating ceramics slurry through the insulating layer forming means, arranging the electrode pattern on the insulating layer through the conductive layer forming means to form the thin film layer and repeating these operation.

A first invention of the apparatus for manufacturing the laminated member shown in FIGS. 1 to 17 will be described as follows, wherein FIG. 1 schematically shows a manufacturing apparatus that is installed within a machine frame not shown, wherein a movable table 2 is reciprocatably mounted on a guide rail 1 arranged in a linear horizontal manner, the upper surface of the movable table 2 is constituted by a stainless steel base plate 3 which can be moved up and down, and a segment path 1a where the base plate 3 reciprocates is formed by the guide rail 1.

The segment path 1a is a linear path having substantially equal width as that of the base plate 3, wherein either a doctor blade or an ink jet nozzle or the like acting as an insulating layer forming means C, an ink jet nozzle acting as a conductive layer forming means E and a thermal radiating segment and an optical radiating segment acting as a drying means L are arranged side by side on the upper part of the path and further either a laser punching means P or a temporary press contacting means is properly added and they are arranged side by side.

A length of the segment path 1a is about 1.5 to 2 m.

The movable table 2 reciprocates in a longitudinal direction (a direction X) of the segment path 1a by a driving source such as a usual type of a servo motor, a pulse motor and a stepping motor not shown and a screw shaft rotated by the driving source to cause the base plate 3 to be moved along the segment path 1a, wherein both its moving direction and speed are controlled by a controller.

The base plate 3 is also moved up and down by the driving source such as a usual type of a servo motor, a pulse motor and a stepping motor and a screw shaft rotated by the driving source, its moving-up and moving-down operation is controlled by the controller in such a way that the base plate descends in sequence in response to the laminating steps.

The ink jet nozzle acting as the insulating layer forming means C and the conductive layer forming means E is constructed such that many nozzles are arranged side by side with a fine clearance in a direction crossing with the segment path 1a, and the drying means L also extends in a direction crossing with the segment path 1a.

Figure 2:
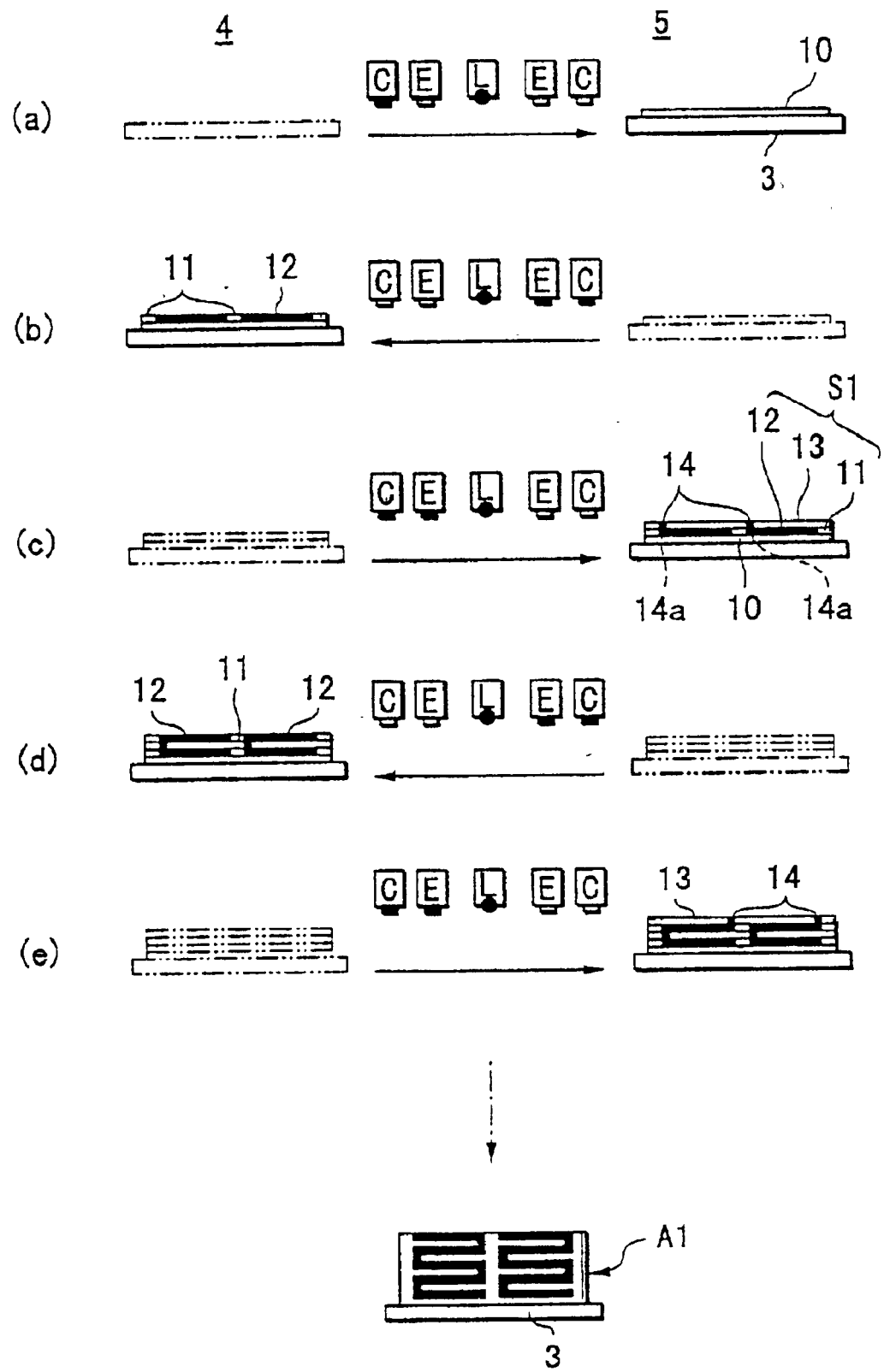
FIG. 2 is a side elevational view for showing some work steps in a first preferred embodiment.

FIG. 2 shows a first preferred embodiment of a first invention for indicating an apparatus for manufacturing a laminated member A1 for an inductor, the optical radiating segment L acting as a drying means is arranged at a substantial central part of the segment path 1a and its both sides are provided with each of a paste nozzle E for injecting conductive paste from the ink jet nozzle and a slurry nozzle C for injecting ceramics slurry from the ink jet nozzle, respectively.

A going state of the base plate 3 corresponds to a case in which the base plate moves from a left side stage 4 to a right side stage 5 as viewed in the figure, and a returning state corresponds to a case in which the base plat moves in an opposite direction, and the optical radiating segment L, paste nozzle E and slurry nozzle C indicate that each of the members having their lower ends fully shaded is in an operating state or each of them may operate at the time of reaching of the base plate 3. The aforesaid arrangement is similarly applied up to an eighth preferred embodiment described as follows.

In the first preferred embodiment, work steps (a) to (e) described below in reference to FIG. 2 will be carried out.

Figure 15:
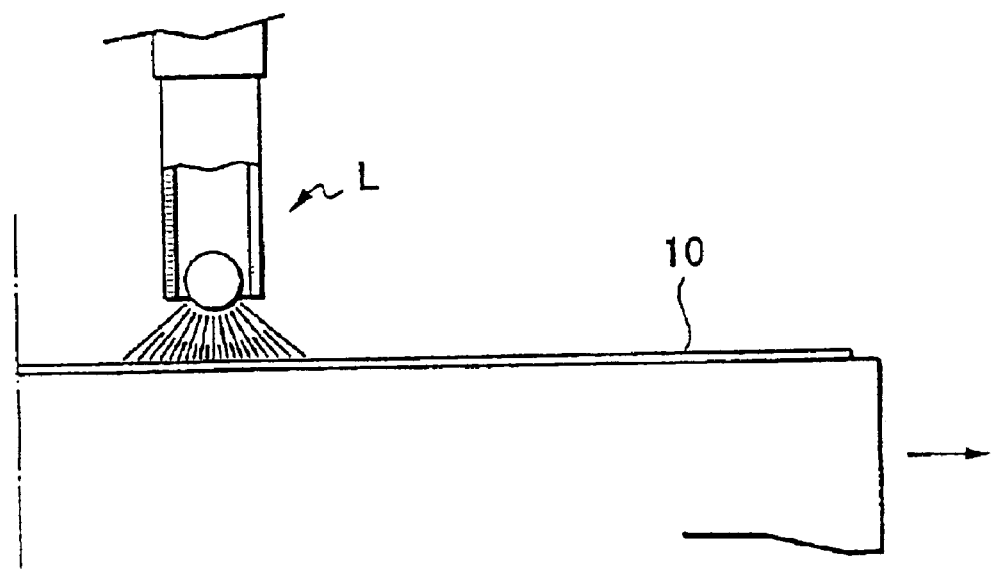
FIG. 15 is an enlarged view for showing a drying step performed by a drying means.

FIG. 2(a):

Both the left side slurry nozzle C and the optical radiation segment L are operated at the first going time from the stage 4 of the base plate 3, the ceramics slurry is injected through the slurry nozzle C to form a base insulating layer 10 of predetermined area on the base plate 3 (for its details, refer to FIG. 10), and then the insulating layer 10 is dried by the optical radiation segment L to attain such a semi-hardened state as one in which it may not be adhered (for its details, refer to FIG. 15).

FIG. 2(b):

The right side slurry nozzle C, the paste nozzle E and the optical radiation segment L are operated at the time of returning operation of the base plate 3.

Figure 12:
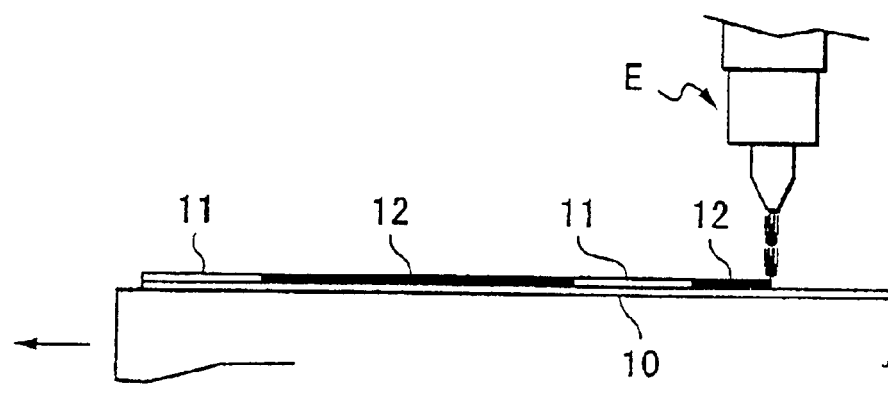
FIG. 12 is an enlarged view for showing some electrode layer forming steps performed by a conductive layer forming means.
Figure 13:
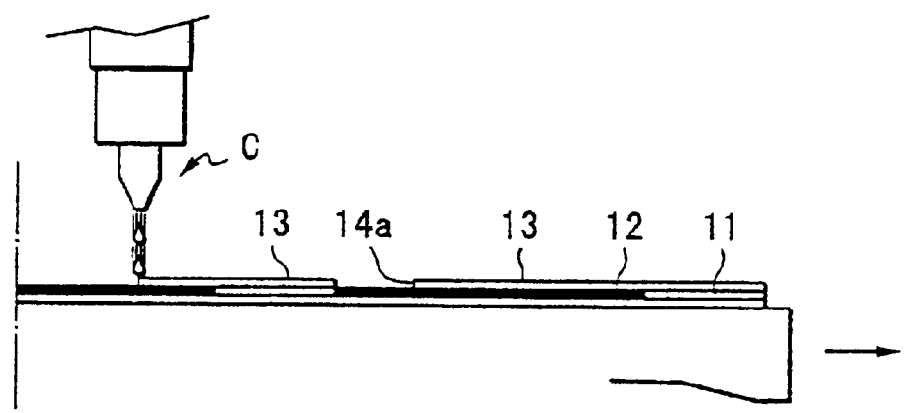
FIG. 13 is an enlarged view for showing some electrode layer forming steps performed by an insulating layer forming means.

The ceramics slurry is injected on the base insulating layer 10 and in an area except the electrode pattern 12a to form a spacer insulating layer 11 (for its details, refer to FIG. 11), then the base plate 3 passes below the paste nozzle E to cause the conductive paste to be injected through the nozzle E and thus an electrode layer 12 is formed at the electrode pattern 12a (for its details, refer to FIG. 12).

After this operation, when the base plate 3 passes through the optical radiation segment L, both the spacer insulating layer 11 and the electrode layer 12 formed into a predetermined pattern are dried

FIG. 2(c):

Then, the left side slurry nozzle C, the passe nozzle E and the optical radiation segment L are operated at the time of re-returning operation of the base plate 3.

Figure 14:
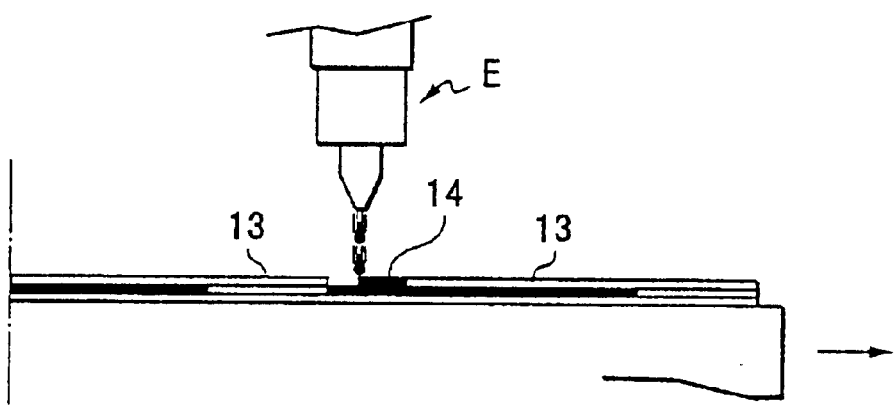
FIG. 14 is an enlarged view for showing some bier electrode forming steps performed by a conductive layer forming means.

The ceramics slurry is injected on the spacer insulating layer 11 and the electrode layer 12 and in an area except a bier electrode segment 14a to form the insulating layer 13 (for its details, refer to FIG. 13), then the base plate 3 passes below the paste nozzle E to cause the conductive paste to be injected through the nozzle E and thus a bier electrode 14 is formed at the bier electrode segment 14a (for its details, refer to FIG. 14).

In this way, a thin film layer of the base insulating layer 10 is formed at the former step and in FIG. 2(a), and a thin film layer S1 composed of the electrode layer 12 having the bier electrode 14 and the base insulating layer 11 and the insulating layer 13 is formed at the step in which the base plate 3 once reciprocates and in FIGS. 2(b), (c).

After this operation, the operations shown in FIGS. 2(d), (e) . . . where the operations shown in FIGS. 2(b), (c) are repeated are performed in a continuous manner, thereby the laminated member A1 for an inductor having many thin film layers S1 laminated to each other is manufactured.

This laminated member A1 is constructed such that a thickness of the thin film layer S1 is about 20 to 200 μm, the number of laminated layers is about several tens or so, they are mainly press contacted on the stage 5 of the apparatus, for example, or moved to another location and mainly press contacted there, thereafter they are baked to attain an inductor.

Although a less number of electrode patterns are indicated in the thin film layer S1 for sake of drawing circumstances, actually many patterns are formed at the thin film member S1 in such a way that many inductors can be taken from the laminated member A1. This operation is similarly applied to the following preferred embodiments.

Figure 3:
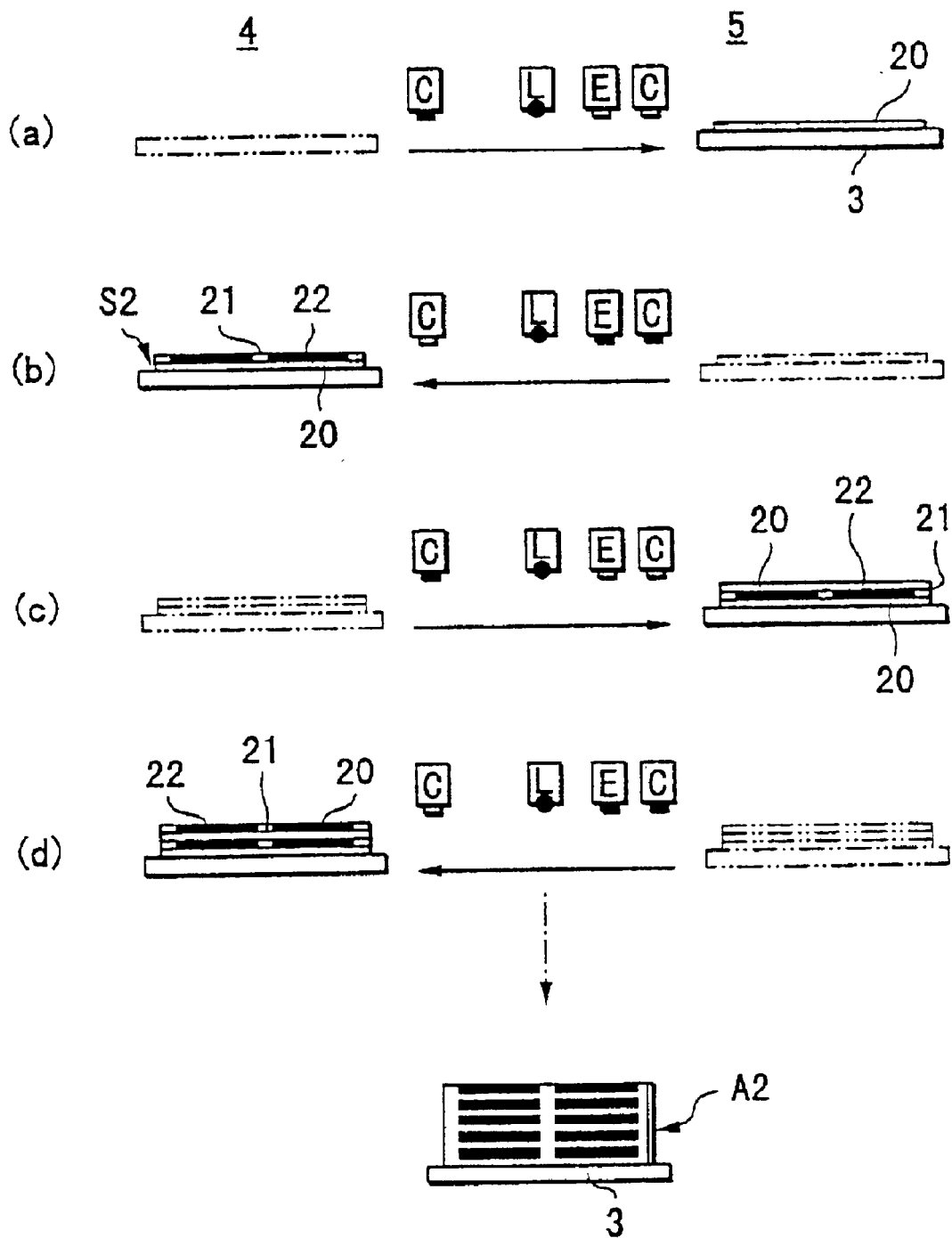
FIG. 3 is a side elevational view for showing some work steps in a second preferred embodiment.

FIG. 3 shows a second preferred embodiment of the first invention, wherein it indicates an apparatus for manufacturing a laminated member A2 for a capacitor, a substantial central part of the segment path 1a is provided with the optical radiating segment L acting as a drying means, the stage side is provided with only the slurry nozzle C for use in injecting the ceramics slurry from the ink jet nozzle, and the other side of it is provided with the paste nozzle E for injecting conductive paste from the ink jet nozzle and the slurry nozzle C for injecting ceramics slurry from the ink jet nozzle, respectively.

That is, in the case of capacitor, the bier electrode is not required, so chat the paste nozzle E at one side is eliminated. In this case, although the eliminated paste nozzle E can be removed in advance, it may be made non-motion type while it is arranged.

In the second preferred embodiment, work steps (a) to (d) described below in reference to FIG. 3 will be carried out.
FIG. 3(a):

At the time of initial going operation from the stage 4 of the base plate 3, both the left side slurry nozzle C and the optical radiation segment L are operated, ceramics slurry is injected through the slurry nozzle C to form the insulating layer 20 having a predetermined area and then the insulating layer 20 is dried by the optical radiation segment L.
FIG. 3(b):

At the time returning operation of the base plate 3, the right side slurry nozzle C, the paste nozzle E and the optical radiation segment L are operated.

The ceramics slurry is injected into a predetermined area on the insulating layer 20 through the slurry nozzle C to form the spacer insulating layer 21, and then the base plate 3 passes below the paste nozzle E to cause the conductive paste to be injected through the nozzle E and the electrode layer 22 is formed at an area where no spacer insulating layer 21 is coated.

After this operation, when the base plate 3 passes through the optical radiation segment L, both the spacer insulating layer 21 and the electrode layer 22 formed into a predetermined pattern are dried.

Then, in FIGS. 3(a), (b) where the base plate 3 is reciprocated once, a thin film layer S2 comprised of the electrode layer 22 and the insulating layers 21, 20 is formed.

After this operation, the operations shown in FIGS. 3(c), (d) . . . where the operations shown in FIGS. 3(a), (b) are repeated are performed in a continuous manner, thereby the laminated member A2 for an inductor having many thin film layers S2 laminated to each other is manufactured.

Figure 4:
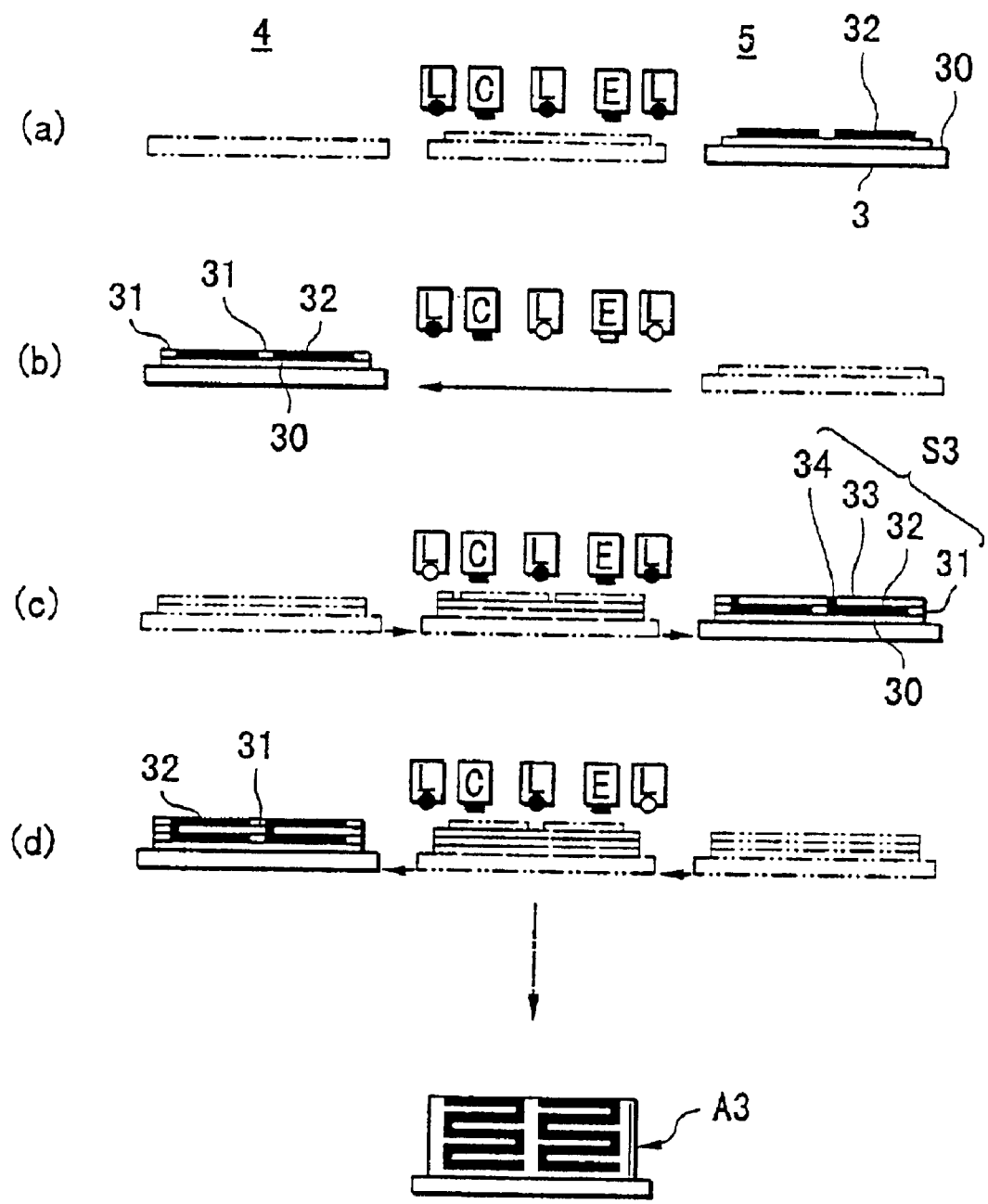
FIG. 4 is a side elevational view for showing some work steps in a third preferred embodiment.

FIG. 4 shows a third preferred embodiment of a first invention, wherein it indicates an apparatus for manufacturing the laminated member A3 for an inductor in which the optical radiating segments L acting as the drying means are spaced apart at the substantial central part in the segment path 1a and both sides of its right and left portions, the slurry nozzle C is arranged between the optical radiating segments L, L at one side (side of the stage 4) and at the same time the paste nozzle E is arranged between the optical radiating segments L, L at the other side (side of the stage 5).

In the third preferred embodiment, work steps (a) to (d) described below in reference to FIG. 4 will be carried out.
FIG. 4(a):

The slurry nozzle C, paste nozzle E, central and right side optical radiating segments L are operated at the time of initial going operation of the base plate 3 from the stage 4.

Ceramics slurry is injected through the slurry nozzle C to form the base insulating layer 30 of predetermined area on the base plate 3, the ceramics slurry is dried while the base insulating layer 30 passes below the central optical radiating segment L, then when the base insulating layer 30 passes below the paste nozzle E, conductive paste is injected through the paste nozzle E to form electrode layers 32 composed of a predetermined electrode pattern.

The electrode layers 32 are dried while they are passing below the right optical radiating segment L.
FIG. 4(b):

The slurry nozzle C and the left side optical radiating segment L are operated at the time of returning motion of the base plate 3.

The ceramics slurry is injected through the slurry nozzle C in such a way that the ceramics slurry fills between the electrode layers 32 on the base insulating layer 30, and the spacer insulating layer 31 is dried while it is passing below the Deft side optical radiating segment L.
FIG. 4(c):

Then, the paste nozzle E, slurry nozzle C, central and left side optical radiating segments L are operated at the time of re-returning operation of the base plate 3.

Conductive paste is injected through the paste nozzle E onto the insulating layer 33 and the bier electrode 34 to form electrode layers 32 composed of a predetermined electrode pattern and after the electrode layers 32 are dried by the optical radiating segments L, the base plate 3 passes below the slurry nozzle C to cause the ceramics slurry to be injected through the nozzle C to an area where the electrode layers 32 are not coated and then the spacer insulating layer 31 is formed. The spacer insulating layer 31 is dried by the left side optical radiating segment L.
FIG. 4(d):

Then, the paste nozzle E, slurry nozzle C, central and left side optical radiating segments L are operated when the base plate 3 returns again.

Conductive paste is injected through the paste nozzle E onto the insulating layer 33 and the bier electrode 34 to form electrode layers 32 composed of a predetermined electrode pattern and after the electrode layers 32 are dried by the optical radiating segments L, the base plate 3 passes below the slurry nozzle C to cause the ceramics slurry to be injected through the nozzle C to an area where the electrode layers 32 are not coated and then the spacer insulating layer 31 is formed. The spacer insulating layer 31 is dried by the left side optical radiating segment L.

Subsequent to FIGS. 4(a) to (d), the operations illustrated in FIGS. 4(c) and (d) where the base plate 3 reciprocates once are repeated to attain the laminated member A3 for an inductor in which a thin film layer S3 composed of both the electrode layer 32 having the bier electrode 34 and the insulating layers 31, 33 is laminated.

In accordance with this third preferred embodiment, each of the layer surfaces is dried by the drying means every time either the insulating layer or the electrode layer is formed, so that either a coating accuracy or a printing accuracy of the spacer insulating layer 31, electrode layer 32, insulating layer 33 and bier electrode 34 is improved.

Figure 5:
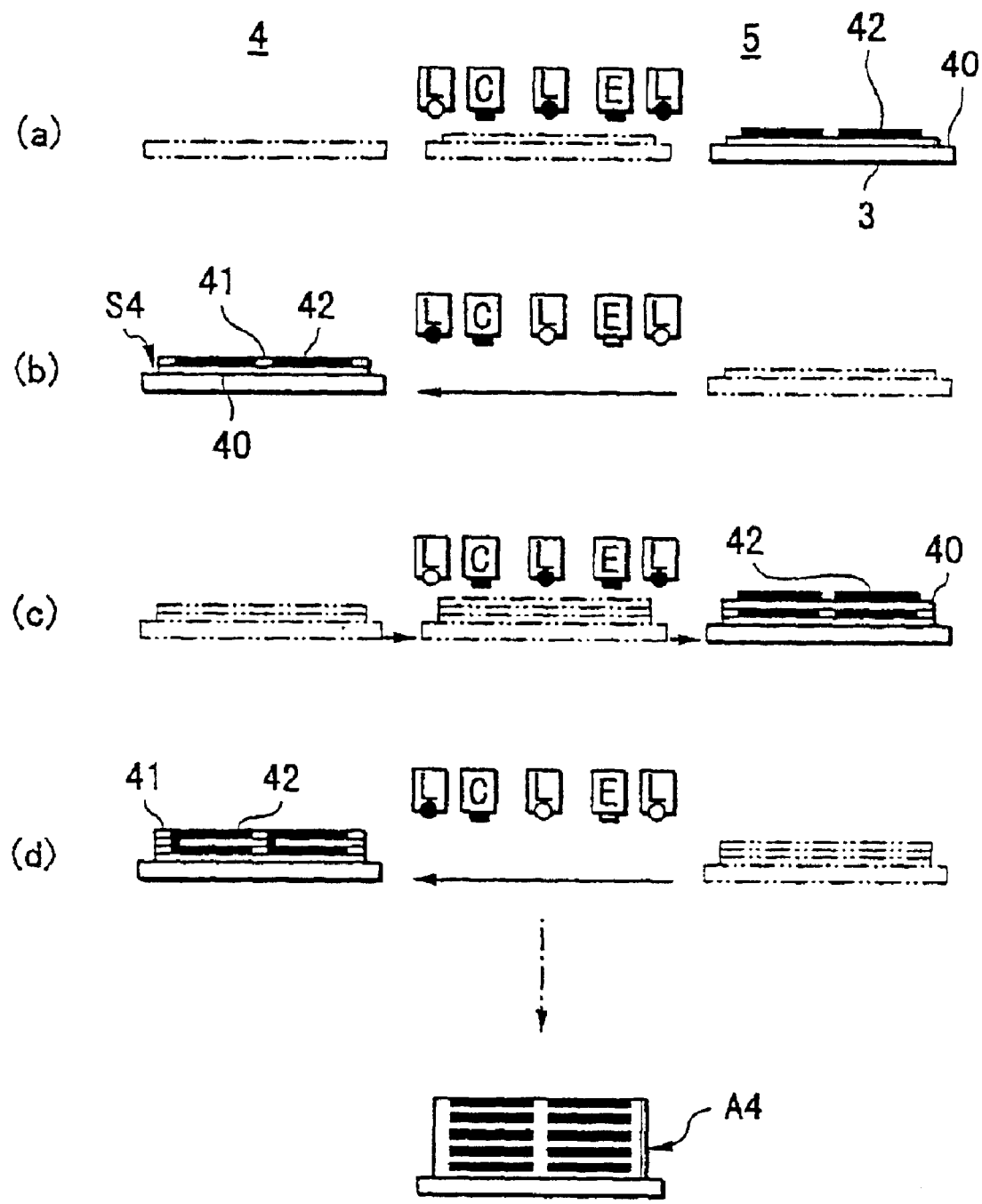
FIG. 5 is a side elevational view for showing some work steps in a fourth preferred embodiment.

FIG. 5 shows a fourth preferred embodiment of the first invention, wherein it indicates an apparatus for manufacturing a laminated member A4 for a capacitor, and the optical radiating segment L, slurry nozzle C and paste nozzle E are constituted on the segment path 1a in the same arrangement as that of :he aforesaid third preferred embodiment.

In the fourth preferred embodiment, work steps (a) to (d) described below in reference to FIG. 5 will be carried out.

FIG. 5(a):

The slurry nozzle C, paste nozzle E, central and right side optical radiating segments L are operated at the time of initial going operation of the base plate 3 from the stage 4.

Ceramics slurry is injected through the slurry nozzle C to form an insulating layer 40 having a predetermined area on the base plate 3, the insulating layer 40 is dried when it passes below the central optical radiating segment L, then when the insulating layer 40 passes below the paste nozzle E, conductive paste is injected through the paste nozzle E to form an electrode layer 42 composed of a predetermined electrode pattern.

The electrode layer 42 is dried when it passes below the right optical radiating segment L.

FIG. 5(b):

Slurry nozzle C and left side optical radiating segment L are operated at the time of returning operation of the base plate 3.

Ceramics slurry is injected through the slurry nozzle C to fill between the electrode layers 42 on the insulating layer 40 and to form an insulating layer 41, the spacer insulating layer 41 is dried when it passes below the left side optical radiating segment L.

In this way, a thin film layer S4 composed of the electrode layer 42 and the insulating layers 40, 41 is formed as shown in FIGS. 5(a) and (b) where the base plate 3 reciprocates once.

After this operation, the operations shown in FIGS. 5(c), (d) ... where the operations shown in FIGS. 5(a), (b) are repeated are performed in a continuous manner, thereby the laminated member A4 for a capacitor having many thin film layers S4 laminated to each other is manufactured.

Also in this fourth preferred embodiment, either a coating accuracy or printing accuracy of the spacer insulating layer 41, electrode layer 42 and insulating layer 40 is improved.

Figure 6:
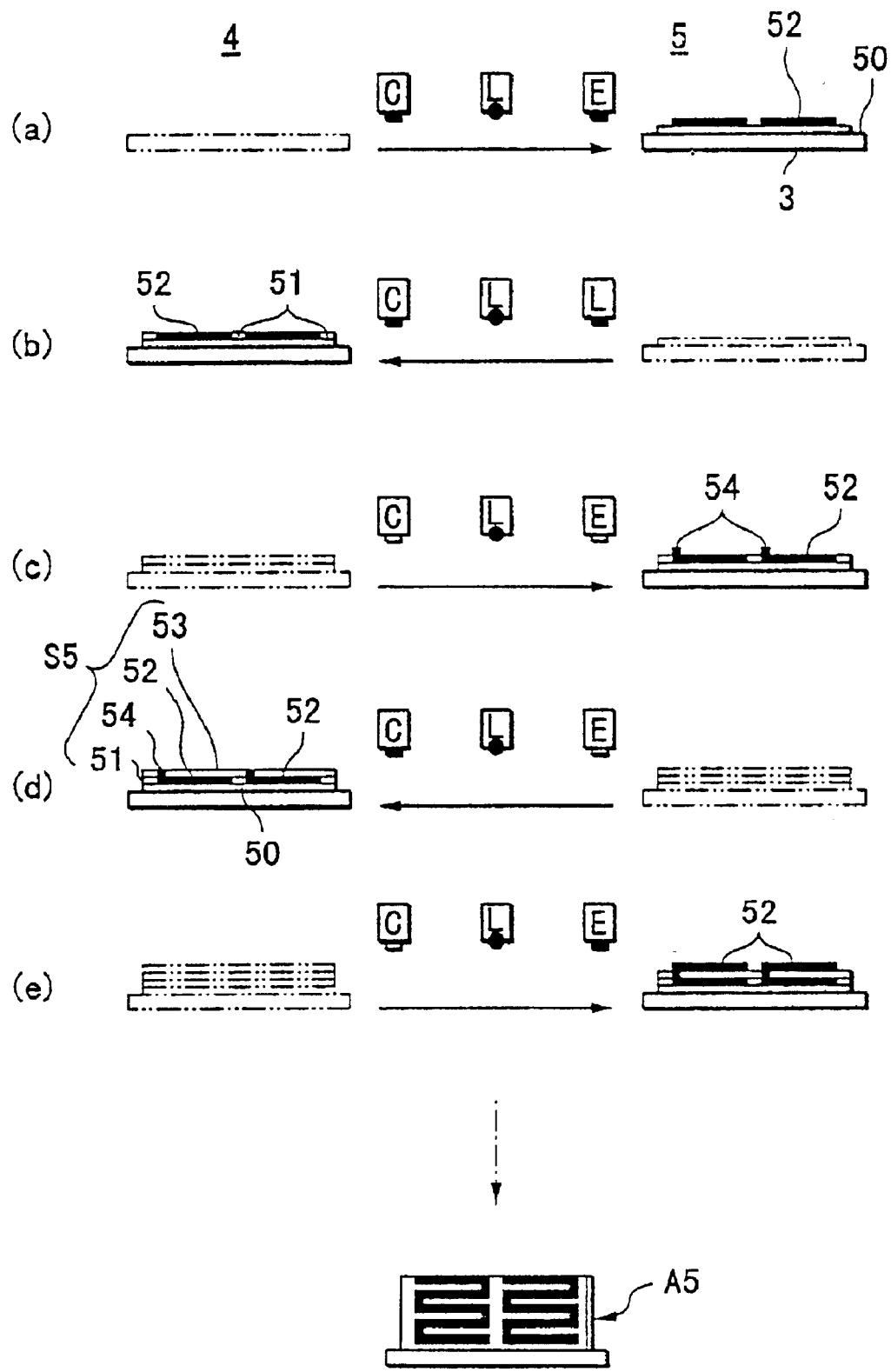
FIG. 6 is a side elevational view for showing some work steps in a fifth preferred embodiment.

FIG. 6 shows a fifth preferred embodiment of the first invention, wherein it indicates an apparatus for manufacturing a laminated member A5 for an inductor, and the optical radiating segment L acting as the drying means is arranged at a substantial central part of the segment path 1a, the slurry nozzle C is arranged at the left side (the side of stage 4) and the paste nozzle E is arranged at the right side (the side of stage 5).

In the fifth preferred embodiment, the following work steps of (a) to (e) illustrated in FIG. 6 will be performed.

FIG. 6(a):

All the slurry nozzle C, optical radiating segment L and paste nozzle E are operated at the time of initial going operation of the base plate 3 from the stage 4.

Ceramics slurry is injected through the slurry nozzle C to form a base insulating layer 50 of a predetermined area on the base plate 3, the base insulating layer 50 is dried while it passes below the optical radiating segment L, then the conductive paste is injected through the paste nozzle E when the base insulating layer 50 passes below the paste nozzle E to form an electrode layer 52 composed of a predetermined electrode pattern.

FIG. 6(b):

The optical radiating segment L and the slurry nozzle C are operated at the time of returning motion of the base plate 3.

After the electrode layer 52 formed in reference to FIG. 6(a) is dried while it passes below the optical radiating segment L, ceramics slurry is injected through the slurry nozzle C to fill between the electrode layers 52 on the base insulating layer 50 and a spacer insulating layer 51 is formed.

FIG. 6(c):

Then, both the optical radiating segment L and the paste nozzle E are operated at the time of re-returning motion of the base plate 3.

After the spacer insulating layer 51 formed in reference to FIG. 6(b) is dried while it passes below the optical radiating segment L, conductive paste is injected through the nozzle E when it passes below the paste nozzle E to form a bier electrode 54 at a predetermined position on the electrode layer 52.

FIG. 6(d):

Then, the slurry nozzle C and the optical radiating segment L are operated at the time of re-returning operation of the base plate 3.

After the bier electrode 54 formed in reference to FIG. 6(c) is dried when it passes below the optical radiating segment L, ceramics slurry is injected through the slurry nozzle C into an area where the bier electrode 54 is not coated to form the insulating layer 53.

FIG. 6(e):

Further, the base plate 3 moves and the optical radiating segment L and the paste nozzle E are operated at the time of moving operation.

After the insulating layer 53 formed in reference to FIG. 6(d) is dried with the optical radiating segment L, conductive paste is injected through the paste nozzle E onto the upper surfaces of the insulating layer 53 and the bier electrode 54 to form the electrode layer 52 composed of a predetermined electrode pattern.

Subsequent to FIGS. 6(a) to (e), the operation shown in FIGS. 6(b) to (e) where the base plate 3 reciprocates twice is repeated, thereby there may be attained a laminated member A5 for an inductor with a thin film layer 55 composed of the electrode layer 52 having the bier electrode 54, and insulating layers 51, 53 being laminated.

In accordance with this fifth preferred embodiment, although the number of steps for forming the thin film layer S5 is increased, the number of the slurry nozzle C, paste nozzle E and optical radiating segment L can be made minimum to enable a length of the segment path 1a to be shortened.

Figure 7:
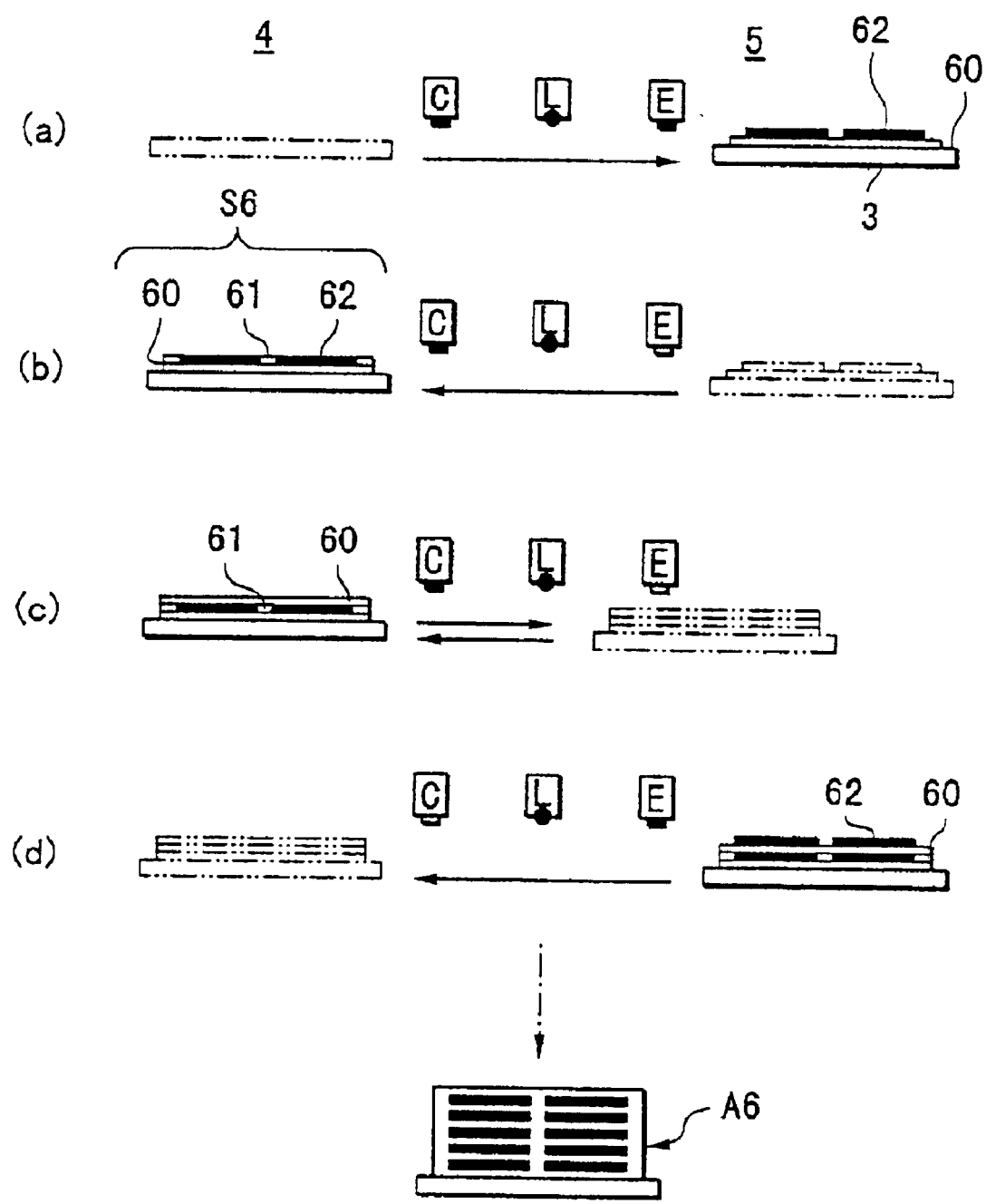
FIG. 7 is a side elevational view for showing some work steps in a sixth preferred embodiment.

FIG. 7 shows a sixth preferred embodiment of the first invention, wherein it indicates an apparatus for manufacturing a laminated member A6 for a capacitor and the slurry nozzle C is arranged at the left side and the paste nozzle E is arranged at the right side of the optical radiating segment L on the segment path 1a under the same arrangement as that of the aforesaid fifth preferred embodiment.

In the sixth preferred embodiment, work steps (a) to (d) described below will be carried out.

FIG. 7(a):

All the slurry nozzle C, optical radiating segment L and paste nozzle E are operated at the time of initial moving operation of the base plate 3 from the stage 4, at first, ceramics slurry is injected through the slurry nozzle C to form an insulating layer 60 of predetermined area on the base plate 3 and it is dried while the insulating layer 60 passes below the optical radiating segment L.

Then, when the insulating layer 60 passes below the paste nozzle E, conductive paste is injected through the paste nozzle E to form an electrode layer 62 composed of a predetermined electrode pattern.

FIG. 7(b):

The optical radiating segment L and the slurry nozzle C are operated at the time of returning operation of the base plate 3.

After the electrode layer 62 formed in reference to FIG. 7(a) is dried while it passes below the optical radiating segment L, ceramics slurry is injected through the slurry nozzle C to fill between the electrode layers 62 on the insulating layer 60 to form a spacer insulating layer 61.

FIG. 7(c):

Then, the base plate 3 reciprocates on a short segment up to a midway position where it does not reach the stage 5, more practically a segment up to a position where the base plate 3 passes from the stage 4 through the optical radiating segment a, and the optical radiating segment L and the slurry nozzle C are operated while its reciprocating operation is performed.

Then, the spacer insulating layer 61 formed in reference to FIG. 7(b) passes below the optical radiating segment L and is dried at the time of moving operation over the short segment, ceramics slurry is injected through the nozzle C when the base plate 3 passes below the slurry nozzle C at the time of returning operation to form an insulating layer 60 on the electrode layer 62.

FIG. 7(d):

Subsequently, the base plate 3 moves forward and the optical radiating segment L and the paste nozzle E are operated at the time of its moving operation.

After the insulating layer 60 formed in reference to FIG. 7(c) is dried by the optical radiating segment L, conductive paste is injected through the paste nozzle E onto the upper surface of the insulating layer 60 to form the electrode layer 62 composed of a predetermined electrode pattern.

Subsequent to FIGS. 7(a) to (d), the operations shown in FIGS. 7(b) to (d) are repeated to attain a laminated member A6 for a capacitor in which a thin film layer S6 composed of the electrode layer 62 and the insulating layers 60, 61 is laminated.

Also in the case of this sixth preferred embodiment, the number of slurry nozzle C, paste nozzle E and optical radiating segment L can be made minimum and a length of the segment path 1a can be shortened.

Figure 8:
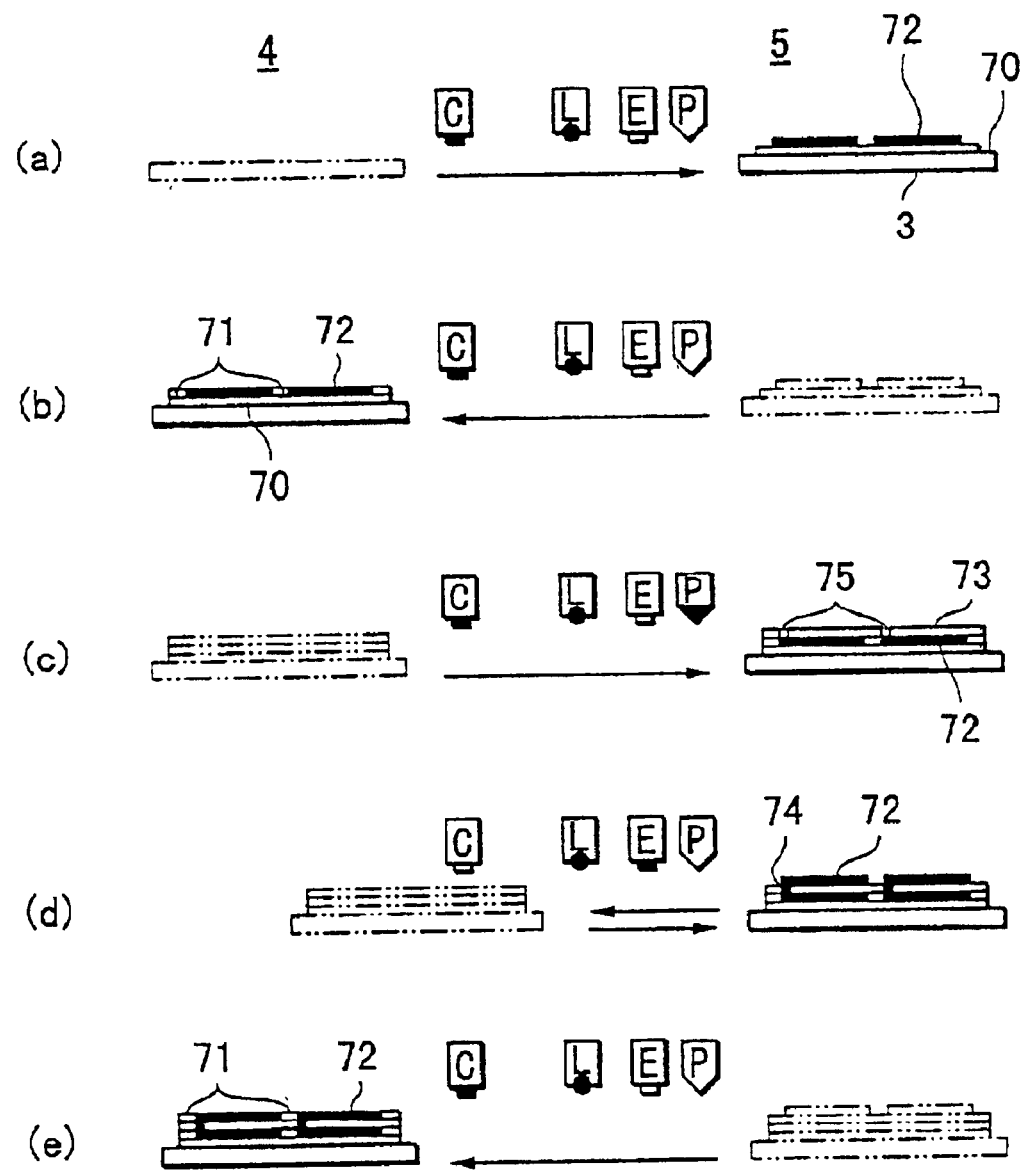
FIG. 8 is a side elevational view for showing some work steps in a seventh preferred embodiment.

FIG. 8 shows a seventh preferred embodiment of the first invention, wherein it indicates an apparatus for manufacturing a laminated member for an inductor and more particularly, this shows a case in which a bier hole for forming a bier electrode is made by a laser punching means P.

That is, this constitution is made such that the laser head P is arranged in addition to the slurry nozzle C, optical radiating segment L and paste nozzle E corresponding to those of the aforesaid fifth preferred embodiment arranged on the segment path 1a. Several laser heads P are arranged side by side with a fine space in a direction crossing with the segment path 1a, and each of the heads is connected to a laser generator not shown.

In the seventh preferred embodiment, work steps (a) to (e) described below in reference to FIG. 8 will be carried out.

FIG. 8 (a):

The slurry nozzle C, optical radiating segment L and paste nozzle E are operated at the time of initial moving operation of the base plate 3 from the stage 4, ceramics slurry is injected through the slurry nozzle C to form a base insulating layer 70 on the base plate 3 and it is dried while the base insulating layer 70 passes below the optical radiating segment L.

Then, when the base insulating layer 70 passes below the paste nozzle E, conductive paste is injected through the paste nozzle E to form an electrode layer 72 composed of a predetermined electrode pattern.

FIG. 8(b):

The optical radiating segment L and the slurry nozzle C are operated at the time of returning operation of the base plate 3.

After the electrode layer 72 formed in reference to FIG. 8(a) is dried while it passes below the optical radiating segment L, ceramics slurry is injected through the slurry nozzle C to fill between the electrode layers 72 on the insulating layer 70 so as to form a spacer insulating layer 71.

FIG. 8(c):

Then, the slurry nozzle C, optical radiating segment L and laser head P are operated at the time of re-returning operation of the base plate 3.

Ceramics slurry is injected when the base plate 3 passes below the slurry nozzle C to form an insulating layer 73 covering the entire upper surfaces of the spacer insulating layer 71 and electrode layer 72 and it is dried while it passes below the optical radiating segment L.

Then, when the base plate 3 passes below the laser head P, a bier hole 75 communicated with the electrode layer 72 is punched by the head P at a predetermined position in the insulating layer 73

FIG. 8(d):

Subsequently, although the base plate 3 starts to return from the stage 5, the base plate 3 performs both returning operation and moving forward operation over a short segment up to a midway position where it does not return back to the stage 4, more particularly a segment up to a position where the base plate 3 passes from the stage 5 through the optical radiating segment L, and the optical radiating segment L and the paste nozzle E are operated during the operations above.

When it passes below the paste nozzle E during the returning operation over the short segment, conductive paste is injected through the nozzle E and filled in the bier hole 75 to form a bier electrode 74, wherein the bier electrode 74 is dried while it passes through the optical radiating segment L. In turn, during the returning operation at the short segment, the electrode layer 72 of a predetermined pattern is formed on the upper surfaces of the insulating layer 73 and bier electrode 74 by the paste nozzle E.

FIG. 8(e):

The slurry nozzle C and optical radiating segment L are operated at the time of returning operation of the base plate 3 afterwards.

After the electrode layer 72 formed in reference to FIG. 8(d) is dried when it passes below the optical radiating segment L, ceramics slurry is injected through the slurry nozzle C into an area where the electrode layer 72 is not coated to form the spacer insulating layer 71.

Subsequent to FIGS. 8(a) to (e), the operations shown in FIGS. 8(c) to (e) are repeated to attain a laminated member for an inductor which is the same as that of the aforesaid fifth preferred embodiment.

This seventh preferred embodiment illustrates that the laser punching means can be employed in place of forming the bier electrode described in reference to the first, third and fifth preferred embodiments and its description is made in reference to that of the fifth preferred embodiment and this can be applied to that of the first and third preferred embodiments.

Figure 9:
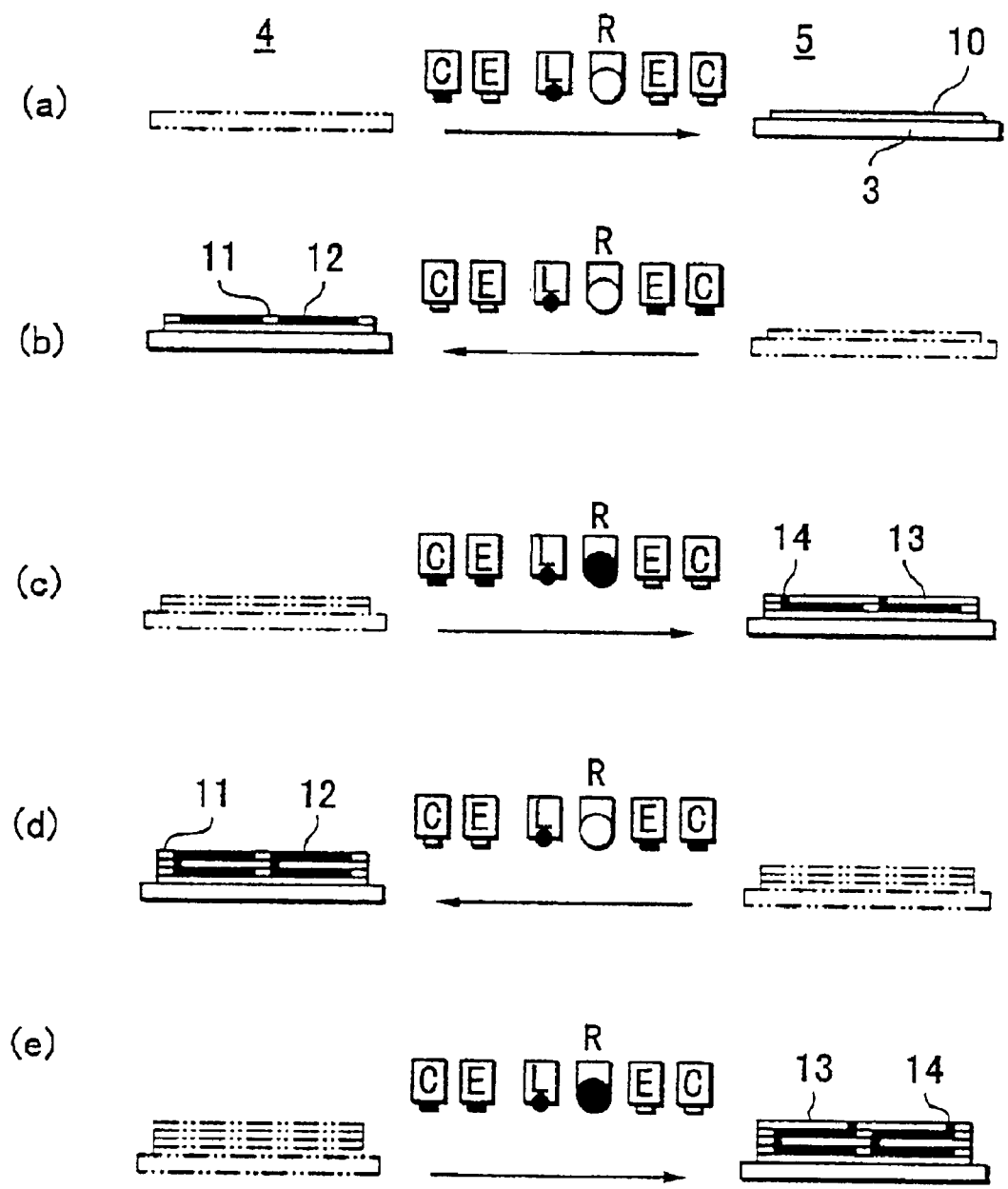
FIG. 9 is a side elevational view for showing some work steps in a eighth preferred embodiment.

FIG. 9 shows an eighth preferred embodiment of a first invention, wherein it indicates an apparatus for manufacturing a laminated member for an inductor and more particularly this preferred embodiment shows a case in which a temporary press contacting means is installed on the segment path 1a.

As the temporary press contacting means, it is possible to use either a press plate or a pressing roll which can be moved up and down. In this preferred embodiment, it is illustrated the case that the press roll R is arranged above the segment path 1a of the first preferred embodiment.

This eighth preferred embodiment (FIG. 9) has the work steps of the first preferred embodiment shown in FIG. 2 which have already been described, so that for sake of convenience, the same reference symbols are applied in the figure and their description is eliminated, although the press roll R is arranged to be enabled to move up and down between the central optical radiating segment L and the right side paste nozzle E, and the press roll R is operated (moved down) in FIG. 9(c).

That is, after the insulating layer 13 formed with the bier electrode 14 passes below the optical radiating segment L and is dried during each of the operations in FIG. 9(c), the press roll R is moved down onto the base plate 3 moved forward to press against the upper surfaces of the bier electrode 14 and insulating layer 13 and then the thin film layer is temporarily press contacted.

Some fine corrugations generated at the upper surface of the thin film layer are made flat to make a uniform state and at the same time its close fitness with the thin film layer of lower layer is improved.

Further, although arrangement of this temporary press contacting means has been described in reference to the first preferred embodiment, it is apparent that this can be applied to another preferred embodiment and its arrangement may also be optionally set.

Figure 16:
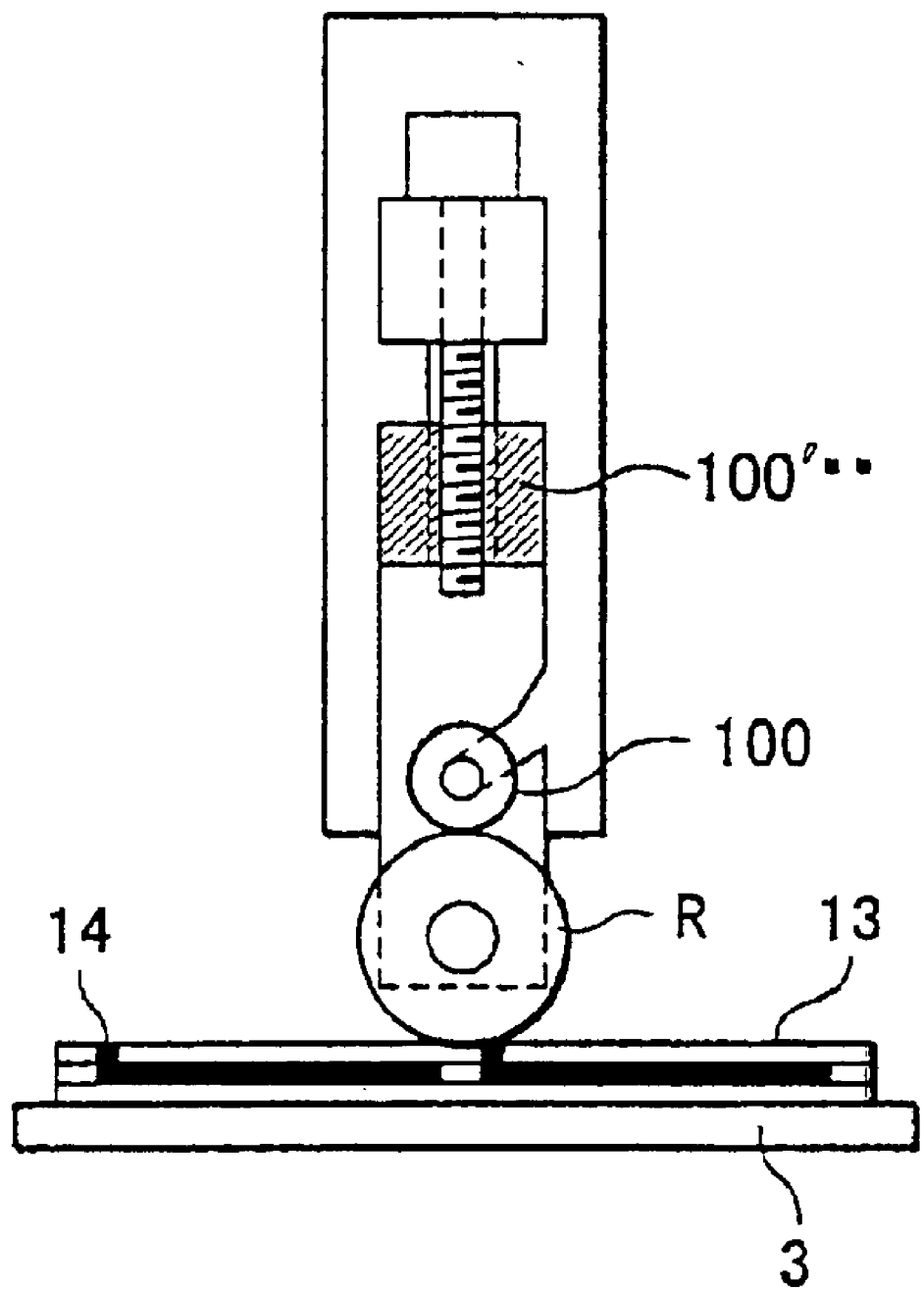
FIG. 16 is an enlarged view for showing a practical example of a temporary press contacting means.

In FIG. 16 is illustrated a preferred embodiment of the temporary press contacting means.

In FIG. 16, the press roll R is made such that a surface of the roll rotatably arranged at a supporting member 100' is coated with a fine adhering surface treatment, wherein a dust-removal roller 100 having an adhering characteristic at its surface is rotatably contacted with the press roll R and the supporting member 100' is mounted while both of them are being contacted to each other in such a way that the supporting member can be moved up and down.

The press roll R presses against the upper surfaces of the bier electrode 14 and insulating layer 13 as described above at the time of its operation and the thin film layer is temporarily press contacted with it and at the same time when some fine particle pieces are peeled from the bier electrode 14 and insulating layer 13, the fine particle pieces are adhered to the surfaces and removed from them, the fine particle pieces adhered to the press roll R are transferred to the surface of the dust-removal roller 100 having a higher adhering characteristic than that of the press roll.

Then, it is satisfactory that the fine particle pieces transferred to the dust-removal roller 100 are removed while the dust-removal roller 100 is removed at a proper time and cleaned, or a peeling member (not shown) is abutted against the dust-removal roller 100.

Figure 17:
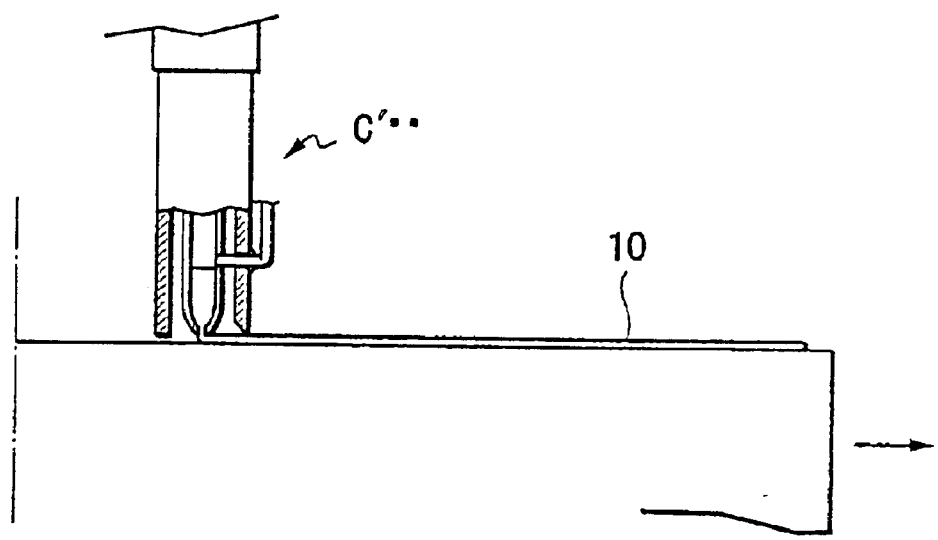
FIG. 17 is an enlarged view for showing another preferred embodiment of an insulating layer forming means.

In the aforesaid preferred embodiment, although the case of the slurry nozzle in which an ink jet system is employed as an insulating layer forming means has been described, it may also be applicable to employ a slurry head C' employing a doctor blade system or a coat roller system for coating ceramics slurry at the contact surface of the roller under rotation of the roller as illustrated in FIG. 17.

In the case that ceramics slurry is applied to coat entire surface in a predetermined area such as the base insulating layer 10, insulating layer 20 and the like in particular, it is possible to employ either the doctor blade system or the coating roller system. In addition, also in the case that ceramics slurry is filled and coated on the spacer insulating layer after the electrode layer or the like is formed, the electrode layer or the like is sufficiently dried by the drying means to enable the doctor blade system to be employed.

In addition, in the aforesaid preferred embodiment, although the case in which the thin film layer is formed while being reciprocated once to twice on the base plate 3 has been described, it is optional that the number of times of reciprocating motion is increased for making a large layer thickness of ceramics slurry.

Further, an arrangement, the number of each of the means such as the aforesaid insulating layer forming means or the like and the work steps in the first invention can be appropriately changed so long as its gist is maintained and they are not restricted to those described in its preferred embodiments.

Figure 18:
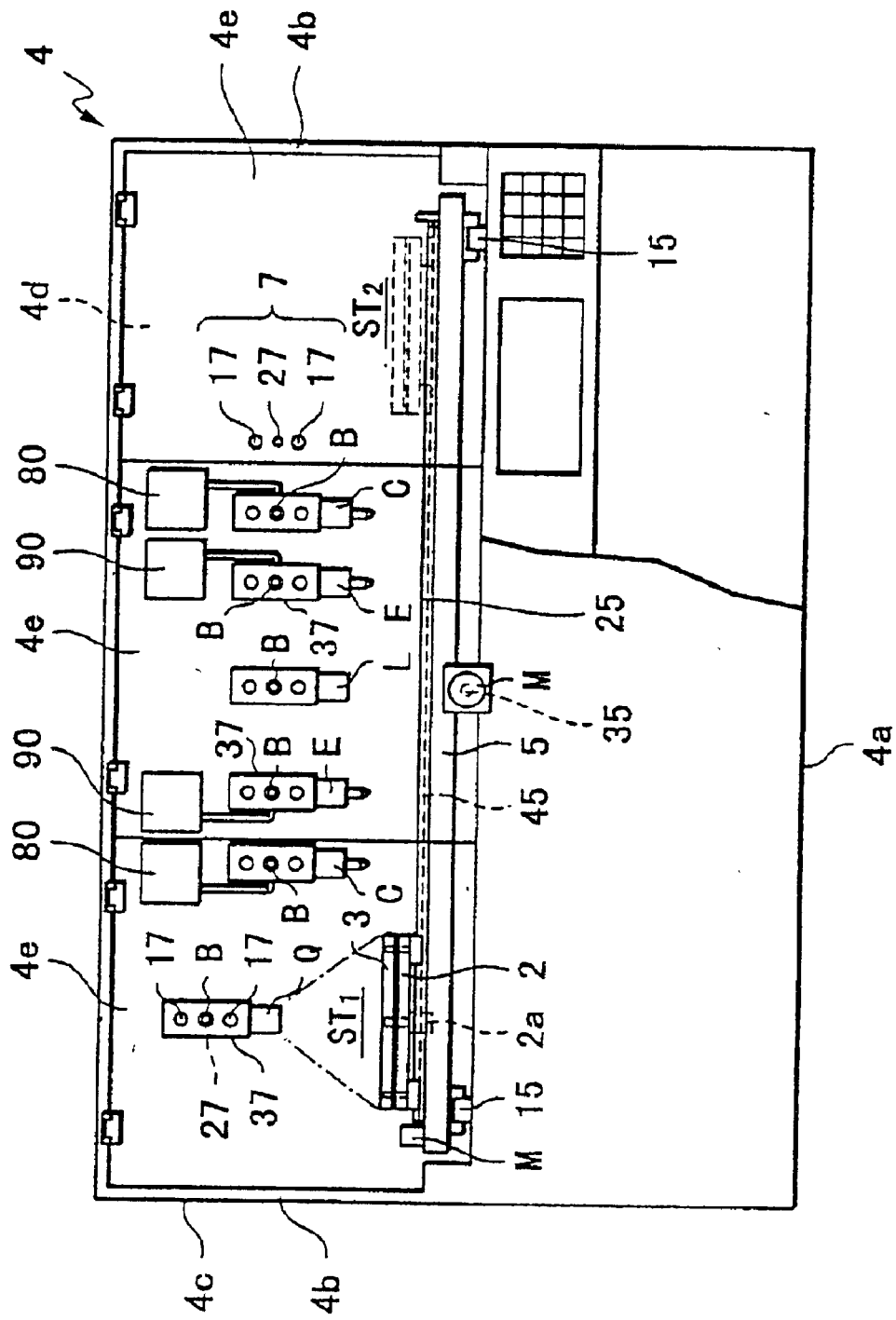
FIG. 18 is a front elevational view for showing an apparatus for manufacturing a laminated member of a second invention.
Figure 19:
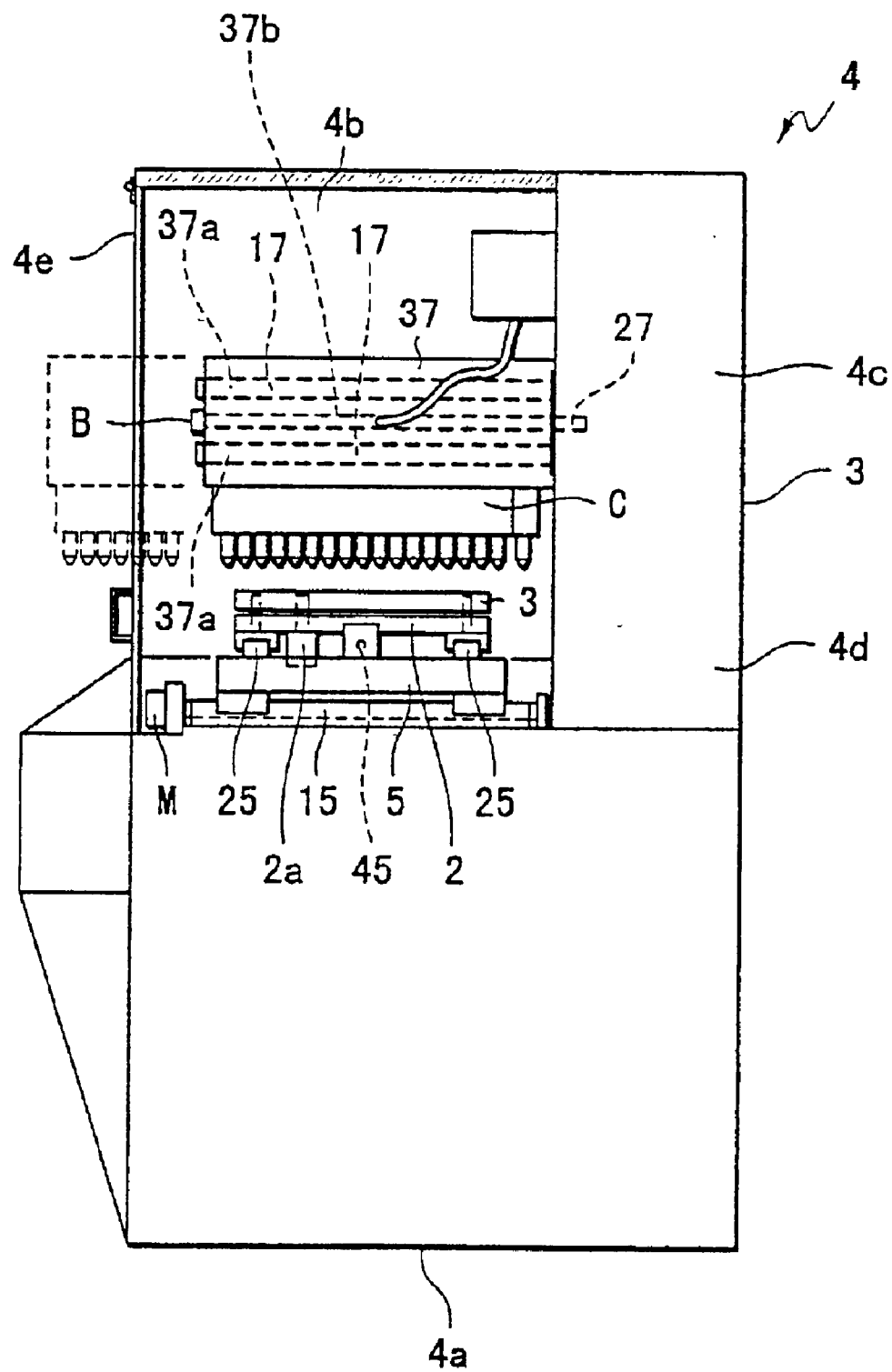
FIG. 19 is a side elevational view with a part in FIG. 1 being broken away.
Figure 20:
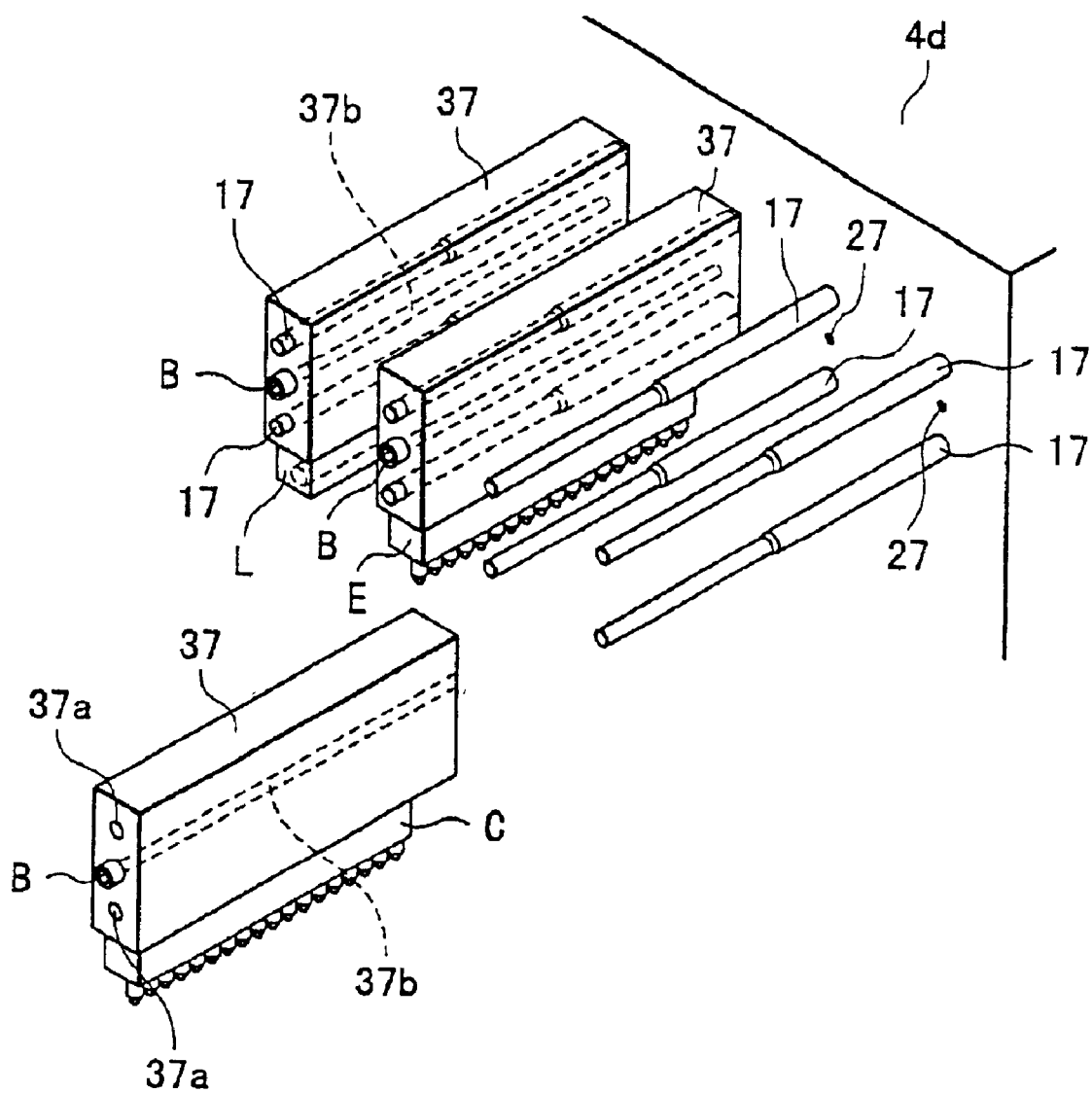
FIG. 20 is a perspective view for illustrating a fixing structure for each of the units.
Figure 21:
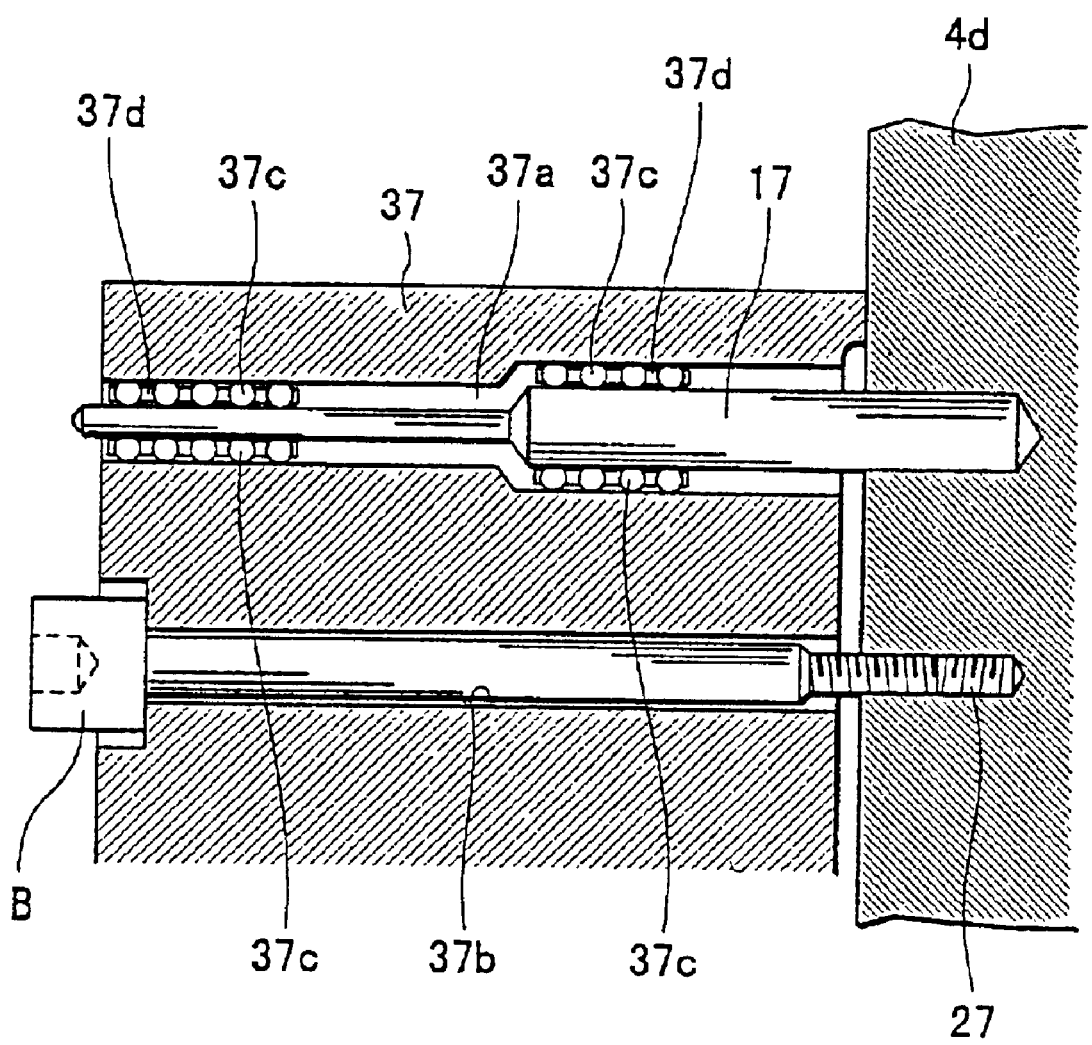
FIG. 21 is a partial enlarged sectional view for indicating a fixing structure for each of the units.

An apparatus for manufacturing a laminated member of a second invention shown in FIGS. 18 to 28 will be described as follows, wherein FIGS. 18 to 20 schematically illustrate the entire apparatus. In FIG. 18, a machine frame 4 is constituted such that both right and left side walls 4b, 4b and a casing back wall 4c are integrally assembled on the upper surface of a casing base 4a having a lateral width of about 2 m, a rigid supporting wall 4d is arranged at the casing back wall 4c, and a divided or three-divided transparent hoods 4e are attached to its front portion in such a way that the hoods can be opened or closed.

In addition, the machine frame 4 is provided with a display segment and a control console at an appropriate location such as a front one side of the casing base 4a as shown, and either a control box or a wiring equipment and the like (not shown) are arranged in the casing base 4a and the casing back wall 4c.

The machine frame 4 is constructed such that a work table 5 is mounted at the upper surface of the casing base segment 4a.

The work table 5 is a table having a slight smaller area than that of the upper surface of the casing base segment 4a. The work table 5 is movably mounted on the right and left guide rails 15 extending in a forward or rearward direction while being in a forward or rearward direction (a Y-axis direction) over a short distance, and the work table 5 is reciprocated in a Y-axis direction by a driving source M comprised of a servo motor, pulse motor and stepping motor and a driving source (a screw shaft) 35 rotated by the former driving source.

In addition, the work table 5 is constructed such that two guide rails 25, 25 spaced apart above its upper surface in a forward or rearward direction are arranged in parallel with the supporting wall 4d, and the movable table 2 is arranged such that it can be reciprocated along the rails 25, 25 in a rightward or leftward direction (an X-axis direction).

The movable table 2 is controlled in such a way that it is reciprocated in an X-axis direction by the driving source M comprised of a servo motor, pulse motor and stepping motor, and a driving shaft (a screw shaft) 45 rotated by the driving source, and the stainless steel base plate 3 is arranged on the movable table 2 through an air cylinder 2a.

Accordingly, the base plate 3 is reciprocated in parallel over a predetermined space by the driving source M and the driving shaft 4b along the supporting wall 4d in an X-axis direction, further reciprocated over a short distance by the driving source M and the driving shaft 35 in a Y-axis direction and moved up or down by the air cylinder 2a.

Reciprocating motion of the base plate 3 in an X-axis direction is performed to reciprocate between one end stage $ST_1$ (a solid line position in FIG. 18) and the other end stage $ST_2$ (one dotted line position in FIG. 18) of the work table 5.

Then, the reciprocating motion and the moving-up or moving-down motion of the base plate 3 are controlled by a control device in the control box (not shown) and data of the control device can be adjusted by the console segment.

In turn, a supporting member 7 having asset of two supporting levers 17, 17 spaced apart in a vertical direction is arranged at a supporting wall 4d of the casing back wall 4c and at the same time a nut hole 27 is arranged between the supporting levers 17, 17 in each of the sets.

A plurality of sets of supporting members 7 (seven sets are illustrated in the figure) are arranged in a predetermined space along the X-axis direction, each of these supporting levers 17 is projected in a horizontal state toward onto the work table 5, and each of one or a plurality of sets of the insulating layer forming unit acting as the insulating layer forming means, the conductive layer forming unit acting as the conductive layer forming means, the drying machine unit acting as a drying means, the punching unit acting as a punching means, the temporary press contacting unit acting as a temporary press contacting means and the camera unit is removably attached under utilization of the supporting members 7. More practically, the insulating layer forming unit, conductive layer forming unit and drying machine unit are made essential units, one or a plurality of units are attached and the punching unit, temporary press contacting unit and camera unit are selectively attached as required.

There is illustrated a case in which as the insulating layer forming unit, an ink jet type slurry injection unit (more practically, slurry nozzle) C for use in injecting ceramics slurry is used; as the conductive layer forming unit, an ink jet type paste inject on unit (more practically, paste nozzle) E for use in injecting conductive paste is used; and as the drying machine unit, the optical radiation unit L for drying either the ceramics slurry or conductive paste to such a semi-hardened state not adhering is used.

The slurry injection unit C is constructed such that many ink jet nozzles are arranged side by side with a minute spacing, the ceramics slurry is injected through the selected nozzle, and also the paste injection unit E is similarly constructed such that many ink jet nozzles are arranged side by side with a minute spacing, the paste is injected through the selected nozzle.

In addition, there is illustrated a case that as the punching unit, the laser unit P having many laser heads arranged side by side with a minute spacing is used; as the temporary press contacting unit, the roll press contacting roll constituted by the press roll R which can be moved up and down is used; and as the camera unit, a CCD camera unit Q composed of a CCD camera is used.

The laser unit P is operated such that each of the laser units is connected to a laser generating unit and laser beam is radiated from the selected laser unit to punch the insulating layer.

The roll press contacting unit R is operated to cause the upper surface of a thin film layer comprised of the formed insulating layer and electrode layer to be pressed at an appropriate time and temporarily press contacted.

The CCD camera unit Q is used for taking a surface image of the thin film layer at a proper time and transmitting it to an image processing device.

Each of the units, i.e. the slurry injection unit C, the paste injection unit E, the optical radiating unit L, the laser unit P, the roll press contacting unit R and the CCD camera unit Q is constructed such that their fixing segments 37 for the supporting member 7 formed at each of the upper half segments have the same structure to each other.

That is, each of the fixing segments 37 has a rectangular shape having substantially equal length as that of the supporting lever 17 of the supporting member 7, wherein two fixing holes 37a, 37a passing through it are opened while being spaced apart in a vertical direction, and an axial hole 37b is punched at a middle part between the fixing holes 37a, 37a in a longitudinal direction. A cylindrical retainer 37d having some fine diameter balls 37c stored therein to be projected inwardly and outwardly in a rotatable manner is installed in each of the fixing holes 37a, 37a (refer to FIG. 21).

Each of the units C, E, L, P, R and Q is made such that the fixing hole 37a is passed in such a way that the supporting lever 17 of the supporting member 7 is slidably arranged in the retainer 37d of each of these fixing segments 37, thereafter a fastening bolt B is inserted into the axial hole 37b, its extremity end is threadably fitted to the nut hole 27 of the supporting wall 4d, the fixing segment 37 is fastened and fixed to the supporting wall 4d to set each of the units at a predetermined position.

Then, the fastening bolt B is pulled out to enable the fixing segment 37 to be pulled out of the supporting lever 17. That is, each of the units can be fixed or removed or can be replaced with another one.

Figure 22:
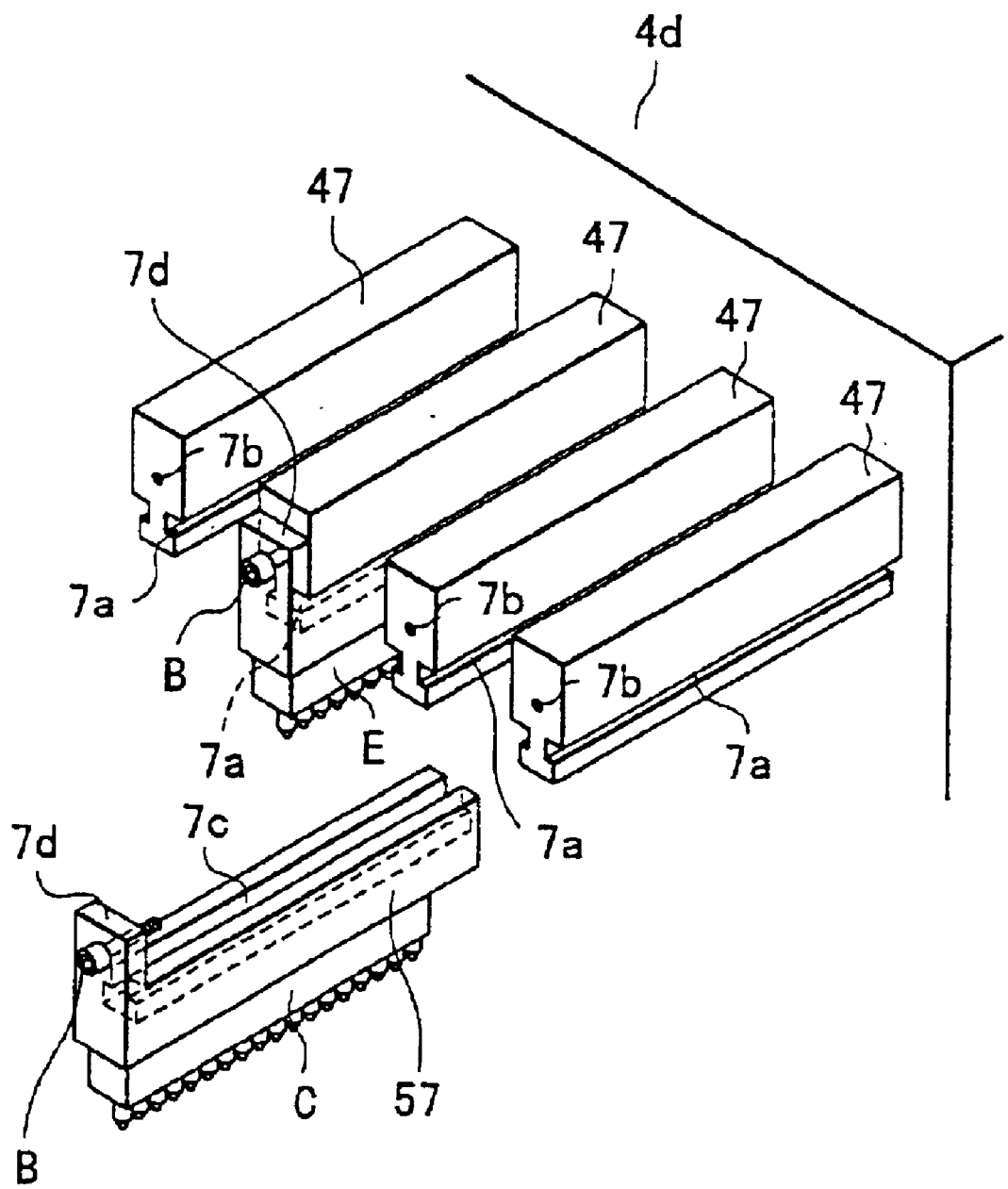
FIG. 22 is a perspective view for illustrating another example of a fixing structure for each of the units.

Then, FIG. 22 shows another preferred embodiment of the supporting member 7 (this supporting member is denoted by reference symbol 47).

In FIG. 22, each of the supporting members 47 is made such that rails 7a are formed at both sides of the lower end of a rectangular plate having an appropriate thickness and its front central part is provided with a nut hole 7b.

A plurality of supporting members 47 are arranged side by side at the supporting wall 4d of the casing back wall 4c in a narrow space along an X-axis direction and they are projected in a horizontal state toward onto the work table 5.

In turn, the fixing segments 57 for each of the units C, E, L, P, R and Q are formed such that fitting segment 7c slidably contacted with the rail segment 7a of the supporting member 47 and fitted there is formed in a longitudinal direction and at the same time, an abutting plate 7d abutted against the front surface of the supporting member 47 is integrally raised at the front end and a fastening bolt B is rotatably attached to the abutting plate 7d.

Each of the units C, E, L, P, R and Q is made such that a fitting segment 7c for each of the fixing segments 57 is slidably contacted with the rail segment 7a of the supporting member 47, an abutting plate 7d is pushed against the front surface of the supporting member 47, the fastening bolt B is threadably fitted to the nut hole 7b, thereby it is fixed to the supporting wall 4d through the fixing segment 57 and set at a predetermined position.

In this way, FIG. 18 shows a first preferred embodiment of a second invention, wherein the optical radiating unit L is arranged at a substantial central part of the segment between the stage $ST_1$ and the stage $ST_2$, and each of the paste injection unit E and the slurry injection unit C is arranged at both sides of the optical radiating unit L, respectively and a CCD camera unit Q is arranged above the stage $ST_1$.

In addition, reference numeral 80 shown in FIG. 18 denotes a slurry tank for supplying ceramics slurry to the slurry injection unit C, and reference numeral 90 shown in FIG. 18 denotes a paste tank for supplying conductive paste to the paste injection unit E.

The first preferred embodiment of the second invention corresponds to the case that a laminated member for an inductor is manufactured and its work steps will be described in reference to FIG. 23.

Figure 23:
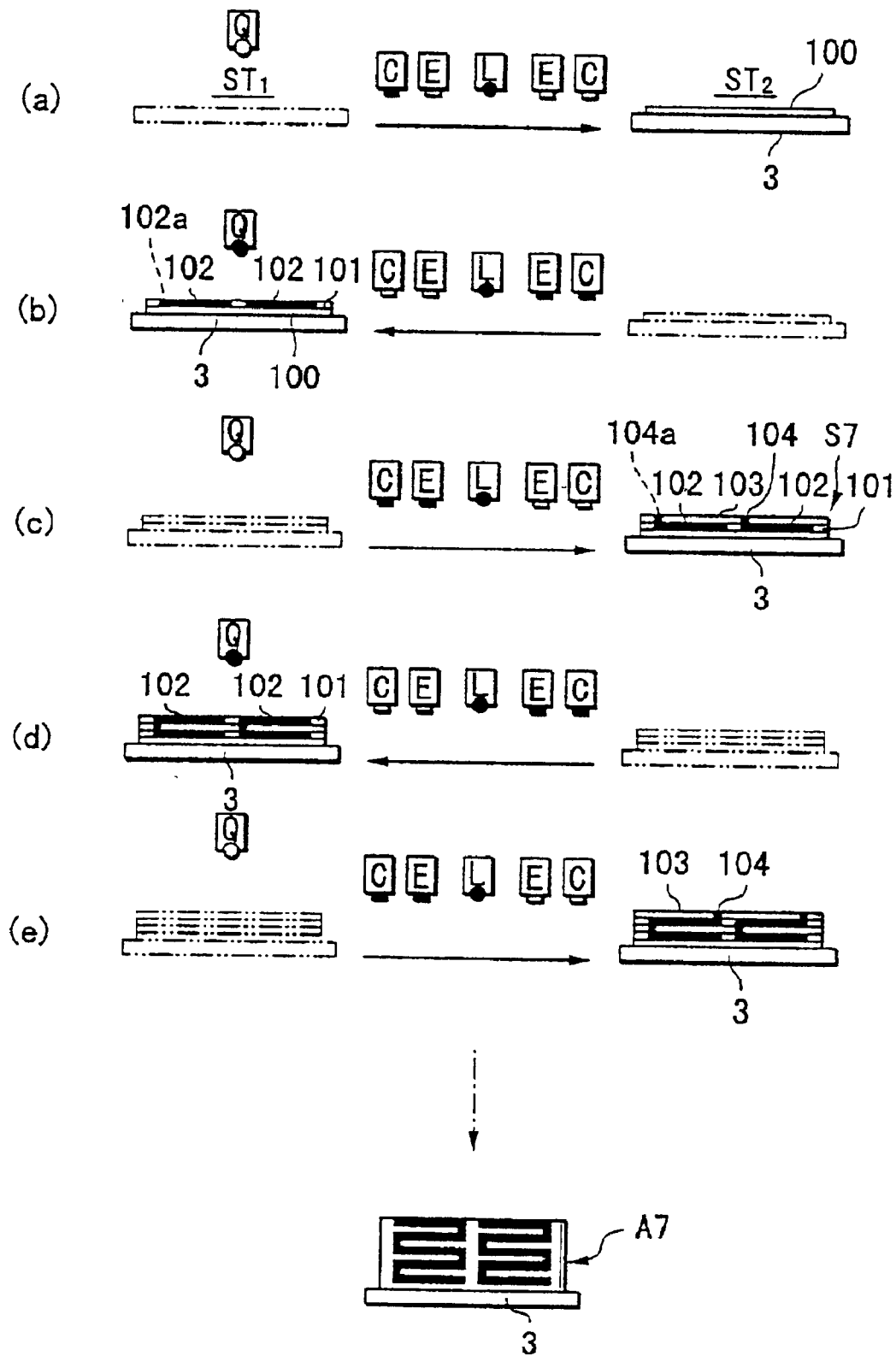
FIG. 23 is a front elevational view for illustrating some work steps of the first preferred embodiment.

In FIG. 23, a moving time of the base plate 3 corresponds to a case that it is moved from the stage $ST_1$ to the stage $ST_2$, a returning time of the base plate 3 corresponds to a case that it is moved in an inverse direction, the fixing segments 37, 57 for each of the optical radiating unit L, paste injection unit E, slurry injection unit C and CCD camera unit Q are eliminated, wherein each of the members having its lower end colored black is in its operating state or a state where each of the members is operated when the base plate 3 reaches. This feature is similarly applied to other preferred embodiments subsequent to the second preferred embodiment.

In the first preferred embodiment, some work steps (a) to (e) to be described as follows in reference to FIG. 23 are carried out.

Figure 10:
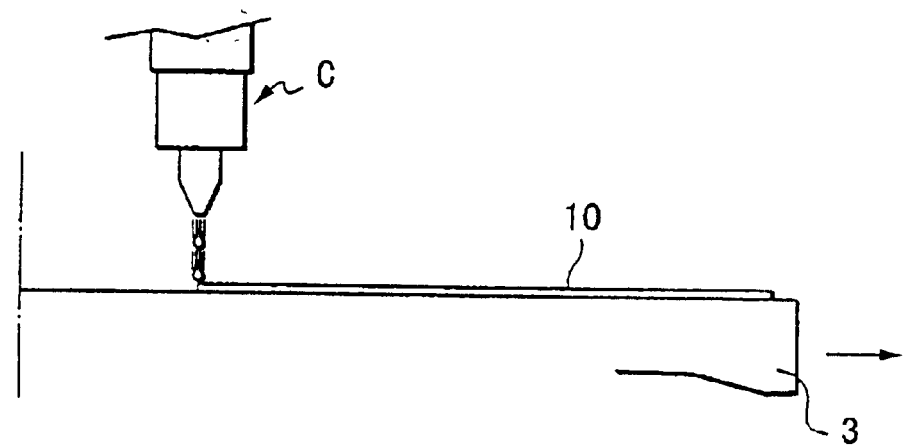
FIG. 10 is an enlarged view for showing some insulating layer forming steps performed by an insulating layer forming means.
Figure 11:
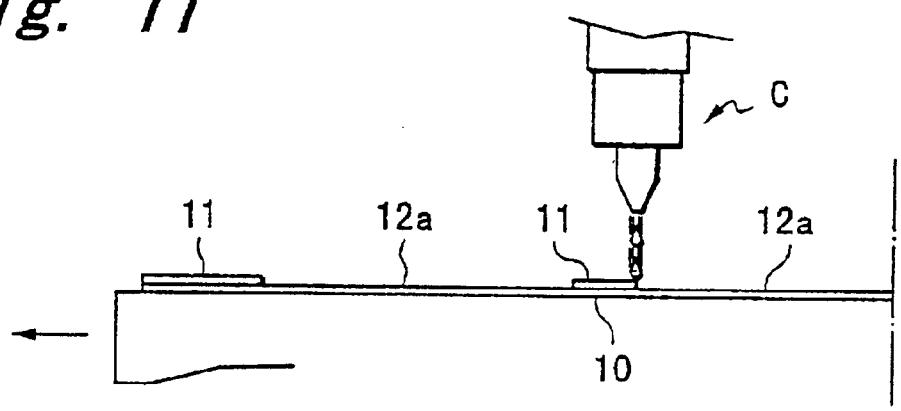
FIG. 11 is an enlarged view for showing some spacer insulating layer forming steps performed by an insulating layer forming means.

FIG. 23(a):

At the initial moving time of the base plate 3, the left side slurry injection unit C and the optical radiating unit L are operated, ceramics slurry is injected through the slurry injection unit C to form a base insulating layer 100 having a predetermined area on the base plate 3 (refer to FIG. 10). Then, the insulating layer 100 is dried with the optical radiating unit L to cause it to be semi-hardened state of non-adhering degree (as for details, refer to FIG. 15).

FIG. 23(b):

At the time of returning operation of the base plate 3, the right side slurry injection unit C, paste injection unit E and optical radiating unit L are operated.

Ceramics slurry is injected by the slurry injection unit C onto the base insulating layer 100 and in an area except the electrode pattern 102a to form a spacer insulating layer 101 (as for its details, refer to FIG. 11), then the base plate 3 passes below the paste injection unit E, the conductive paste is injected by the paste injection unit E to form an electrode layer 102 at the electrode pattern 102a (as for its details, refer to FIG. 12).

After this operation, when the base plate 3 passes through the optical radiating unit L, the spacer insulating layer 101 and the electrode layer 102 formed into a predetermined pattern are dried.

In addition, when she base plate 3 returns back to the stage $ST_1$, the CCD camera unit Q is operated to take photographs of the surfaces of the formed insulating layer 101 and the electrode layer 102.

FIG. 23(c):

Then, at the time of re-moving operation of the base plate 3, the left side slurry injection unit C, the paste injection unit E and the optical radiating unit L are operated.

Ceramics slurry is injected by the slurry injection unit C onto the spacer insulating layer 101 and the electrode layer 102 in an area except the bier electrode segment 104a to form the insulating layer 103 (as for its details, refer to FIG. 13), then the base plate 3 passes below the paste injection unit E, the conductive paste is injected by the paste injection unit E to form the bier electrode 104 at the bier electrode segment 104a (as for its details, refer to FIG. 14).

In this way, a thin film layer of the base insulating layer 100 is formed as shown in FIG. 23(a), and a thin film layer S7 comprised of the electrode layer 102 having the bier electrode 104 and the insulating layers 101, 103 is formed on the upper surface of the thin film layer as shown in FIGS. 23(b) and (c).

After this operation, the operations shown in FIGS. 23(d), (e) . . . where the operations shown in FIGS. 23(b), (c) are repeated are performed in a continuous manner to manufacture the laminated member A7 for an inductor having many thin film layers laminated to each other.

Further, the surface images taken by the operations shown in FIG. 23(b) or FIG. 23(d) are transmitted to an image processing device (not shown) so as to detect a presence or non-presence of pin-holes in the insulating layers 101, 103 or broken lines in the electrode layers 102, 104, and in the case that their presence is detected, some work steps are stopped in the midway part, the thin film layer being manufactured is removed from on the base plate 3 and at the same time either the slurry injection unit C or the paste injection unit E is inspected and an inferior ink jet nozzle being clogged is replaced with another one.

Figure 24:
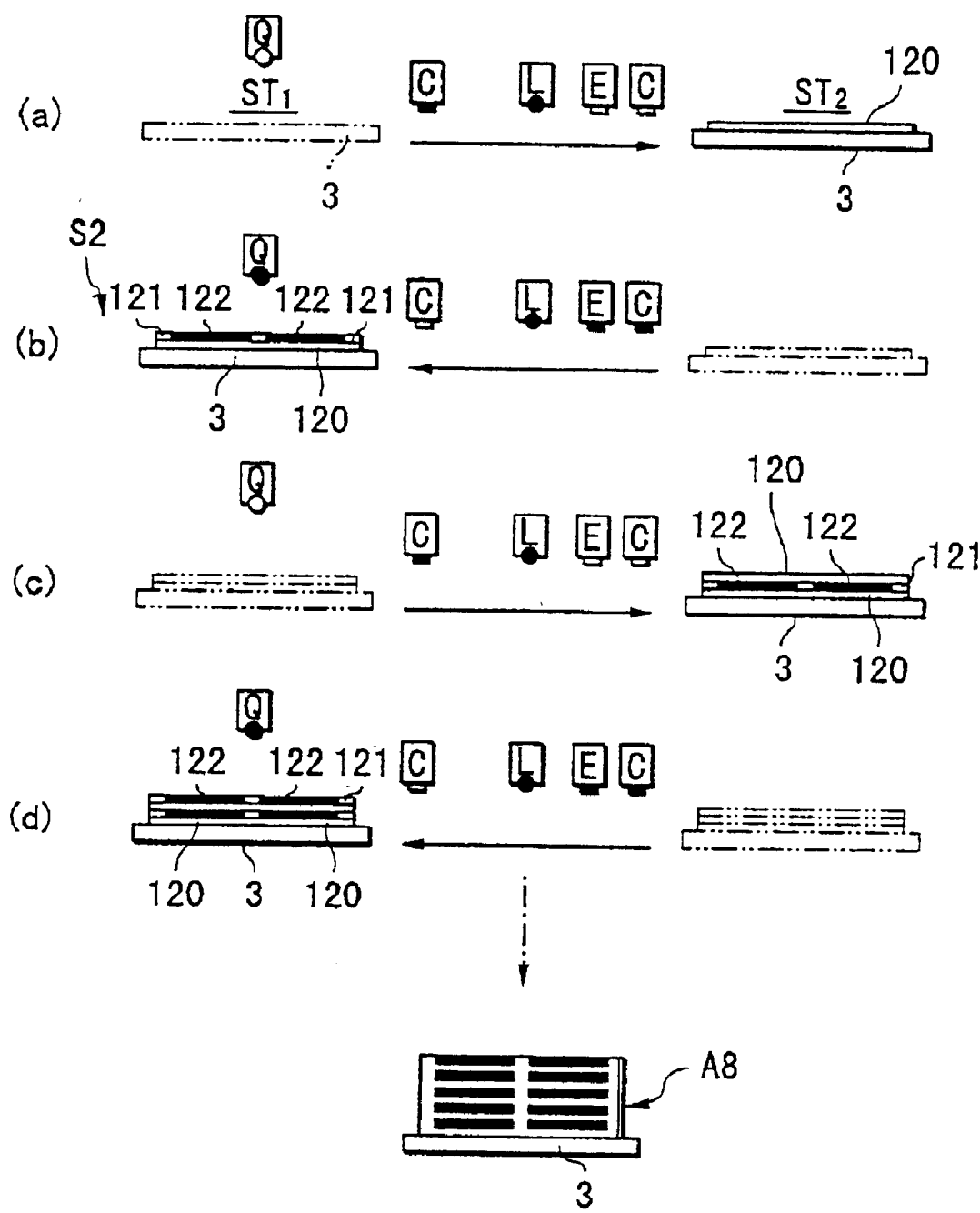
FIG. 24 is a front elevational view for illustrating some work steps of the second preferred embodiment.

FIG. 24 shows a second preferred embodiment of the second invention, wherein it indicates a case in which a laminated member A8 for a capacitor is manufactured, the optical radiating unit L is arranged at a substantial central part between the stages $ST_1$ and $ST_2$, only the slurry injection unit C is arranged at the stage $ST_1$, both the paste injection unit E and the slurry injection unit C are arranged at the other side, and the CCD camera unit Q is arranged above the stage $ST_1$.

That is, in the case for a conductor, the bier electrode is not required, so that the paste injection unit E at one side is eliminated.

In the second preferred embodiment, some work steps (a) to (d) to be described later in reference to FIG. 24 will be carried out.

FIG. 24(a):

At the time of initial moving operation of the base plate 3, both the left side slurry injection unit C and the optical radiating unit L are operated, ceramics slurry is injected through the slurry injection unit C to form an insulating layer 120 having a predetermined area on the base plate 3 and then the insulating layer 120 is dried with the optical radiating unit L.

FIG. 24(b):

At the time of returning operation of the base plate 3, the right side slurry injection unit C, the paste injection unit E and the optical radiating unit L are operated.

Ceramics slurry is injected by the slurry injection unit C to a predetermined area on the insulating layer 120 to form a spacer insulating layer 121, then the base plate 3 passes below the paste injection unit E, the conductive paste is injected by the paste injection unit E to form an electrode layer 122 in an area of the spacer insulating layer 121 not coated.

After this state, when the base plate 3 passes through the optical radiating unit L, both the spacer insulating layer 321 and the electrode layer 112 formed into a predetermined pattern are dried.

In addition, when the base plate 3 returns back to the stage $ST_1$, the CCD camera unit Q is operated to take a photograph of the surfaces of the formed insulating layer 121 and the electrode layer 122, and the surface images for use in inspecting the ink jet nozzle are transmitted to the image processing device.

In this way, in FIGS. 24(a), (b) where the base plate 3 reciprocates once, the thin film layer S2 comprised of the electrode layer 122 and the insulating layers 120, 121 is formed.

After-this operation, the operations shown in FIGS. 24(c), (d) . . . where the operations shown in FIGS. 24(a), (b) are repeated are performed in a continuous manner to manufacture the laminated member A8 for a capacitor having many thin film layers S2 laminated to each other.

Figure 25:
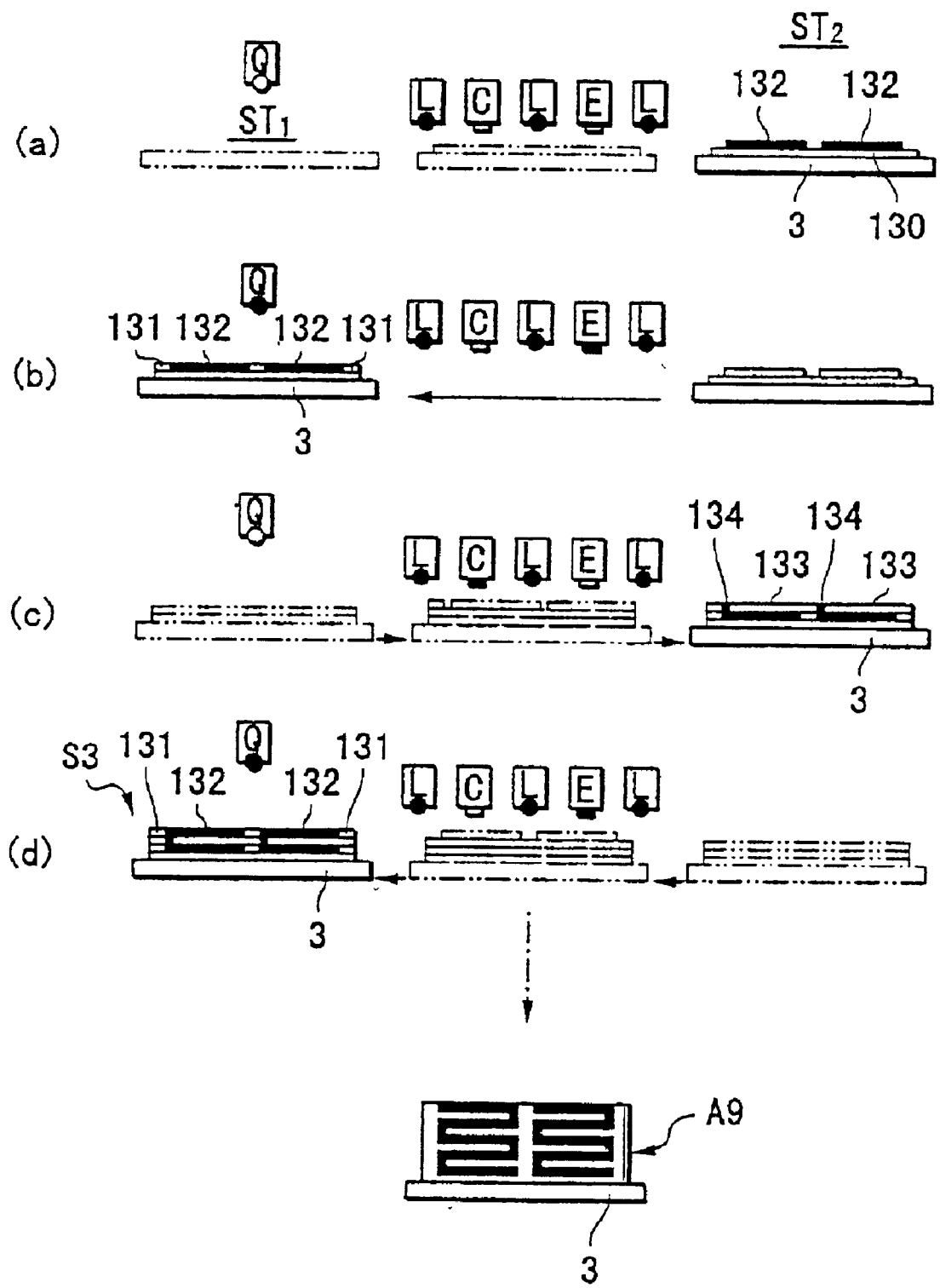
FIG. 25 is a front elevational view for illustrating some work steps of the third preferred embodiment.

FIG. 25 shows a third preferred embodiment of the second invention, wherein it indicates a case in which a laminated member A9 for an inductor is manufactured, the optical radiating unit L is arranged at a substantial central part between the stages $ST_1$ and $ST_2$, and at both right and left sides while being spaced apart, the slurry injection unit C is arranged between the optical radiating units L, L at one side (the side of the stage $ST_1$), the paste injection unit E is arranged between the optical radiating units L, L at the other side, and the CCD camera unit Q is arranged above the stage $ST_1$.

In the third preferred embodiment, work steps (a) to (d) described below in reference to FIG. 25 will be carried out.
FIG. 25(a):

At the time of initial moving operation of the base plate 3, the slurry injection unit C, the paste injection unit E and the central and right side optical radiating units L are operated.

Ceramics slurry is injected through the slurry injection unit C to form a base insulating layer 130 having a predetermined area on the base plate 3 and then the insulating layer 130 is dried with the central optical radiating unit L while passing below it, then when the base insulating layer 130 passes below the paste injection unit E, the conductive paste is injected by the paste injection unit E to form an electrode layer 132 comprised of a predetermined electrode pattern.

This electrode layer 132 is dried while passing below the right side optical radiating unit L.
FIG. 25(b):

At the time of returning operation of the base plate 3, the slurry injection unit C and the left side optical radiating unit L are operated.

Ceramics slurry is injected by the slurry injection unit C to fill between the electrode layers 132 on the base insulating layer 130 so as to form the spacer insulating layer 131. The spacer insulating layer 131 is dried while passing below the left side optical radiating unit L.

In addition, when the base plate 3 returns back to the stage $ST_1$, the CCD camera unit Q is operated to take a photograph of the surfaces of the formed insulating layer 131 and the electrode layer 132, and the surface images for use in inspecting the ink jet nozzle are transmitted to the image processing device in the same manner as described above.
FIG. 25(c):

Then, at the time of re-moving operation of the base plate 3, the slurry injection unit C, the paste injection unit E, the central and right side optical radiating units L are operated.

Ceramics slurry is injected by the slurry injection unit C to a predetermined area on the spacer insulating layer 131 and electrode layer 132 to form an insulating layer 133. After the insulating layer 132 is dried by the optical radiating unit L, the base plate 3 passes below the paste injection unit E, the conductive paste is injected by the paste injection unit E to an area where the insulating layer 133 is not coated to form the bier electrode 134. The bier electrode 134 is dried by the right side optical radiating unit L.
FIG. 25(d):

Then, at the time of re-returning operation of the base plate 3, the paste injection unit E, the slurry injection unit C, the central and left side optical radiating units L are operated.

Conductive paste is injected by the paste injection unit E on the insulating layer 133 and the bier electrode 134 to form the electrode layer 132 comprised of a predetermined electrode pattern. After the electrode layer 132 is dried by the optical radiating unit L, the base plate 3 passes below the slurry injection unit C, the ceramics slurry is injected by the slurry injection unit C to an area where the electrode layer 132 is not coated to form the spacer insulating layer 131. The spacer insulating layer 131 is dried by the left side optical radiating unit L.

Then, when the base plate 3 returns back to the stage $ST_1$, the CCD camera unit Q is operated to take photographs of the surfaces of the formed insulating layer 131 and the electrode layer 132.

Then, subsequent to the operations illustrated in FIGS. 25(a) to (d), the operations illustrated in FIGS. 25(c) and (d) where the base plate once reciprocates are repeated to attain the laminated member A9 for an inductor having a thin film layer S3 comprised of an electrode layer 132 with the bier electrode 134 and the insulating layers 131, 133 laminated.

In accordance with the third preferred embodiment, since each of the layer surfaces is dried by the optical radiating unit L every time either the insulating layer or the electrode layer is formed, coating or printing accuracy of the spacer insulating layer 131, the electrode layer 132, the insulating layer 133 and the bier electrode 134 is improved.

Figure 26:
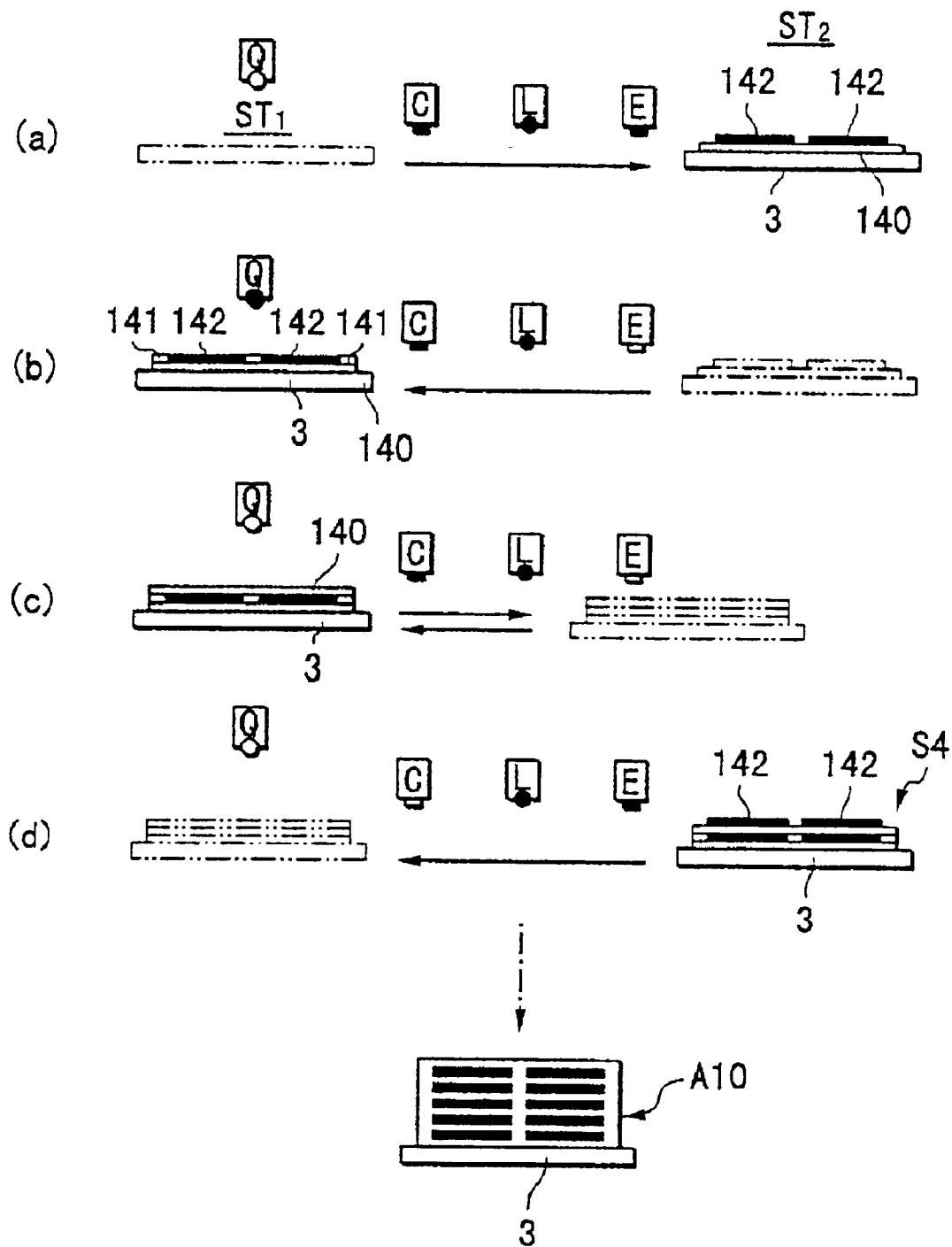
FIG. 26 is a front elevational view for illustrating some work steps of the fourth preferred embodiment.

FIG. 26 shows a fourth preferred embodiment of the second invention, wherein it indicates a case in which a laminated member A10 for a capacitor is manufactured, and there is provided a configuration in which the optical radiating unit L is arranged at a substantial central part between the stages $ST_1$ and $ST_2$, the slurry injection unit C is arranged at the left side of it and the paste injection unit E is arranged at the right side of it, and the CCD camera unit Q is arranged above the stage $ST_1$.

In the fourth preferred embodiment, some work steps (a) to (d) to be described later in reference to FIG. 26 are carried out.
FIG. 26(a):

At the time of initial moving operation of the base plate 3, all the slurry injection unit C, the optical radiating unit L and the paste injection unit E are operated. At first, the ceramics slurry is injected through the slurry injection unit C to form an insulating layer 140 having a predetermined area on the base plate 3 and then the insulating layer 140 is dried with the optical radiating unit L while passing below it.

Then, when the base insulating layer 140 passes below the paste injection unit E, the conductive paste is injected by the paste injection unit E to form an electrode layer 142 comprised of a predetermined electrode pattern.
FIG. 26(b):

At the time of returning operation of the base plate 3, the optical radiating unit L and the slurry injection unit C are operated.

After the electrode layer 142 formed by the operation shown in FIG. 26(a) is dried while it passes below the optical radiating unit L, ceramics slurry is injected by the slurry injection unit C to fill between the electrode layers 142 on the insulating layer 140 so as to form the spacer insulating layer 141.

In addition, when the base plate 3 returns back to the stage $ST_1$, the CCD camera unit Q is operated to take a photograph of the surfaces of the formed insulating layer 141 and the electrode layer 142.
FIG. 26(c):

Then, the base plate 3 reciprocates over a short segment up to a midway position where it does not reach the stage ST$_2$, more particularly, a segment up to a position where the base plate 3 passes from the stage ST$_1$ through the optical radiating unit L and during this period, the optical radiating unit L and the slurry injection unit C are operated.

Then, at the time of motion over the short segment, the spacer insulating layer 141 formed in reference to FIG. 26(b) is dried while passing below the optical radiating unit L, and at the time when the base plate 3 passes below the slurry injection unit C during its returning operation, the ceramics slurry is injected through the slurry injection unit C to form the insulating layer 140 on the electrode layer 142.

Then, at the time of returning operation of the base plate 3 to the stage ST$_1$, the CCD camera unit Q is operated to take a photograph of the surface of the formed insulating layer 140.

FIG. 26(d):

After this operation, the base plate 3 moves forward and at the time of its motion, the optical radiating unit L and the paste injection unit E are operated.

After the insulating layer 140 formed in reference to FIG. 26(c) is dried by the optical radiating unit L, conductive paste is injected by the paste injection unit E on the upper surface of the insulating layer to form the electrode layer 142 comprised of a predetermined electrode pattern.

Then, subsequent to the operations illustrated in FIGS. 26(a) to (d), the operations illustrated in FIGS. 26(b) and (d) are repeated to attain the laminated member A10 for a capacitor having a thin film layer S4 comprised of an electrode layer 142 and the insulating layers 140, 141.

Also in accordance with the fourth preferred embodiment, a minimum number of she slurry injection unit C, the paste injection unit E and the optical radiating unit L can be attained and a moving distance of the base plate 3 can be shortened.

Figure 27:
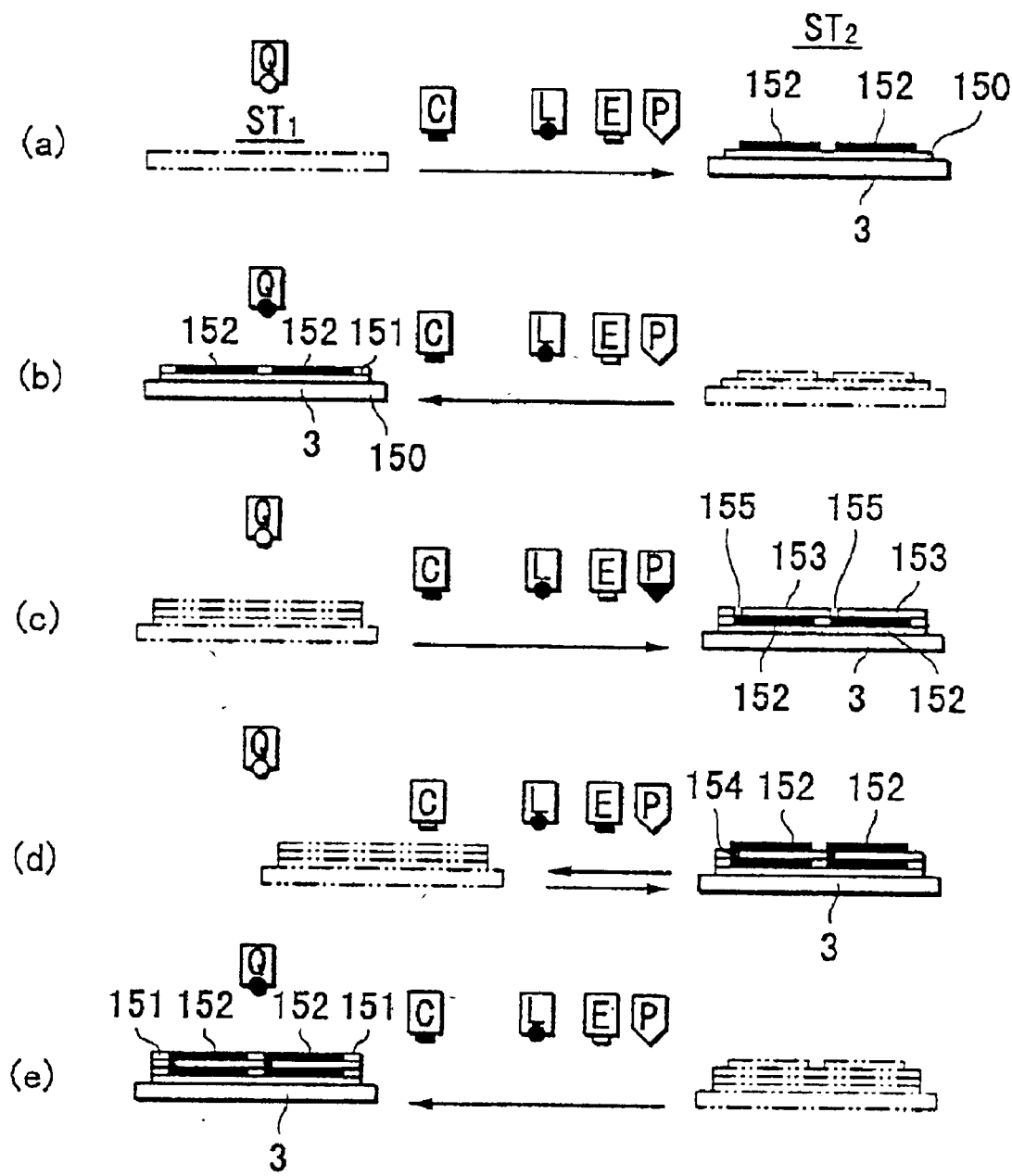
FIG. 27 is a front elevational view for illustrating some work steps of the fifth preferred embodiment.

FIG. 27 shows a fifth preferred embodiment of the second invention, wherein it indicates a case for manufacturing the laminated member for an inductor, and more particularly it uses the laser unit P for manufacturing a bier hole for forming the bier electrode.

That is, this preferred embodiment has a configuration in which the laser unit P is arranged in addition to arrangement of the slurry injection unit C, optical radiating unit L, paste injection unit E and CCD camera unit Q corresponding to the aforesaid second preferred embodiment.

In this fifth preferred embodiment, some work steps (a) to (e) described in reference to FIG. 27 will be carried out.

FIG. 27(a):

At the time of initial moving operation of the base plate 3, the slurry injection unit C, optical radiating unit L and paste injection unit E are operated, the ceramics slurry is injected through the slurry injection unit C to form a base insulating layer 150 having a predetermined area on the base plate 3 and then the insulating layer 150 is dried with the optical radiating unit L while passing below it.

Then, when the base insulating layer 150 passes below the paste injection unit E, the conductive paste is injected by the paste injection unit E to form an electrode layer 152 comprised of a predetermined electrode pattern.

FIG. 27(b):

At the time of returning operation of the base plate 3, the optical radiating unit L and the slurry injection unit C are operated.

After the electrode layer 152 formed by the operation shown in FIG. 27(a) is dried while it passes below the optical radiating unit L, ceramics slurry is injected by the slurry injection unit C to fill between the electrode layers 152 on the base insulating layer 150 so as to form the spacer insulating layer 151.

In addition, when the base plate 3 returns back to the stage ST$_1$, the CCD camera unit Q is operated to take a photograph of the surfaces of the formed insulating layer 151 and the electrode layer 152.

FIG. 27(c):

Then, when the base plate 3 moves forward again, the slurry injection unit C, optical radiating unit L and laser unit P are operated.

When the base plate 3 passes below the slurry injection unit C, ceramics slurry is injected to form the spacer insulating layer 151 and an insulating layer 153 covering the entire upper surface of the electrode layer 152, and the ceramics slurry is dried while the base plate passes below the optical radiating unit L.

Then, when the base plate 3 passes below the laser unit P, a bier hole 155 communicated with the electrode layer 152 is opened at a predetermined position in the insulating layer 153.

FIG. 27(d):

Then, although the base plate 3 starts to return from the stage ST$_2$, the base plate 3 performs both returning operation and moving-forward operation over a short segment up to the midway position where it does not return up to the stage ST$_1$, more particularly, the segment up to a position where the base plate 3 passes from the stage ST$_2$ through the optical radiating unit L, and during this operation, the optical radiating unit L and the paste injection unit E are operated.

Then, in the case that the conductive paste is injected by the paste injection unit E while the base plate passes below the paste injection unit E during its returning operation over the short segment, the conductive paste is filled in the bier hole 155 to form the bier electrode 154, and the bier electrode 154 is dried while passing through the optical radiating unit L. In turn, during the moving-forward operation over the short segment, the electrode layer 152 having a predetermined pattern is formed by the paste injection unit E on the upper surfaces of the insulating layer 153 and the bier electrode 154.

FIG. 27(e):

The slurry injection unit C and optical radiating unit L are operated at the time of subsequent returning-back motion of the base plate 3.

After the electrode layer 152 formed in reference to the operation shown in FIG. 27(d) is dried while passing below the optical radiating unit L, ceramics slurry is infected in an area where the electrode layer 152 is not coated by the slurry injection unit C to form the spacer insulating layer 151.

Then, when the base plate 3 returns back to the stage ST$_1$, the CCD camera unit Q is operated to take a photograph of the surfaces of the formed insulating layer 151 and the electrode layer 152.

Subsequent to the operations shown in FIGS. 27(a) to (e), the operations shown in FIGS. 27(c) to (e) are repeated to attain the laminated member for an inductor which is similar to that of the aforesaid second preferred embodiment.

Figure 28:
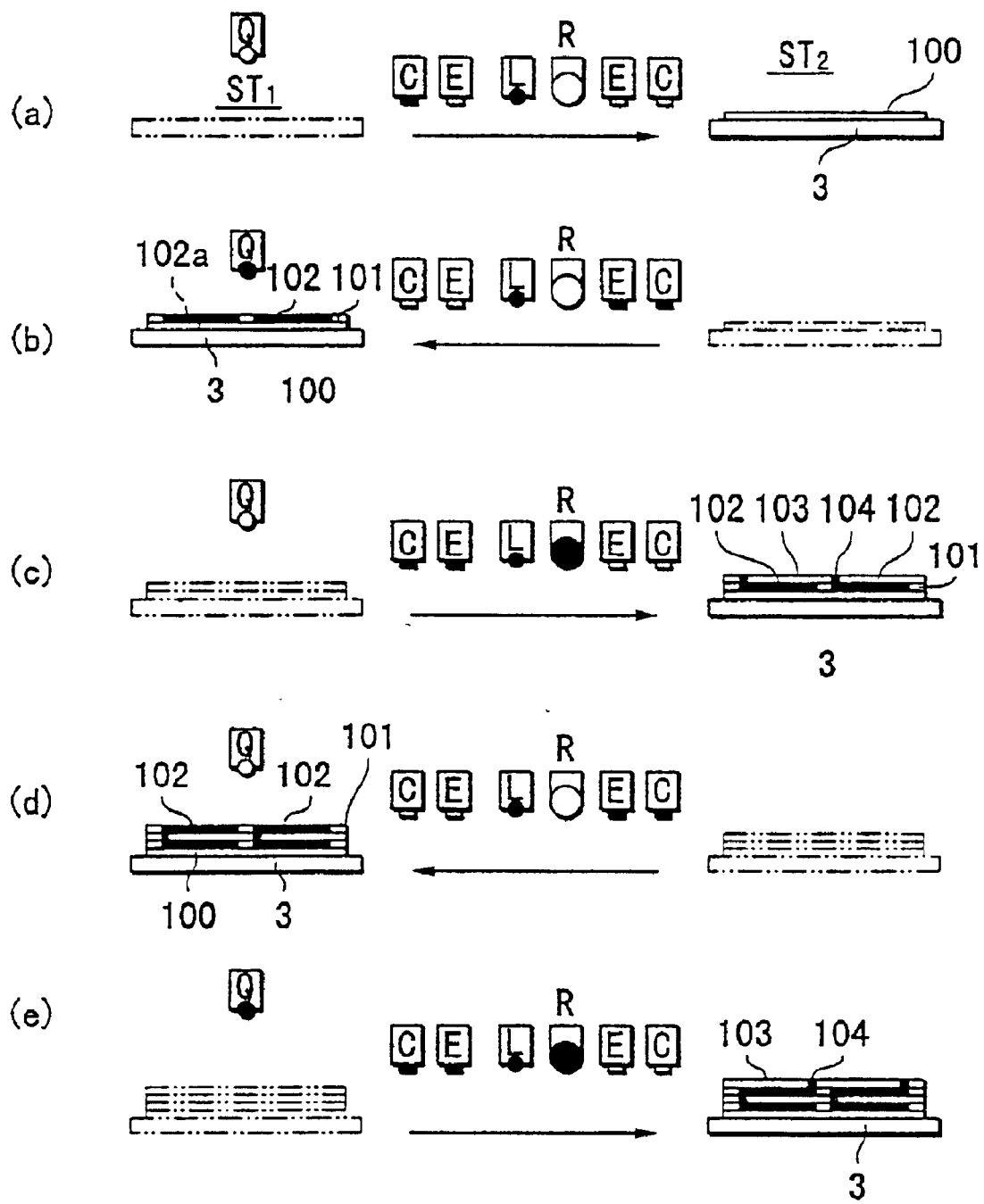
FIG. 28 is a front elevational view for illustrating some work steps of the sixth preferred embodiment.

FIG. 28 shows a sixth preferred embodiment of the second invention, wherein it indicates a case for manufacturing the laminated member for an inductor, and more particularly it indicates a case that there is provided a roll press contacting unit comprised of a pressing roll R acting as the temporary press contacting unit. More practically, this figure illustrates a case in which the roll press contacting unit is added to the arrangement configuration of the first preferred embodiment.

Since FIG. 28 showing some work steps of the sixth preferred embodiment strictly corresponds to that described in reference to FIG. 23, its description is eliminated while applying the same reference symbols in this figure for sake of convenience in description, although this preferred embodiment is constructed such that the roll press contacting unit R is arranged in such a way that it can be moved up and down between the central optical radiating unit L and the right side paste injection unit E, and the roll press contacting unit P is operated (moved downwardly) in reference to FIG. 28(*c*).

That is, at the time of each of the operations shown in FIG. 28(*c*), after insulating layer 103 formed with the bier electrode 104 is dried while passing below the optical radiating unit L, the roll press contacting unit R is moved down onto the moving base plate 3 to press against the upper surfaces of the bier electrode 104 and insulating layer 103 so as to temporarily press contact against the thin film layer.

Under this temporary press contacting operation, some fine corrugations generated at the upper surface of the thin film layer are made flat to form a unified state and a close fitness with the thin film layer of the lower layer is improved.

Since the practical structure of the roll press contacting unit R is the same as that shown in FIG. 16, its practical description is eliminated.

In each of the aforesaid preferred embodiments, the base plate 3 moves downwardly as the movable table 2 is operated to move downwardly every time the base plate 3 moves forward or returns back, wherein a distance of downward motion corresponds to a thickness of each of the insulating layer and the electrode layer so as to always hold the upper surfaces of each of the units and the formed layer constant.

In addition, although the base plate 3 can move over a short distance by motion of the movable table 2 in a Y-axis direction, this is used for adjustment for positioning the base plate downwardly in correspondence with a depth length of each of the units (a length in a Y-axis direction) after each of the units is set at the supporting member.

Then, although each of the insulating layer forming unit and conductive layer forming unit in the aforesaid preferred embodiment has been described in reference to their practical structure, arrangement and work steps, their arrangement, number and work steps in the present invention can be properly changed or modified so long as they are made strictly in accordance with its gist, and they are not restricted to those described in the preferred embodiments.

For example, the doctor blade system can be applied as the insulating layer forming unit, the supporting member for fixing each of the units is not restricted to the structure shown in FIG. 20 or 22, or the CCD camera unit is also arranged above the stage $ST_2$ to take a photograph of the surface image every time the base plate performs a forward motion or returning-back motion.

Figure 29:
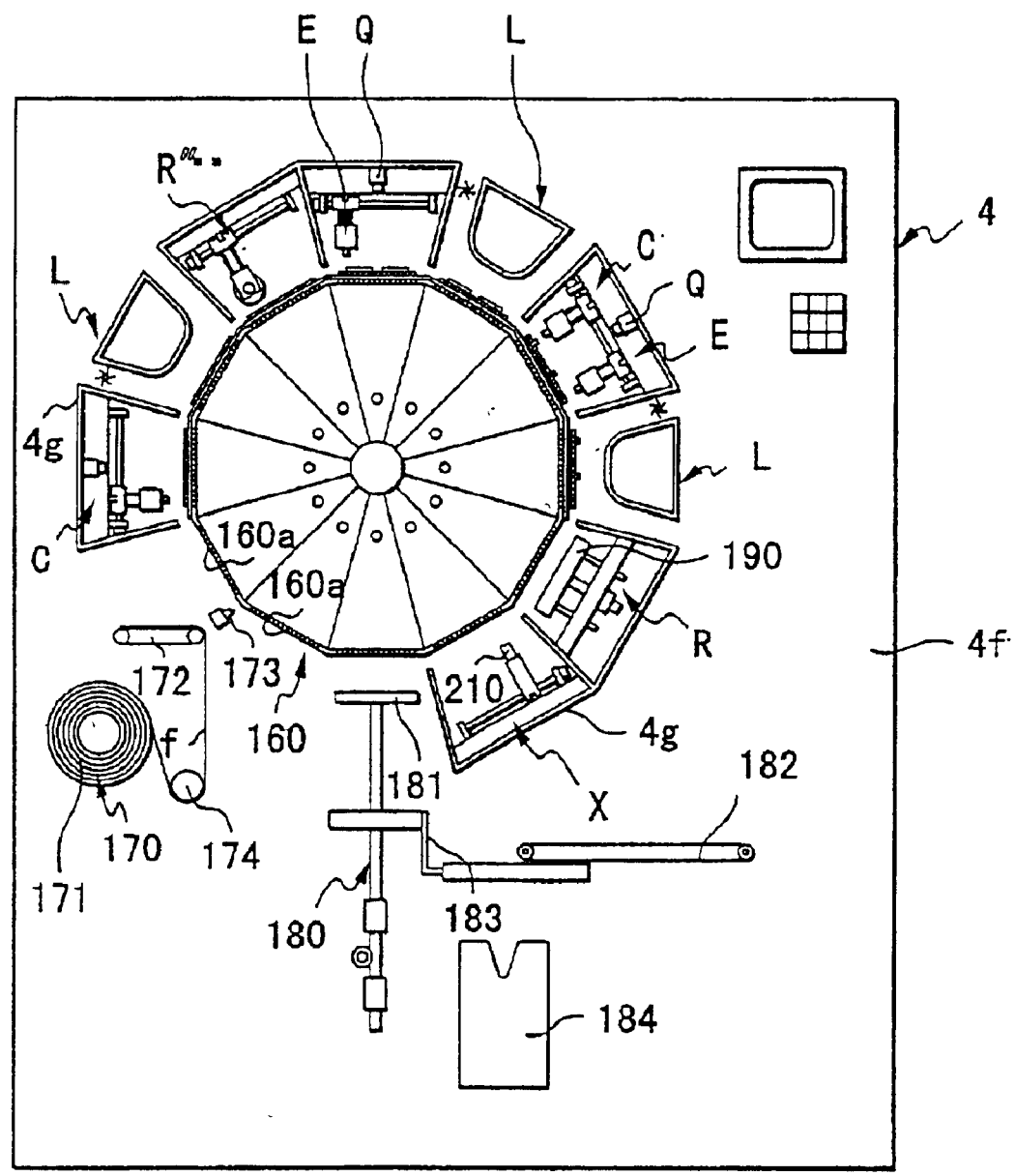
FIG. 29 is a front elevational view for illustrating a schematic configuration of the apparatus for manufacturing the laminated member of the third invention.
Figure 30:
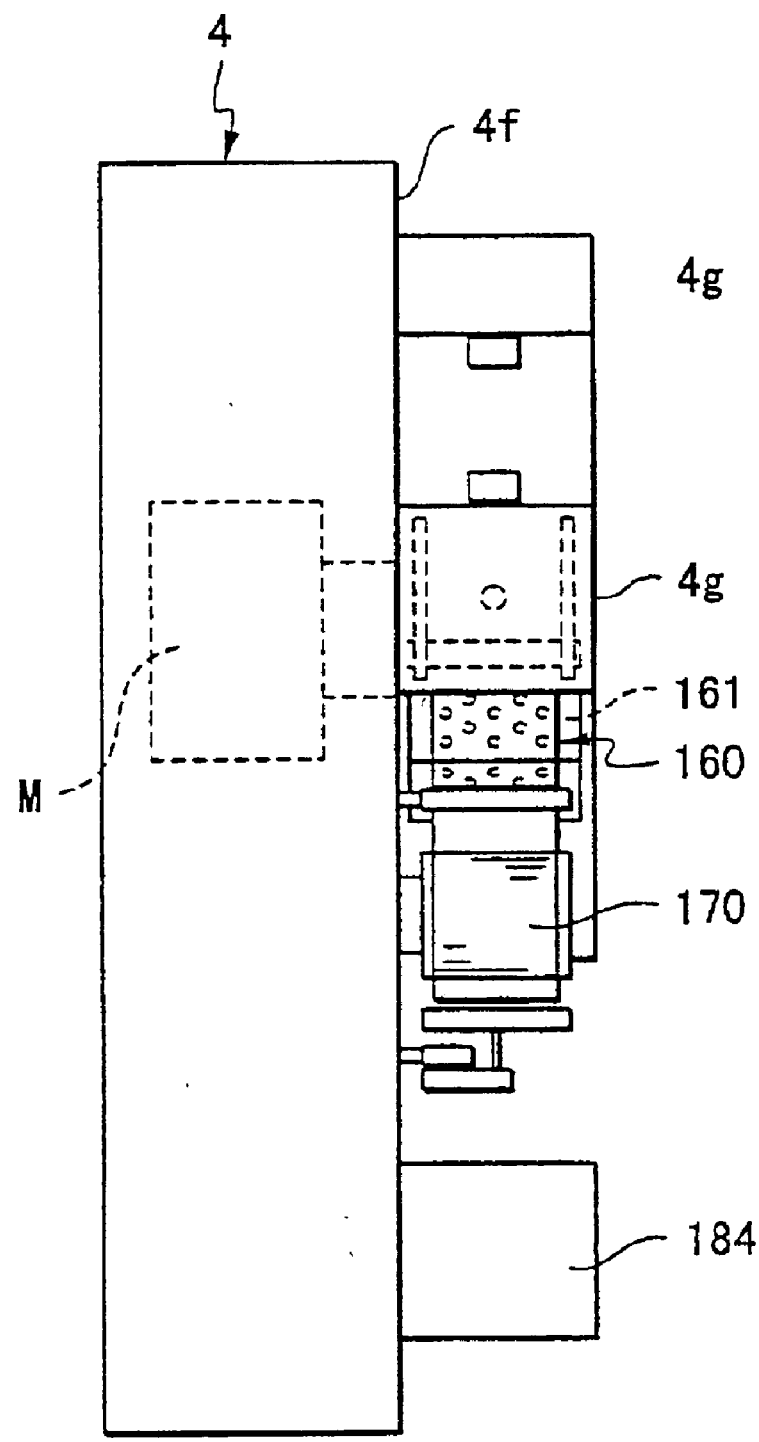
FIG. 30 is a side elevational view for showing the apparatus for manufacturing the laminated member of the third invention.

Then, the apparatus for manufacturing the laminated member of a third invention shown in FIGS. 29 to 39 will be described as follows, wherein FIGS. 29 and 30 illustrate a schematic arrangement of the manufacturing apparatus. A rotary drum 160 is rotatably attached to a vertical supporting wall 4*f* constituting a front surface of the machine frame 4 and at the same time a film supplying mechanism 170 for supplying a carrier film (f) to the rotary drum 160 at lower one side of the rotary drum 160, and a laminated member recovering mechanism 180 for recovering the manufactured laminated member is arranged just below the rotary drum 160.

A motor M for driving the rotary drum 160 is installed inside the machine frame 4 together with its deceleration control segment and although not shown, there are arranged a slurry tank for storing ceramics slurry, a paste tank for storing conductive paste or a vacuum mechanism and a control box or a wiring equipment and the like.

The rotary drum 160 is a metallic polygonal-shaped drum made of stainless steel (in this figure, a dodecagonal shape is illustrated), its outer circumferential surface is defined with flat work surface 160a in a continuous manner, and each of the work surface 160a is opened with suction holes 161 . . . so as to generate sucking action with vacuum.

This rotary drum 160 is set to perform a continuous rotation or an intermittent rotation by the motor, it is rotated continuously when the carrier film is supplied from the film supplying mechanism 170, the film (f) is wound around its outer circumference and it is arranged at each of the work surface 160*a*.

In addition, the rotary drum 160 has mounted either a work stage for performing each of the works or a preliminary stage in opposition to each of the work surface 160*a* under a stopped state during the intermittent rotation, and the insulating layer forming stage, conductive layer forming means, drying means, camera means, pressing means, temporary press contacting means and cutting means or the like are properly arranged at these work stages.

Figure 31:
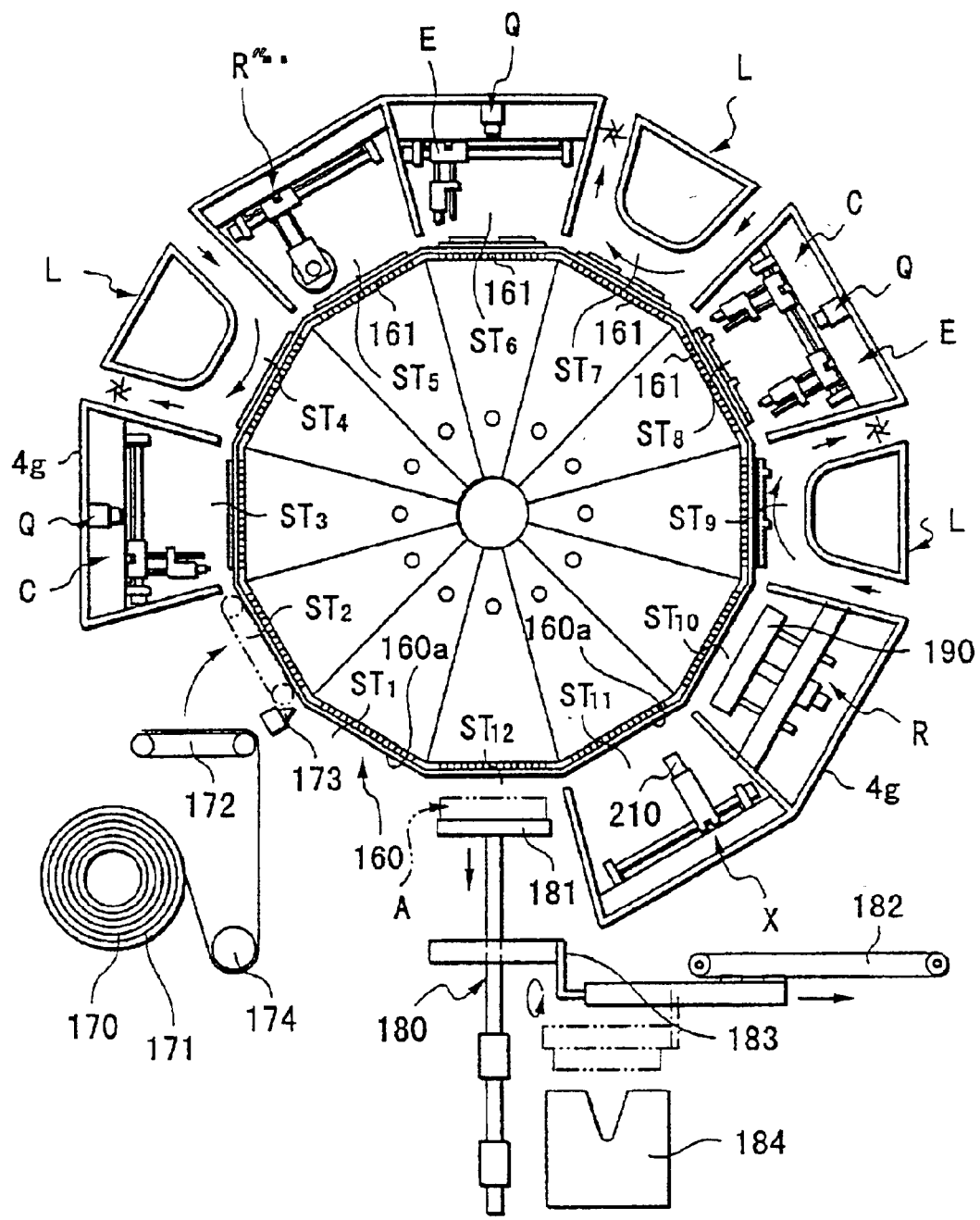
FIG. 31 is an enlarged view for showing a major segment in FIG. 1.

More practically, there will be described about a case in which the rotary drum 160 is rotated intermittently in a clockwise direction as shown in FIGS. 29 and 31, one location under its stopped state is applied as a first stage $ST_1$, and a second stage $ST_2$, a third stage $ST_3$ . . . a twelfth stage $ST_{12}$ are applied in a clockwise direction.

$ST_1$ is applied as the preliminary stage and $ST_2$ is applied as the installing stage for the carrier film (f), $ST_3$ is provided with the slurry injection unit C and the CCD camera unit Q; $ST_4$ is provided with the drying unit L; $ST_5$ is provided with the pressing unit R"; $ST_6$ is provided with the paste injection unit E and the CCD camera unit Q; and $ST_7$ is provided with the drying unit L, respectively.

In addition, $ST_8$ is provided with the slurry injection unit C, paste injection unit E and CCD camera unit Q; $ST_9$ is provided with the drying unit L; $ST_{10}$ is provided with the temporary press contacting unit R; $ST_{11}$, is provided with the cutting unit X; and $ST_{12}$ is a recovery stage positioned just below the rotary drum 160 so as to recover the laminated member A.

Each of the units, i.e. the slurry injection unit C, paste injection unit E, drying unit L, pressing unit R", CCD camera unit Q, temporary press contacting unit R and cutting unit X is installed at each of the supporting frames 4*g* fixed to the supporting wall 4*f* and each of them is removably installed.

As the slurry injection unit C, there is illustrated an ink jet system which is made such that many ink jet nozzles are arranged side by side while being finely spaced apart and ceramics slurry is injected through its selected nozzle.

Also in the case of the paste injection unit E, this is an ink jet system in which many ink jet nozzles are arranged side by side while being finely spaced apart and paste is injected through its selected nozzle.

As the drying unit L, there is illustrated a case in which a drying machine is used for drying either ceramics slurry or conductive paste through blown hot air into a semi-hardened state of such a degree as one in which it may not be adhered. As the drying unit L, it is also applicable to use a drying machine for drying either ceramics slurry or conductive paste through optical radiation.

As the pressing unit R", a rotatable pressing roll is used and this roll presses the upper surfaces of the thin film layer comprised of the formed insulating layer and electrode layer while unifying them with the same configuration as that of the invention described above.

The slurry injection unit C and paste injection unit E are arranged such that these ink jet nozzles are arranged in such a way that they can move over the work surface 160a in an X-axis direction (a peripheral direction of the rotary drum 160) and a Y-axis direction (a width direction of the rotary drum 160), their moving amount is controlled and at the same time they are arranged in such a way that they can move in a Z-axis direction (a moving to or moving away direction) and further their moving amount is controlled.

In addition, the pressing unit R" is arranged such that the pressing roll can be moved in an X-axis direction and a Y-axis direction.

The CCD camera unit Q takes a photograph of a reference mark on the carrier film (f) to be described later or the insulating layer formed at first, transmits it to an image processing device, thereby positions of the units C, E in the X-axis direction and Y-axis direction are controlled to cause the slurry injection unit C, paste injection unit E and insulating layer (an item to be coated) to be aligned to each other in their positions.

As the temporary press contacting unit R, there is illustrated a press plate 190 moved up and down over the work surface 160a in a Z-axis direction, wherein the press plate 190 presses against the upper surface of a thin film layer comprised of an insulating layer and an electrode layer formed on the work surface 160a for every one layer or a plurality of laminated layers so as to perform a temporary press adhering.

As the cutting unit X, there is illustrated a cutter 210 arranged in such a way that the cutter can be moved over the work surface 160a in an X-axis direction and a Z-axis direction, the cutter 210 descends to cut the carrier film (f) over the work surface 160a and separates it from another carrier film (f) in another segment.

The film supplying mechanism 170 is used for feeding out the carrier film (f) from a film roll 171 having the film (f) of a synthetic resin film such as polyethylene terephthalate or the like wound therein and for supplying it to the rotary drum 160, and the film supplying mechanism 170 is comprised of a guide arm 172 for sucking and holding the distal end of the carrier film (f), cutter 173 and tension roller 174.

The guide arm 172 is arranged near the second stage $ST_2$ where the rotary drum 160 is positioned in such a way that it can be oscillated to move toward or away from the work surface 160a, and causes the held carrier film (f) to be contacted when it approaches the work surface 160a and delivers it (refer to FIG. 31).

The rotary drum 160 sucks vacuum through the suction hole 161 and rotates once continuously after sucking the distal end of the film (f), thereby the carrier film (f) goes around the rotary drum 160 by one circumference and the film is arranged at each of the work surface 160a.

The cutter 173 cuts and separates the carrier film (f) after the rotary drum 160 rotates once and stops.

The laminated member recovering mechanism 180 is arranged at the twelfth stage $ST_{12}$ where the rotary drum 160 is positioned, and this mechanism is comprised of a recovering table 181 ascended or descended just below the rotary drum 160 and a recovering arm 183 reciprocated toward the recovering table 181 and inversely rotated by a driving mechanism 182.

This recovering mechanism 180 is operated such that, at a final stage where the laminated member is formed on the carrier film (f) under a predetermined number of rotation of the rotary drum 160, the carrier film (f) cut and separated by the cutting unit X at the eleventh stage $ST_{11}$ reaches the twelfth stage $ST_{12}$, the laminated member A having the carrier film (f) is received by the recovering table 181 when the sucking action at the work surface 160a terminates and then the laminated member is stored into a recovering magazine 184 by the recovering arm 183 (refer to FIG. 31).

Thus, referring to FIG. 32, some work steps for manufacturing the laminated member with the rotary drum 160 will be described.

Figure 32:
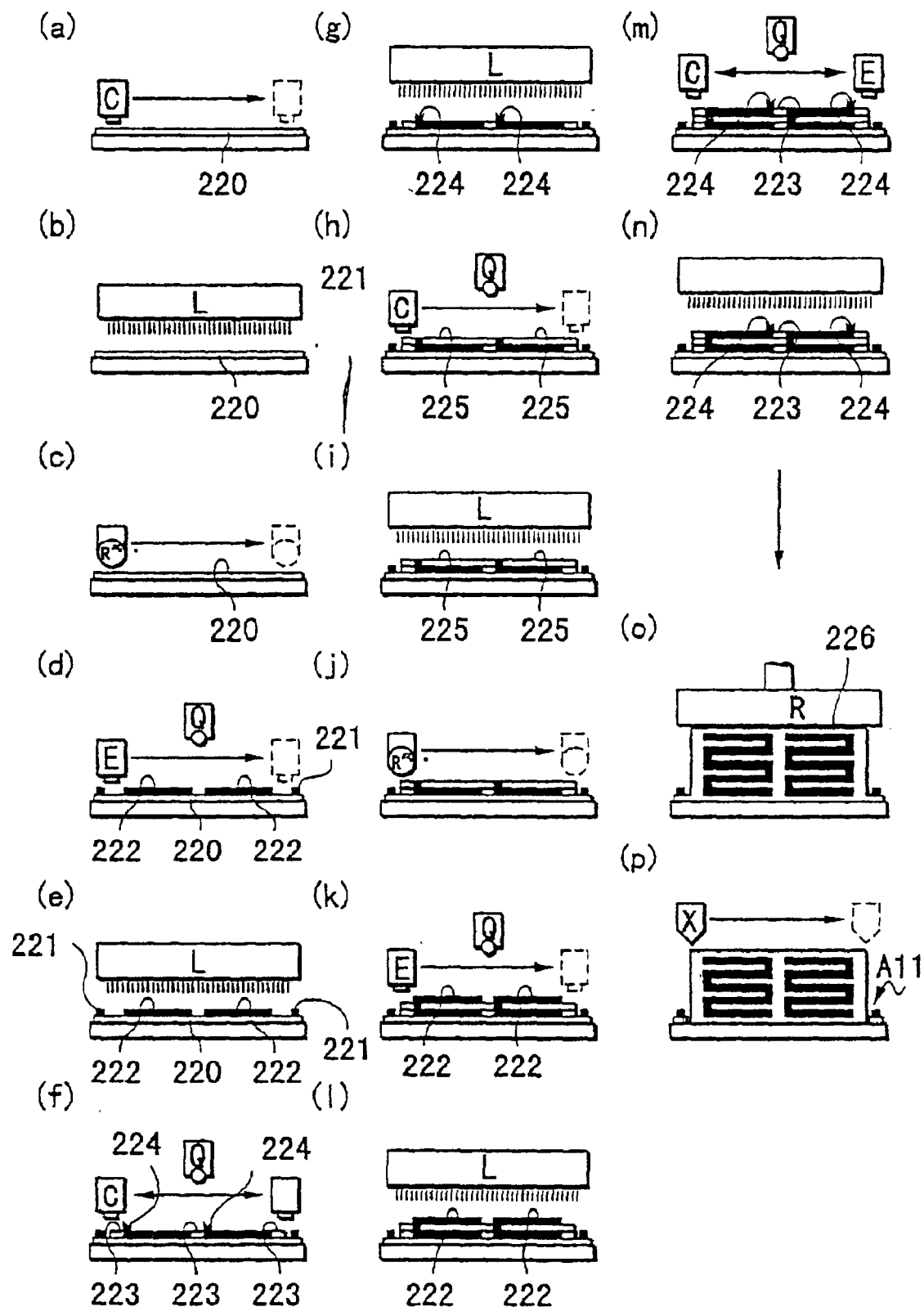
FIG. 32 is a schematic illustration for showing some work steps in the first preferred embodiment.

At first, as described above, after the rotary drum 160 rotates once continuously to cause the carrier film (f) to be arranged at each of the work surface 160a of the rotary drum 160 (refer to FIG. 31) and when the rotary drum 160 performs an intermittent rotations some work steps described in reference to FIG. 32 is started. Further, FIG. 32 illustrates a case in which the laminated member for an inductor.

Figure 34:
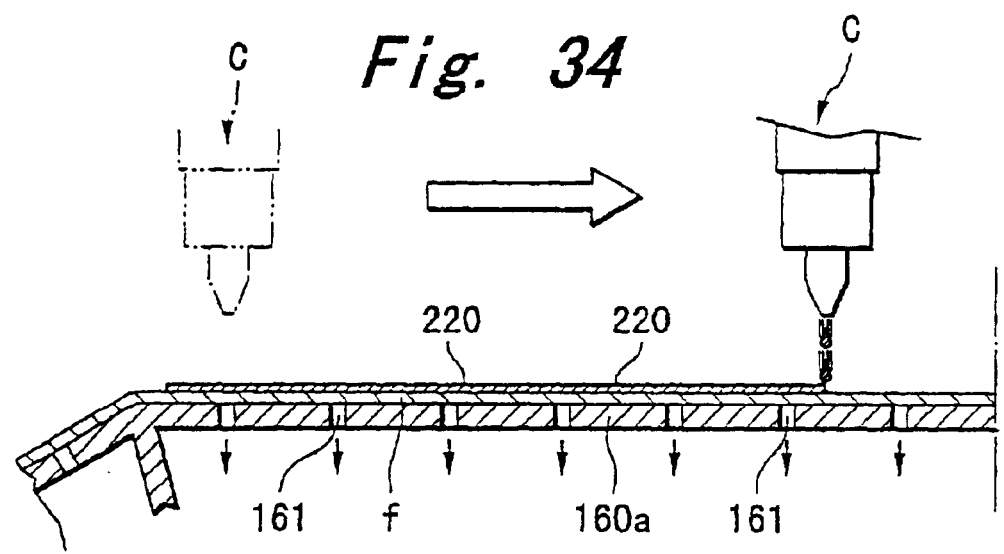
FIG. 34 is an enlarged sectional view for showing some work steps for forming an insulating layer by a slurry injection unit.

FIG. 32(a):

When the work surface 160a of the rotary drum 160 is stopped at $ST_3$, the slurry injection unit C is operated at $ST_3$, the ceramics slurry is injected while the slurry injection unit C is being moved in an X-axis direction to form a base insulating layer 220 of predetermined area on the carrier film (f) (as to its details, refer to FIG. 34).

FIG. 32(b):

When the work surface 160a is moved to $ST_4$, the upper surface of the base insulating layer 220 is dried by the drying unit L at $ST_5$ to such a semi-hardened state not adhering.

FIG. 32(c):

When the work surface 160a is moved to $ST_5$, the pressing unit R" is operated at $ST_5$, the pressing roll is contacted with the base insulating layer 220 and is moved in the X-axis direction. With such an arrangement as above, some fine corrugations generated at the upper surface of the base insulating layer 220 are made flat through an ink jet system to unify them.

Figure 35:
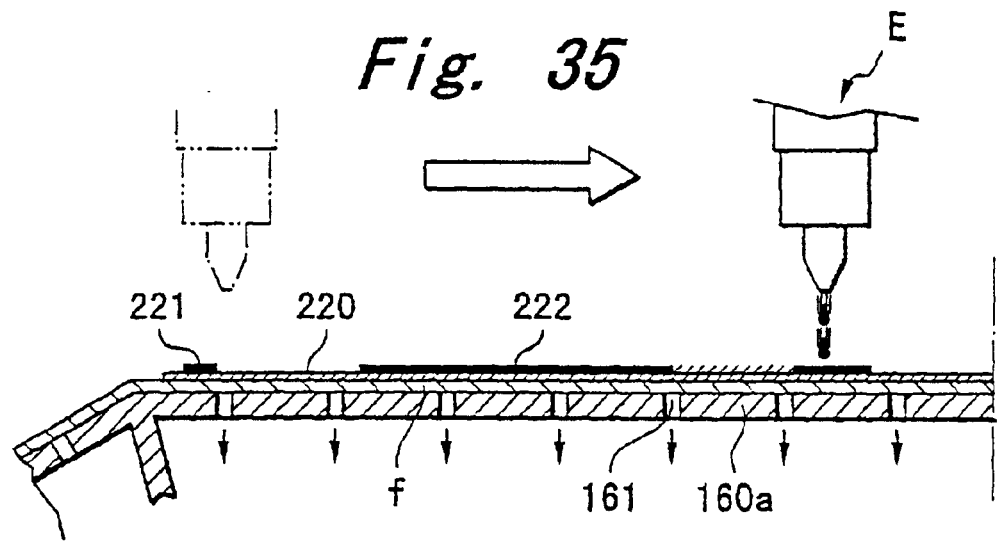
FIG. 35 is an enlarged sectional view for showing some work steps for forming an electrode layer and a reference mark by a paste injection unit.

FIG. 32(d):

Then, when the work surface 160a is moved to $ST_6$, the paste injection unit E is operated at $ST_6$, the paste injection unit E injects conductive paste onto the base insulating layer 220 while moving in the X-axis direction to form the electrode layer 222 having a predetermined pattern and further form a reference mark 221 at a predetermined position on an orthogonal line (as to its details, refer to FIG. 35). Further, the reference mark 221 is formed only at the time of initial intermittent rotation of the rotary drum 160.

FIG. 32(e):

When the work surface 160a is moved to $ST_7$, the upper surface of the electrode layer 222 is dried by the drying unit L at $ST_7$.

Figure 36:
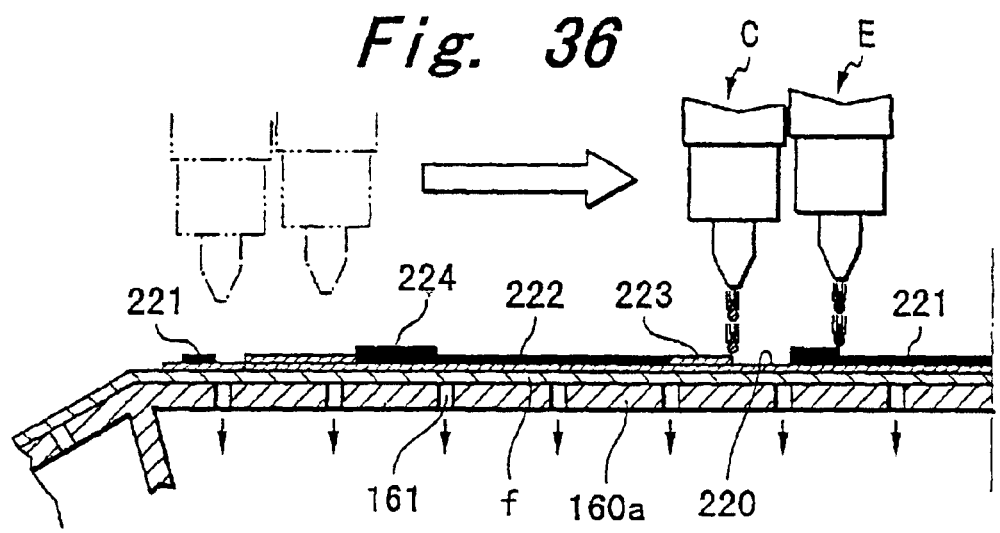
FIG. 36 is an enlarged sectional view for showing some work steps for forming a spacer insulting layer and a bier electrode by a slurry injection unit and a paste injection unit.

FIG. 32(f):

Then, when the work surface 160a reaches $ST_8$, the slurry injection unit C and the paste injection unit E are operated, the slurry injection unit C injects ceramics slurry to an area except the electrode layer 222 while moving in the X-axis direction to form the spacer insulating layer 223, and the paste injection unit E injects conductive paste at a predetermined position on the electrode layer 222 while moving in the X-axis direction to form a bier electrode 224 (as to its details, refer to FIG. 36).

Further, prior to operations of the slurry injection unit C and paste injection unit E, the CCD camera unit Q at $ST_8$ takes a photograph of the reference mark 221 to control coordinates of X-axis and Y-axis of the slurry injection unit C and paste injection unit E with the reference mark 221 being applied as a reference.

FIG. 32(g):

When the work surface 160a is moved to $ST_9$, the spacer insulating layer 223 and the bier electrode 224 are dried by the drying unit L.

After this operation, the work surface 160a passes through $ST_{10} \ldots ST_{12} \ldots ST_2$ without being processed with any operation and the work surface 160a is moved again to $ST_3$.

FIG. 32(h):

When the work surface 160a is stopped at $ST_3$, the slurry injection unit C is operated at $ST_3$, the slurry injection unit C injects ceramics slurry while being moved in the X-axis direction and in this case it forms an insulating layer 225 at an area except the bier electrode 224.

Further, prior to the operation of the slurry injection unit C, the CCD camera unit Q at $ST_3$ takes a photograph of the reference mark 221 and the coordinates of X-axis and Y-axis of the slurry injection unit C are controlled.

FIG. 32(i):

When the work surface 160a is moved to $ST_4$, the upper surface of the insulating layer 225 is dried by the drying unit L at $ST_4$ in the same manner as that described above.

FIG. 32(j):

When the work surface 160a is moved to $ST_5$, the pressing unit R" is operated at $ST_5$, the pressing roll is moved in the X-axis direction while being contacted with the insulating layer 225 so as to cause some fine corrugations generated at the upper surface of the insulating layer 225 to be flat.

FIG. 32(k):

When the work surface 160a is moved to $ST_6$, the paste injection unit E is operated at $ST_6$, the paste injection unit E injects the conductive paste onto the bier electrode 224 and insulating layer 225 while being moved in the X-axis direction to form the electrode layer 222 comprised of a predetermined pattern in the same manner as that described above.

Further, a control over a position of the paste injection unit E with the CCD camera unit Q is carried out in the same manner as that described above.

FIG. 32(l):

When the work surface 160a is moved to $ST_7$, the upper surface of the electrode layer 222 is dried in the same manner as that shown in the aforesaid FIG. 32(e).

FIG. 32(m):

Then, when the work surface 160a reaches $ST_8$, both the slurry injection unit C and paste injection unit E are operated in the same manner as that shown in FIG. 32(f) described above to form the spacer insulating layer 223 and bier electrode 224.

FIG. 32(n):

When the work surface 160a is moved to $ST_9$, the spacer insulating layer 223 and bier electrode 224 are dried in the same manner as that shown in the aforesaid FIG. 32(g).

After this operation, the operations shown in FIGS. 32(h) to (n) are repeated by the predetermined number of times to cause many thin film layers comprised of insulating layers 223, 225 and the electrode layers 222, 224 to be laminated and the operation shown in FIG. 32(o) is performed at a proper time during this operation.

FIG. 32(o):

When the work surface 160a is moved to $ST_{10}$ and stopped there, the temporary press contacting unit R is operated, the press plate 190 descends to press against the upper surface of the thin film layer formed on the work surface 160a and this is temporarily press contacted. With such an operation as above, a close fitness between the thin film layers is improved.

At $ST_8$ of the final rotating time of the rotary drum 160, the spacer insulating layer 223 and bier electrode 224 are formed by the slurry injection unit C and the paste injection unit E and at the same time a dummy insulating layer 226 acting as the uppermost layer is formed.

In addition, at the time of final rotating operation of the rotary drum 160, a subsequent operation shown in FIG. 32(p) of next one is carried out after the operation shown in FIG. 32(o).

FIG. 32(p):

When the work surface 160a is moved to $ST_{11}$ and stopped there, the cutter 210 in the cutting unit X descends to cut the carrier film (f) on the work surface 160a and separates it.

In this way, a laminated member A11 for an inductor having many thin film layers laminated is manufactured by the aforesaid work steps.

At $ST_{12}$, the laminated member A11 is delivered from the work surface 160a to the rotary table 181 in the laminated member recovering mechanism 180 as described above, and stored in the recovering magazine 184 by the recovering arm 183.

Further, although for sake of illustration in the figure a less number of electrode patterns is shown at the this film layer, more practically, many patterns are formed at the thin film layer in such a way that many inductors can be taken from the laminated member A11.

In addition, although the case in which some work steps are applied in sequence in reference to one work surface 160a has been described above in the description related to the steps above, each of the operations is carried out simultaneously by each of the units at each of the work surfaces 160a of the rotary drum 160 at $ST_3$ to $ST_9$.

Figure 33:
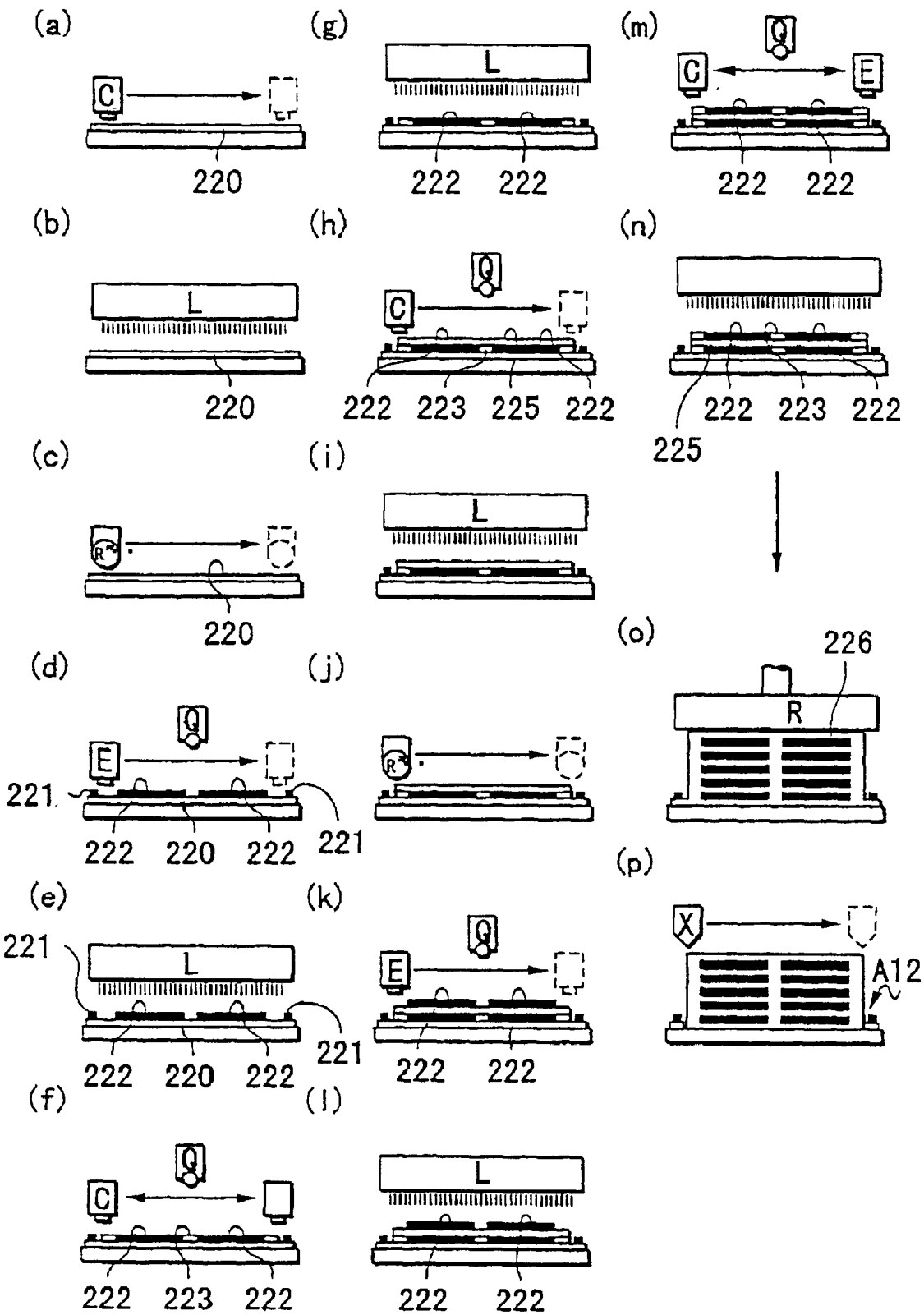
FIG. 33 is a schematic illustration for showing some work steps in the second preferred embodiment.

FIG. 33 shows some work steps for manufacturing the laminated member for a capacitor by the rotary drum 160.

In the case of laminated member A12 For a capacitor, its configuration is not provided with the bier electrode described in reference to the work steps for the inductor, and FIGS. 33(f), (m) at its corresponding $ST_8$ and FIG. 33(h) at its twice rotation and subsequent operation are merely different from FIG. 32, so that only these elements are described and the description in regard to other same step portions is eliminated.

FIG. 33(f):

Although the slurry injection unit C and paste injection unit E are arranged at $ST_8$ as described above, only the slurry injection unit C is operated at this step and the paste injection unit E is not operated.

That is, when the work surface 160a reaches $ST_8$, the slurry injection unit X injects ceramics slurry in an area except the electrode layer 222 formed by the operation shown in FIG. 33(d) while moving in the X-axis direction to form the spacer insulating layer 223.

Further, this operation is similarly applied to the case shown in FIG. 33(m).

FIG. 33(h):

When the work surface 160a is stopped at $ST_3$, the slurry injection unit C injects ceramics slurry at $ST_3$ while moving in the X-axis direction to form the insulating layer 225 at she entire upper surfaces of the spacer insulating layer 2323 and the electrode layer 222 formed by the operation shown in FIG. 33(f).

In this way, in accordance with some work steps shown in FIG. 33, there is manufactured a laminated member A12 for a capacitor having many thin film layers laminated to include the insulating layers 223, 225 and electrode layer 222.

Figure 37:
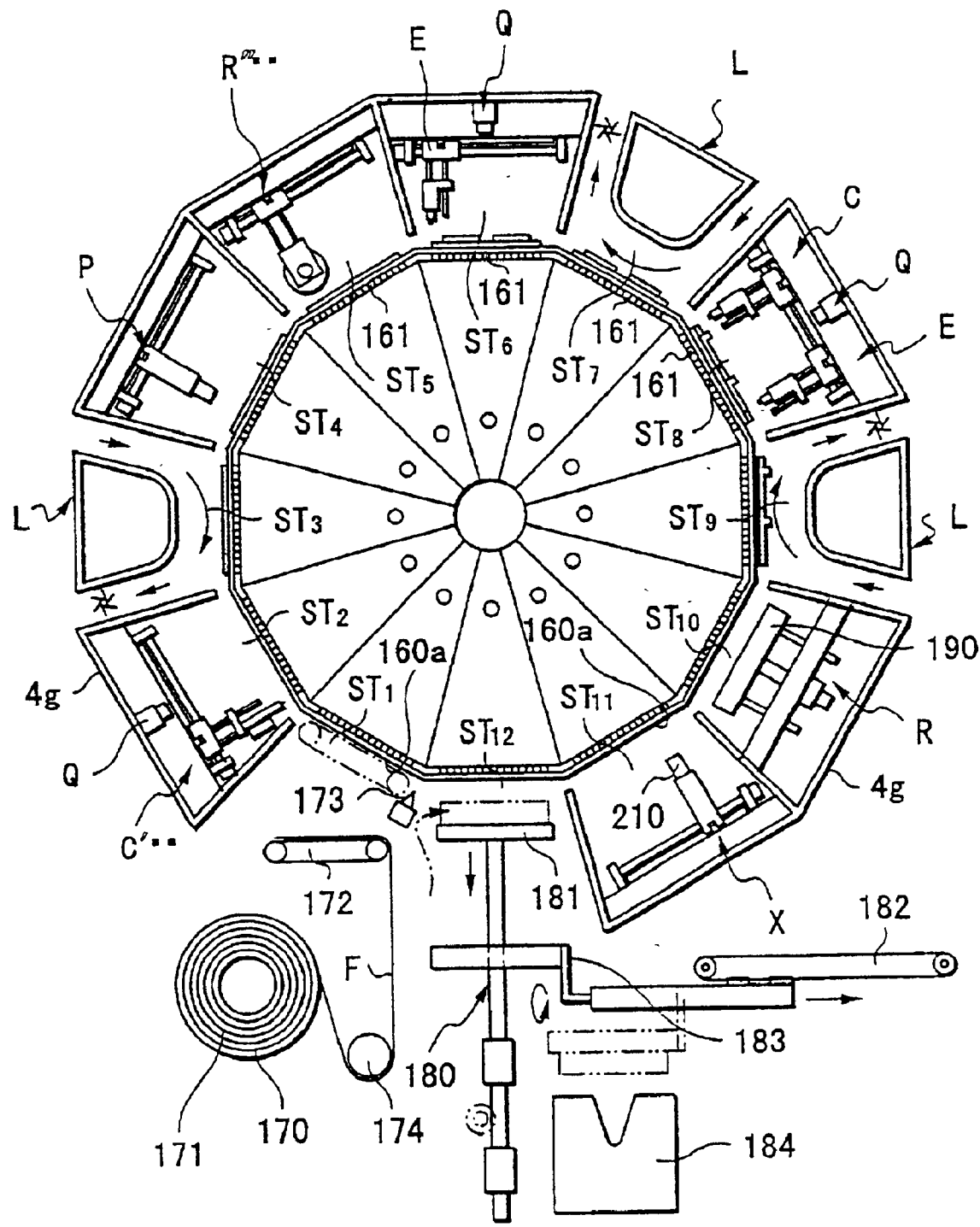
FIG. 37 shows another preferred embodiment of a manufacturing apparatus and this is an enlarged view for showing a major segment corresponding to FIG. 29.

Then, FIG. 37 illustrates another preferred embodiment of the manufacturing apparatus.

Although the manufacturing apparatus shown in FIG. 37 is comprised of the same rotary drum 160, film supplying mechanism 170 and laminated member recovering mechanism 180 as those described in reference to FIG. 31, this has a configuration in which as one of the insulating layer forming means, a doctor blade type slurry injection unit C' is used and the laser unit P is additionally added.

That is, the preliminary stage $ST_1$ is applied as an installing stage for the carrier film (f), $ST_2$ is provided with the doctor blade type slurry injection unit C' and CCD camera unit Q, $ST_3$ is provided with the drying unit L, $ST_4$ is additionally provided with the laser unit P, wherein $ST_5$ to $ST_{12}$ are the same as those shown in FIG. 31.

Figure 38:
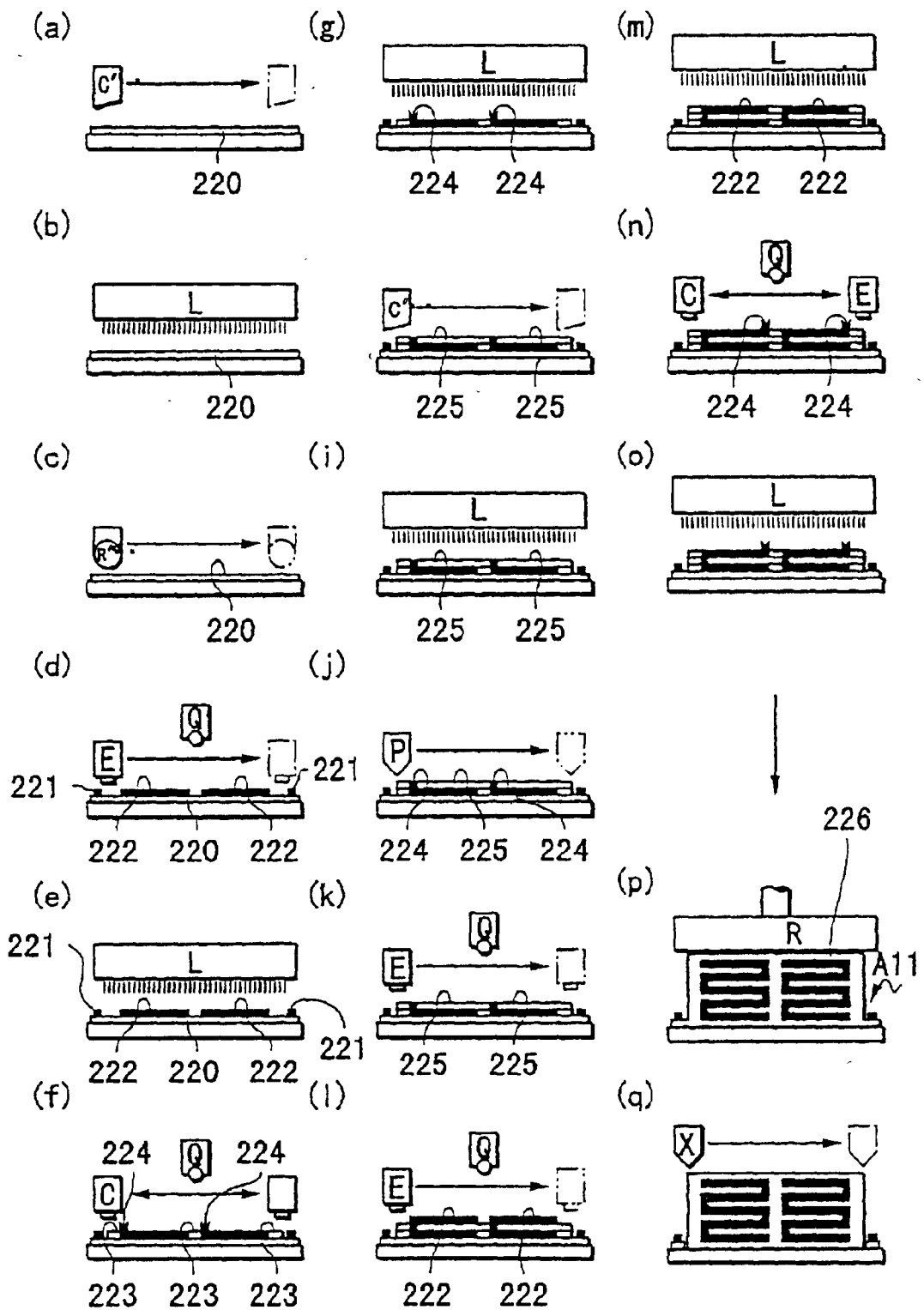
FIG. 38 shows some work steps in FIG. 37.
Figure 39:
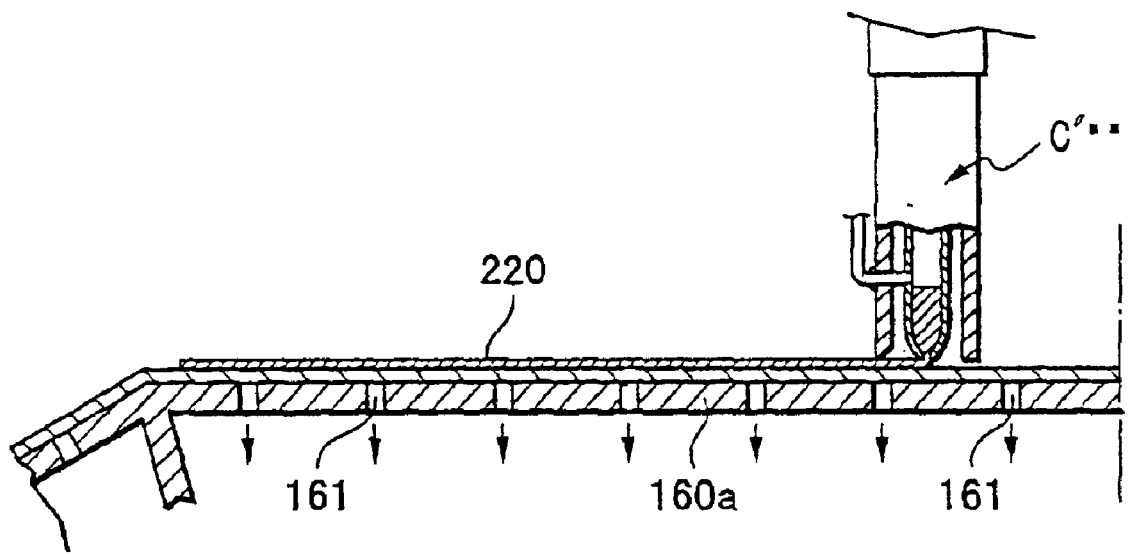
FIG. 39 is an enlarged sectional view for showing some work steps for forming an insulating layer by a slurry injection unit of a doctor blade system.

The slurry injection unit C' coats ceramics slurry over an entire region of a blade width from the blade to form the insulating layer (refer to FIG. 39) and the operations are operated in the steps (a) and (h) shown in FIG. 38.

The laser unit P is constructed such that many laser heads are arranged side by side with a fine space being applied, each of the laser heads is connected to a laser generator, an operation of the laser head is properly selected by the control segment and laser beam is radiated from the selected laser head.

The laser unit P is not operated at the initial once rotation where the rotary drum 160 is intermittently rotated, but it is operated subsequent to its second rotation.

That is, since the laser unit P is not operated at the initial once rotation during some work steps shown in FIG. 38, the description shown in FIGS. 38(*a*) to (*i*) is similar to those of some steps (a) to (i) in FIG. 32 except the operation in regard to FIGS. 38(*a*), (*h*) where ceramics slurry is coated by the slurry injection unit C'. Then, the laser unit P and the pressing unit R" in FIGS. 38(*j*), (*k*) perform operations as follows.

FIG. 38(*j*):

When the work surface 160*a* of the rotary drum 160 is stopped at $ST_4$, the laser unit P is operated at $ST_4$, the laser unit P injects a laser beam to a predetermined range while the laser unit P is moving in the X-axis direction, more particularly the upper surface of the bier electrode 224 formed by the operation shown in FIG. 38(*f*) to expose the bier electrode 224.

That is, in FIG. 38(*h*), the slurry injection unit C' coats an insulating layer up to the upper surface of the bier electrode 224 formed by the operation shown in FIG. 38(*f*) to cover it, so that there is performed an operation in which the insulating layer at this portion is dispersed with radiation of laser beam and the bier electrode 224 is exposed.

FIG. 38(*k*):

When the work surface 160*a* is moved to $ST_5$, the pressing unit R" is operated at $ST_5$, and the pressing roll is contacted with the insulating layer 25 and moved in the X-axis direction. With such an arrangement as above, slurry debris dispersed onto the insulating layer shown in FIG. 38(*j*) are adhered to the pressing roll and removed from above the insulating layer.

Further, subsequent to FIG. 38(*k*), there is manufactured a laminated member A11 for an inductor through the same steps (l) to (q) as the steps (k) to (p) described in reference to FIG. 32.

In each of the preferred embodiments described above, although the slurry injection units C, C', base injection unit E, pressing unit R", cutting unit X and the like are moved in the X-axis direction every time the rotary drum 160 once performs an intermittent rotation, their moving distance corresponds to a thickness of each of the formed insulating layer and electrode layer so as to keep always each of the units and the upper surface of the formed layer constant.

In the preferred embodiment described above, although each of the slurry injection units C, C', paste injection unit E, pressing unit R", temporary press contacting unit R and cutting unit X or the like has been described in reference to their practical structures, arrangements and work steps, their arrangements, number and work steps, these arrangements, number of work steps in the present invention can be properly changed so long as they correspond to the gist of the present invention and so the present invention is not limited to the description above.

Figure 40:
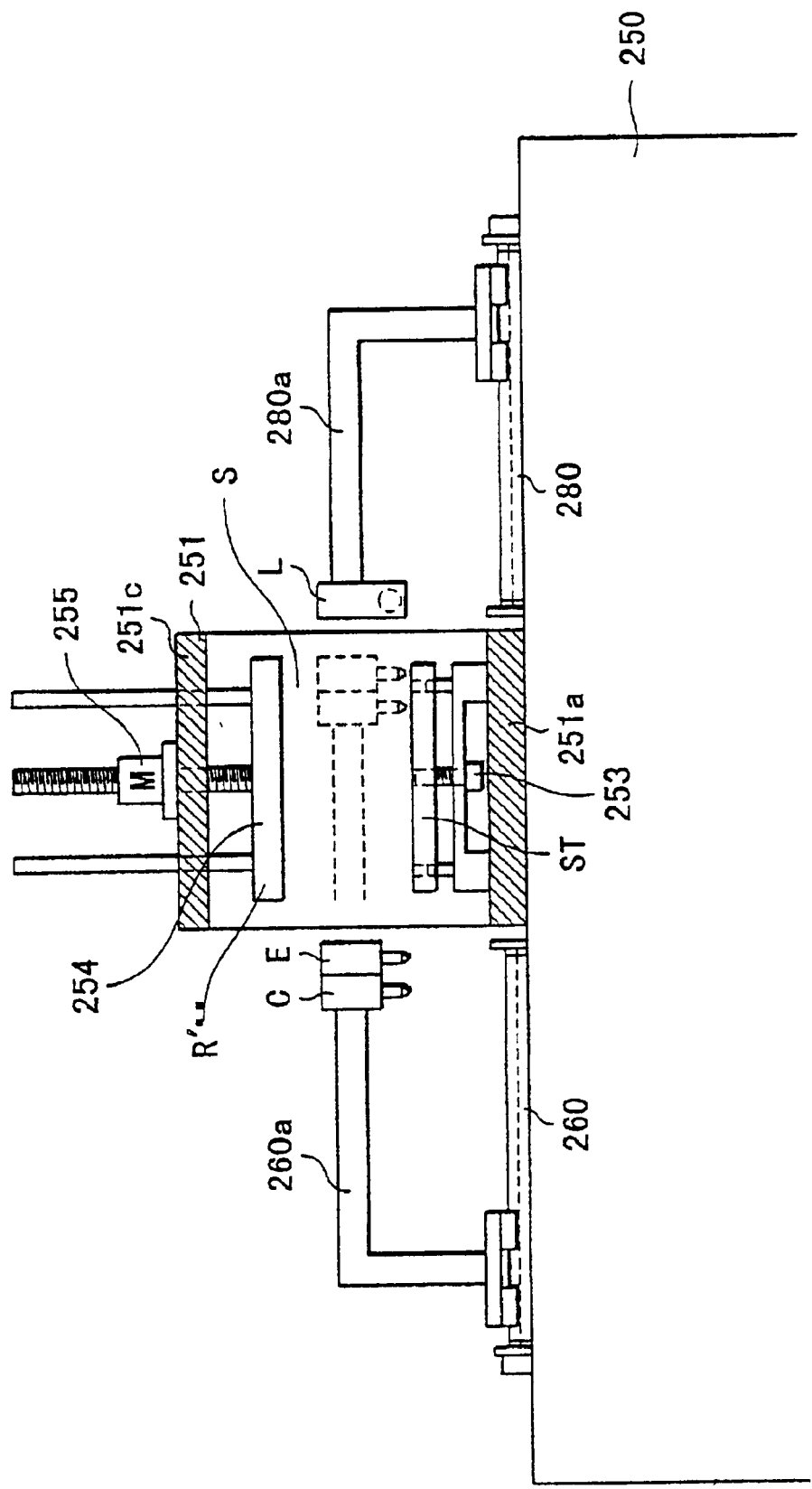
FIG. 40 schematically shows a front elevational view in section of a first preferred embodiment of an apparatus for manufacturing a laminated member of a fourth invention.
Figure 41:
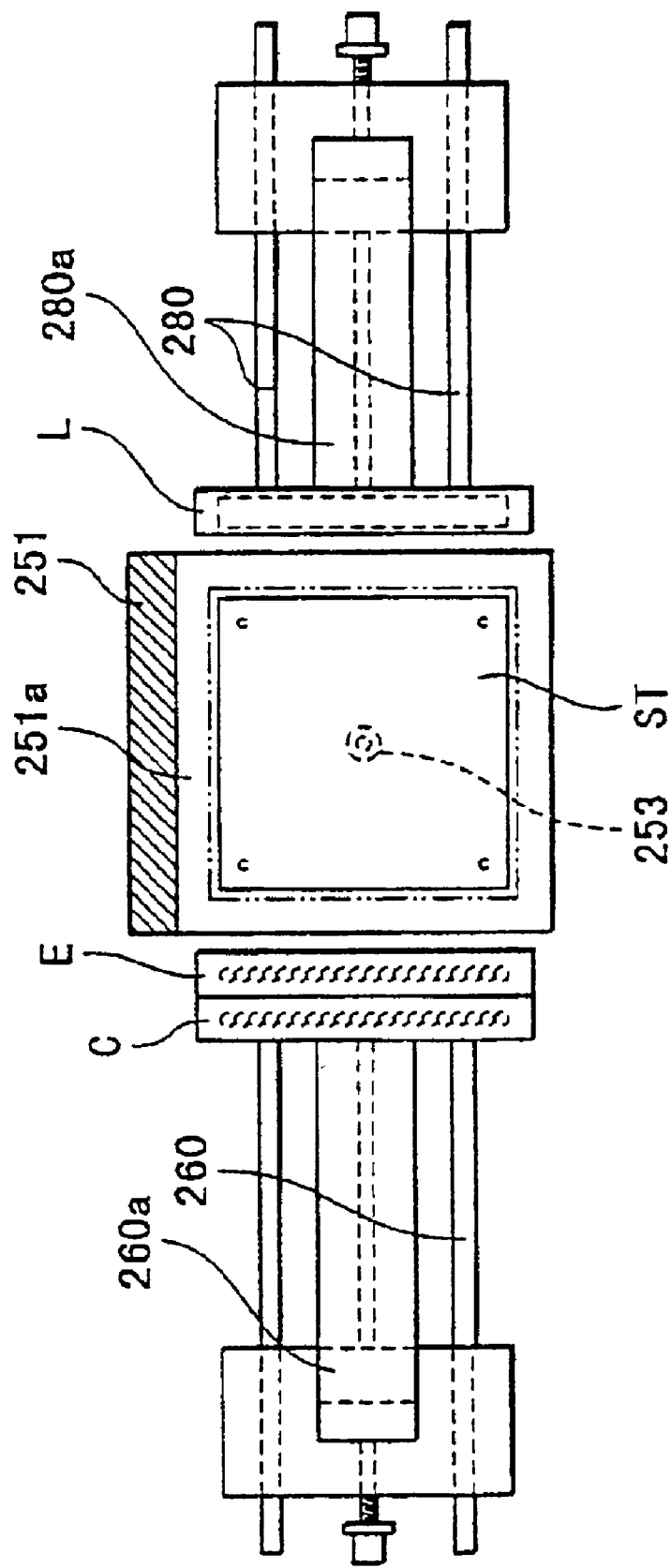
FIG. 41 is a top plan view in section for schematically showing a machine body in cross section.
Figure 42:
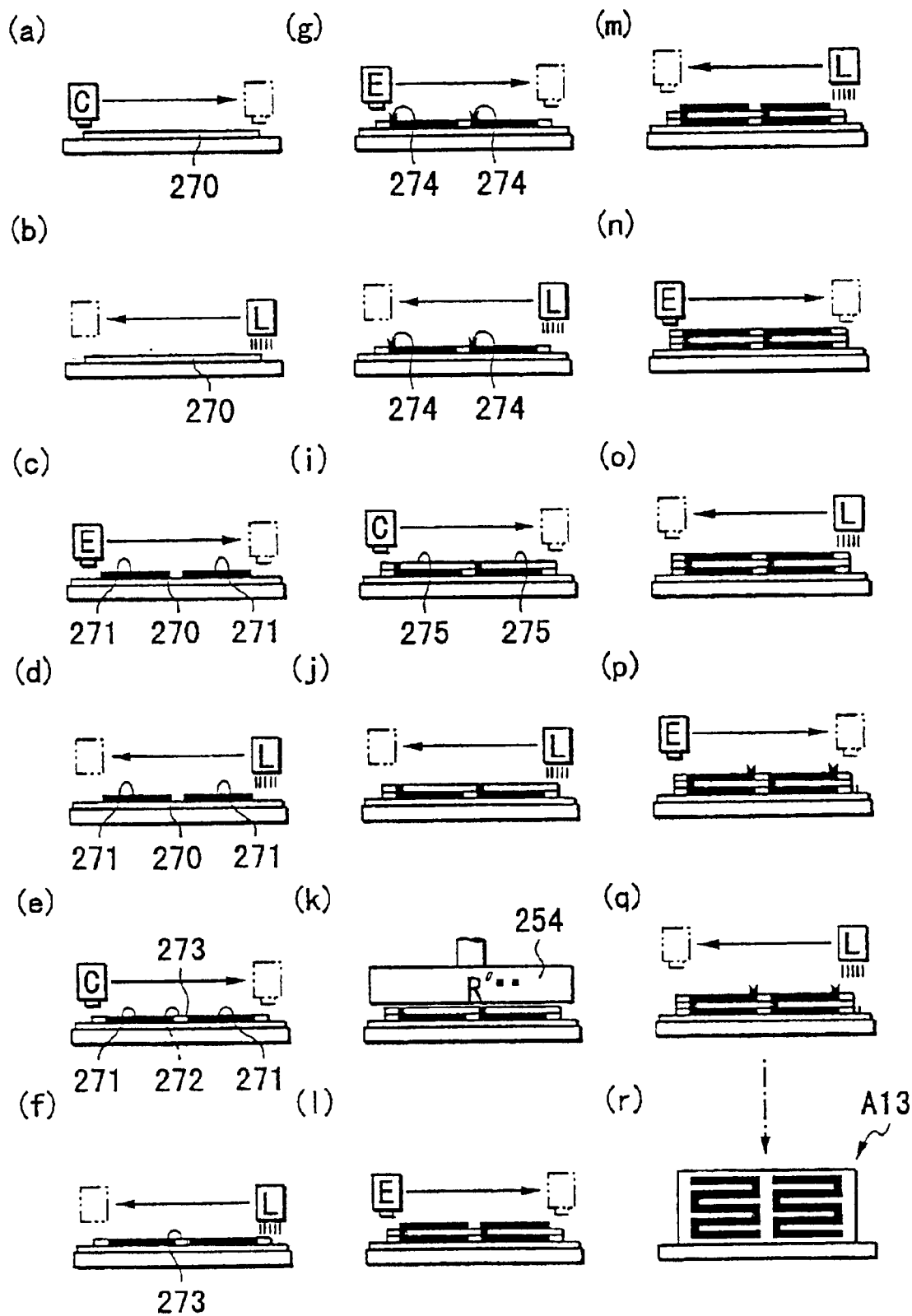
FIG. 42 is a schematic view for showing some work steps in the case that the laminated member (for an inductor) is manufactured by a preferred embodiment.
Figure 43:
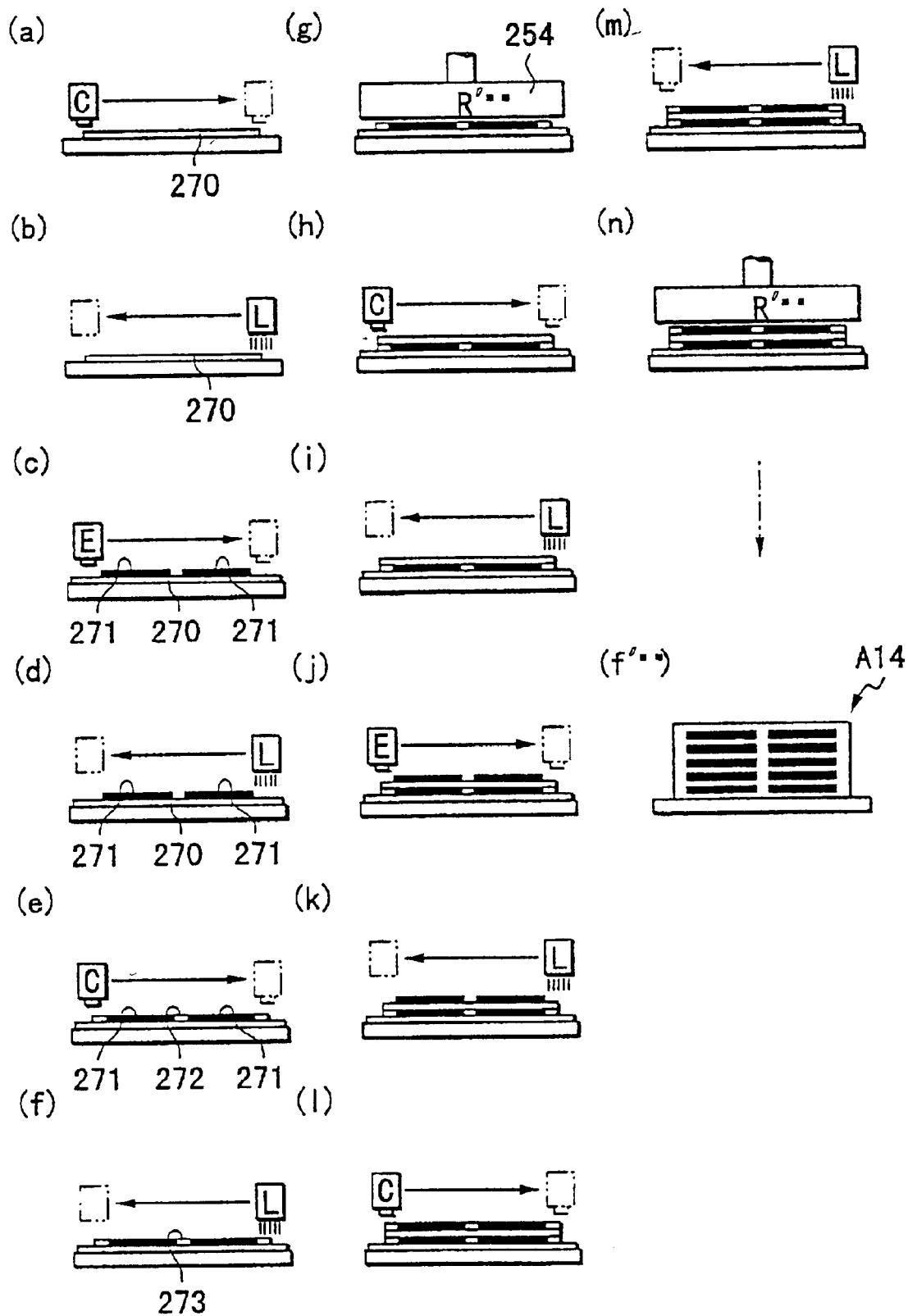
FIG. 43 is a schematic view for showing a second preferred embodiment to illustrate some work steps when the laminated member (for a capacitor) is manufactured by an apparatus for manufacturing the laminated member.
Figure 44:
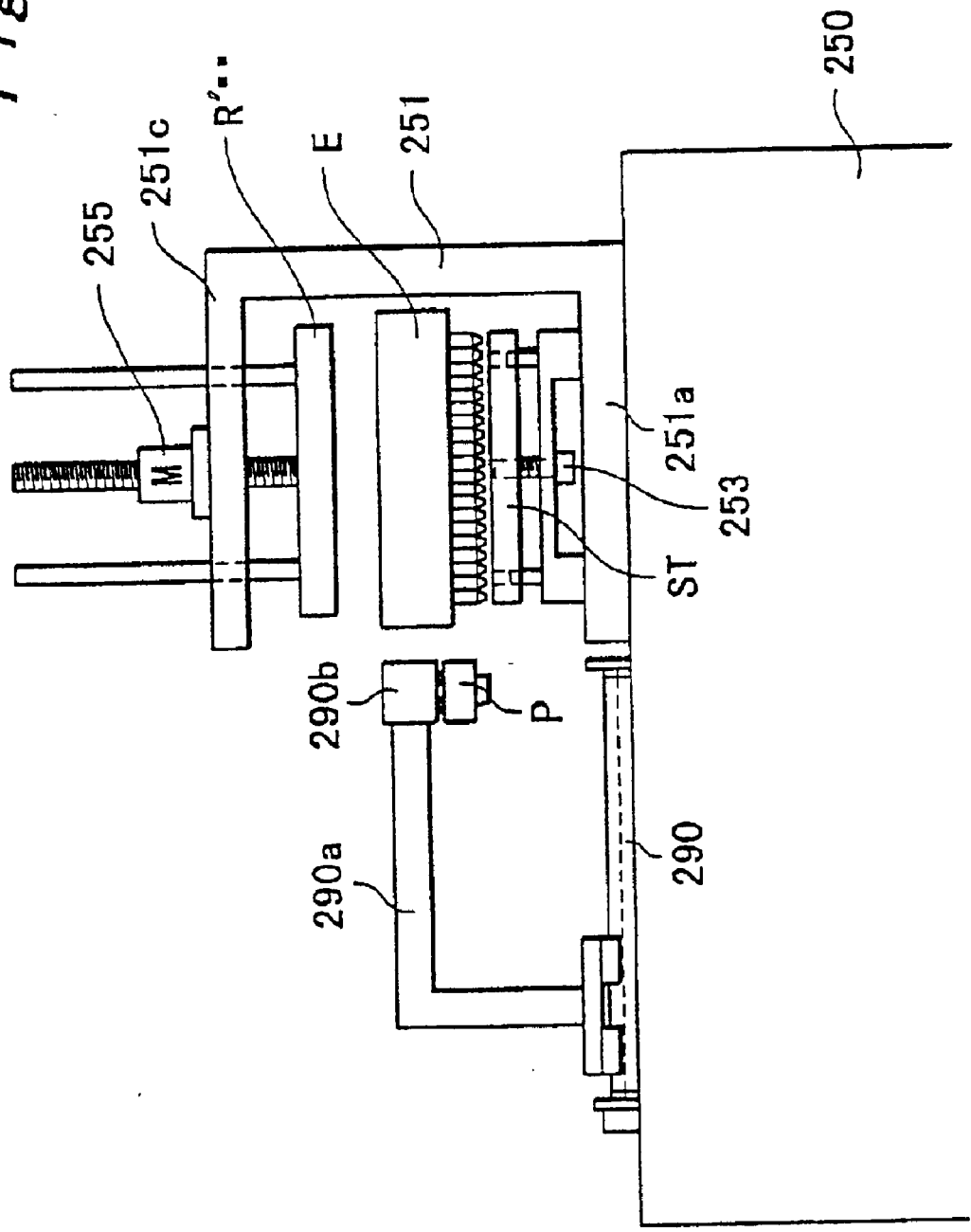
FIG. 44 is a side elevational view for schematically showing an apparatus for manufacturing the laminated member of a third preferred embodiment, wherein a drying means is eliminated.
Figure 45:
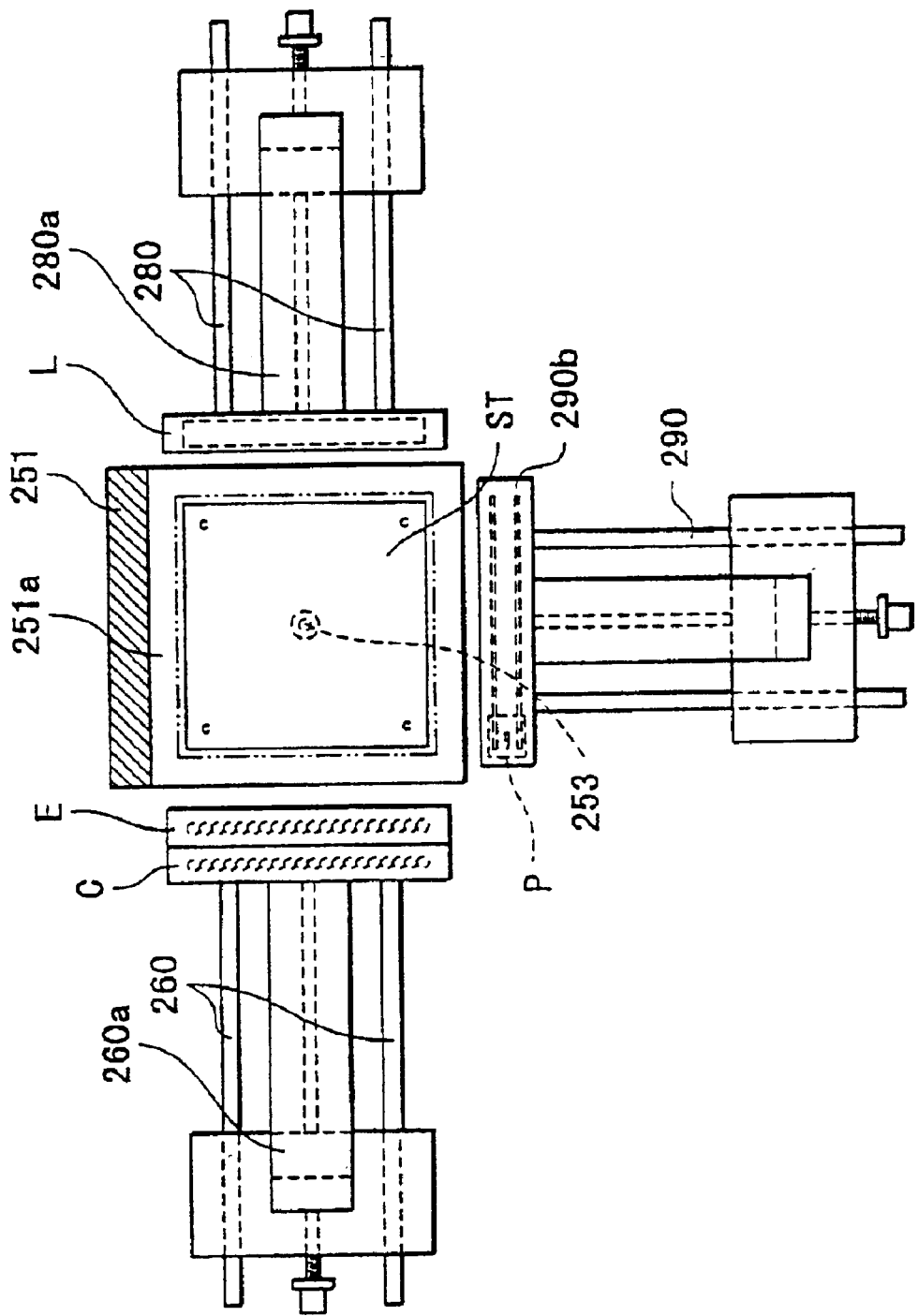
FIG. 45 is a schematic top plan view in section for showing a machine body in its cross section.
Figure 46:
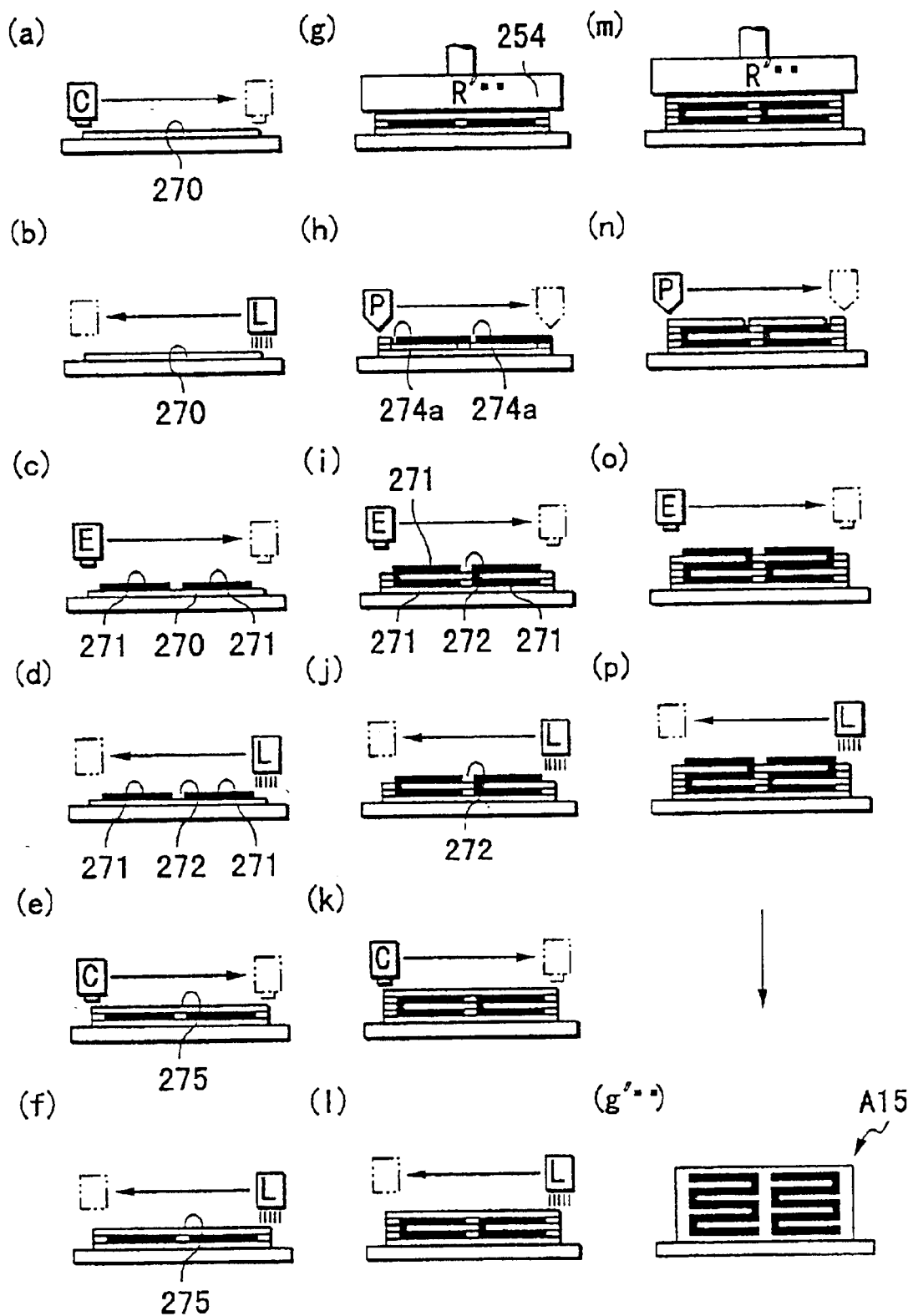
FIG. 46 is a schematic view for illustrating some works when the laminated member is manufactured in accordance with this preferred embodiment.
Figure 47:
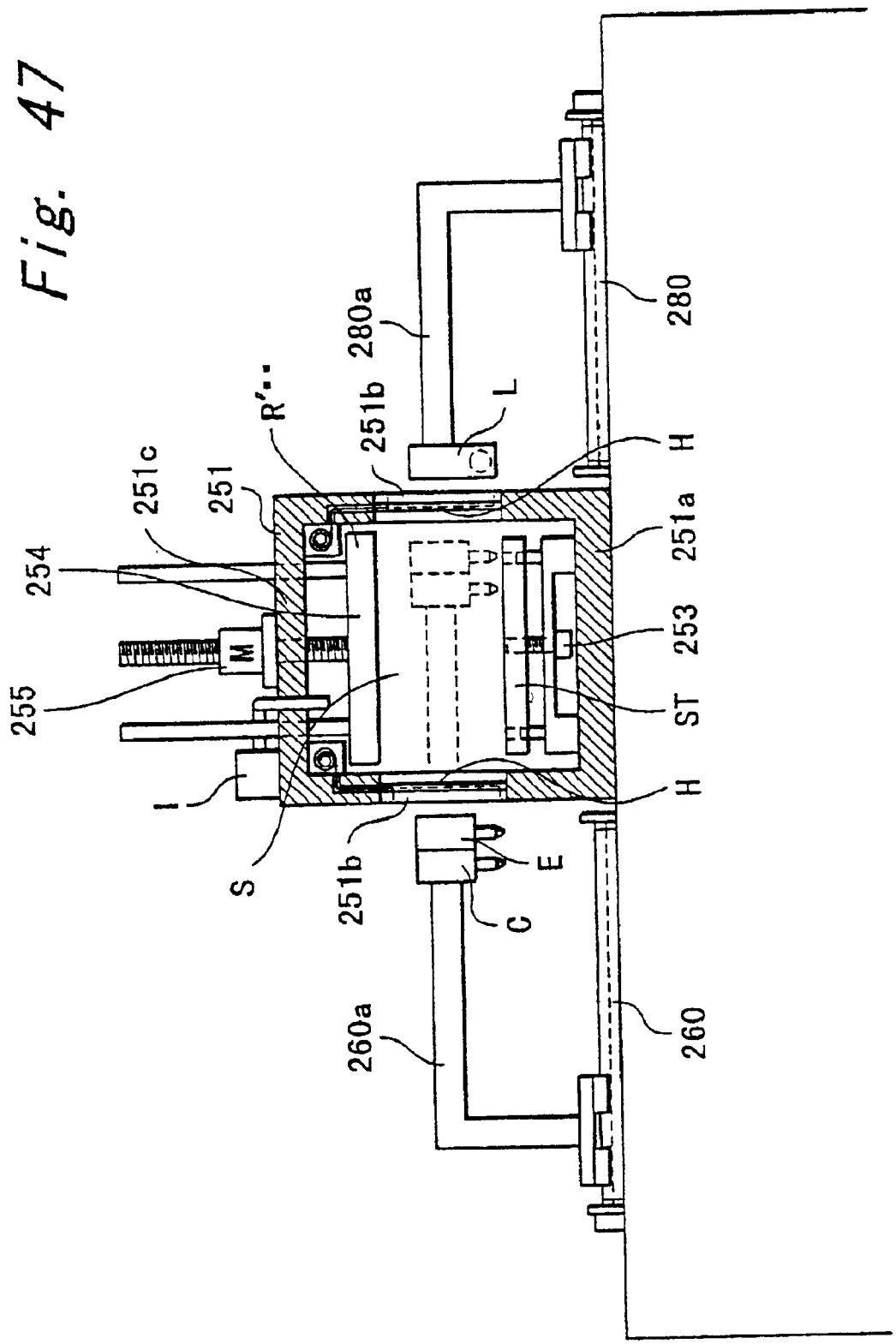
FIG. 47 is a schematic front elevational view in side elevation for showing an apparatus for manufacturing the laminated member in accordance with the fourth preferred embodiment.
Figure 48:
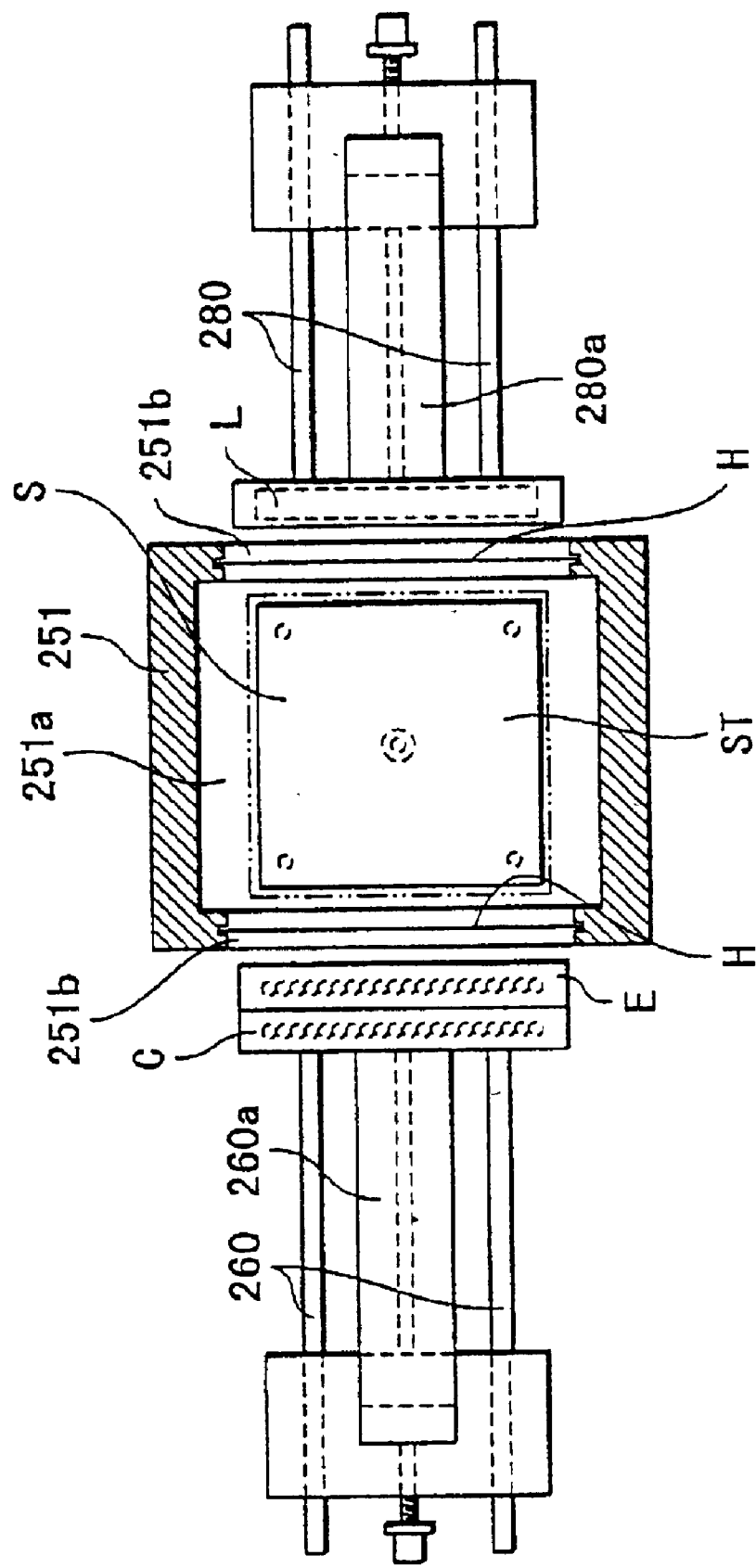
FIG. 48 is a schematic top plan view in section for showing a machine body in its cross section.
Figure 49:
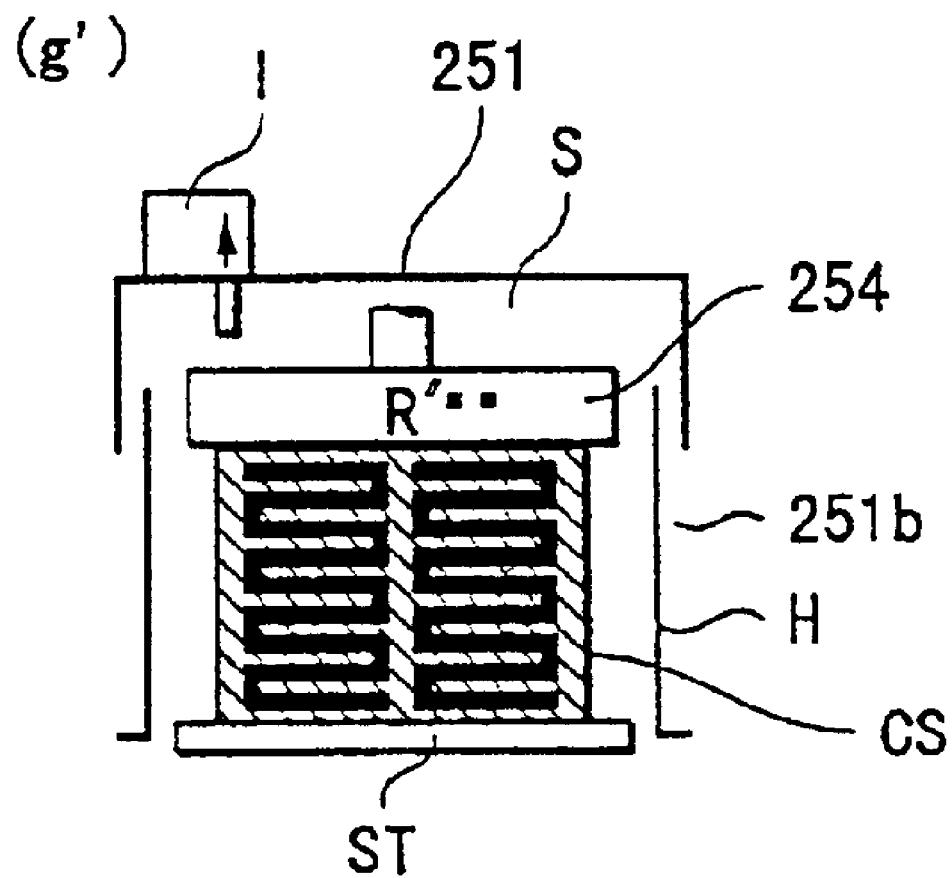
FIG. 49 is a schematic view for showing a state in which a main press contacting operation is performed.

Then, there is illustrated an apparatus for manufacturing a laminated member of a fourth invention, wherein FIGS. 40 to 42 illustrate a first preferred embodiment, FIG. 43 illustrates a second preferred embodiment, FIGS. 44 to 46 illustrate a third preferred embodiment, FIGS. 47 to 49 illustrate a fourth preferred embodiment, respectively.

At first, the first preferred embodiment shown in FIGS. 40 to 42 will be described.

As shown in FIGS. 40 and 41, this manufacturing apparatus is constructed such that a machine body 251 is mounted at the upper surface of a supporting table 250, and the insulating layer forming means C for discharging ceramics slurry and the conductive layer forming means E for injecting conductive paste are mounted at one of right and left positions (the position in the X-axis direction) while holding the machine body 251, and the drying means L for drying each of the slurry or conductive paste is mounted at the other position.

The machine body 251 is constructed such that the work stage ST is mounted on the lower plate 251*a* of the main body having a U-shape as shown in a side elevational view in such a way that it can be moved up and down (it can be controlled in motion in a Z-axis direction), the press contacting means R' is supported at the upper plate 251*c* of the main body in opposition to the work stage ST in such a way that it can be controlled in its moving-up or moving-down operation (it can be controlled in motion in a Z-axis direction), and a space between the upper surface of the work stage ST and the press contacting means R' is utilized as a laminating space S for the laminated member.

The work stage ST is constructed such that its moving-up or moving-down motion can be controlled by a ball screw mechanism having, as its driving source, motors which can be electrically controlled, such as a servo motor, pulse motor, stepping motor or the like communicated with the supporting member arranged below it and by a stage control mechanism 253 comprised of a guide segment or the like, the press contacting means R' is supported at the upper plate 251*c* of the main body by the press control mechanism 255 comprised of a ball screw mechanism having, as its driving source, a motor capable of similarly controlling the press plate 254 in an electrical manner, and of a guide segment or the like.

Each of the preferred embodiments is similar to each other in view of the fact that the insulating layer forming means C is constituted as a unit such that many ink jet nozzles are arranged side by side with a fine space being applied between them, it employs an ink jet system for injecting ceramics slurry through the selected nozzle, and in addition, the conductive layer forming means E is also constituted as a unit in which many ink jet nozzles are arranged side by side with a fine space being applied between them, and it employs an ink jet system for injecting paste through the nozzle selected by the cooperating control segments (not shown).

In this preferred embodiment, as shown in FIGS. 40 and 41, the insulating layer forming unit C and conductive layer forming unit E are arranged side by side in a rightward or leftward direction at a distal end of the supporting arm 260*a* constituted to be movable in controlled state in a rightward or leftward direction (an X-axis direction) in such a way that they are moved from a side part toward the machine body 251 by a motion control means 260 such as a ball screw mechanism having, as its driving source, motors which can be electrically controlled, such as a servo motor, pulse motor, stepping motor or the like and by a guide segment, and each of the units C, E is constituted in such a way that it can be loaded into or unloaded from a space S for the laminated layer, the insulating layer forming unit C is loaded into or unloaded from the space S for the laminated layer to inject ceramics slurry and form the insulating layer, and the conductive layer forming unit E is similarly loaded into or unloaded from the space S for the laminated layer to inject conductive paste onto the insulating layer and form the electrode layer.

As the drying means L, there is illustrated a case in the first preferred embodiment that it uses the drying unit L for drying either the ceramics slurry or conductive paste with hot blown air to such a semi-hardened state as one in which it may not be adhered. It is also applicable that the drying unit for drying either the ceramics slurry or conductive paste through optical radiation is used, and the drying unit is arranged at the distal end of a supporting arm 280*a* that can be controlled to move in a rightward or leftward direction (the X-axis direction) to move from the side toward the machine body 251 (toward or away from) by a control moving means 280 such as a ball screw mechanism having, as its driving source, electrical controllable motors such as the servo-motor, pulse motor and stepping motor or the like, and a guide segment or the like at an opposite side with the machine body 251 being held against the insulating layer forming means C and the conductive layer forming means E in the same manner as described above, and it can be loaded into or unloaded out of the space S for the laminated layer.

This drying means L advances into the space S for the laminated layer to dry the insulating layer and electrode layer to a semi-hardened state so as to be faced near each of the layers after the insulating layer forming unit C and the conductive layer forming unit E are retracted every time the insulating layer forming unit C advances into the space S for the laminated layer and injects ceramics slurry to form the insulating layer and every time the conductive layer forming unit similarly advances into the space S for the laminated layer and injects conductive paste to form the electrode layer.

In addition, the work stage ST is controlled to descend (the Z-axis direction) by a predetermined amount every time ceramics slurry is injected through the insulating layer forming unit C or conductive paste is injected through the conductive layer forming unit E, and the press contacting means R' temporarily presses with a predetermined light force by the press plate 254 against the upper surface of the thin film layer comprised of the semi-hardened insulating layer formed on the work stage ST and the electrode layer by descending the press plate 254 for every one layer or a plurality of layers, makes some fine corrugations generated at the upper surface of the thin film layer or slurry flat to attain a degree of flatness as well as a degree of horizontal state and further closely contacts the layers by themselves.

Subsequently, some work steps for manufacturing the laminated member by the manufacturing apparatus in the first preferred embodiment will be described, wherein FIG. 42 indicates a case in which a laminated member A13 for an inductor is manufactured.

FIG. 42(*a*):

The insulating layer forming unit C injects the ceramics slurry through each of the slurry injection nozzles onto a predetermined area of the work stage ST while it advances into a space S for the laminated layer to form an insulating layer 270 acting as a base at the work stage ST.

FIG. 42(*b*):

When the insulating layer forming unit C is retracted, the drying unit L advances into fine space S for the laminated member to cause the upper surface of the insulating layer 270 to be semi-hardened state not to be adhered.

FIG. 42(*c*):

When the drying unit L is retracted, the conductive layer forming unit E advances into a space S for the laminated layer, injects conductive paste through the desired selected paste injection nozzle onto the semi-hardened insulating layer 270 acting as its base to form the electrode layer 271 having a predetermined wiring pattern.

FIG. 42(*d*):

The drying unit L similarly advances to cause the electrode layer 271 to be semi-hardened state.

FIG. 42(*e*):

After the drying unit L is retracted, the insulating layer forming unit C injects the ceramics slurry through the selected slurry injection nozzle while advancing into the space S for laminated member to fill slurry in a notch fitting segment 272 left between the electrode layers 271, 271 and to form the spacer insulating layer 273.

FIG. 42(*f*):

The insulating layer forming unit C is retracted and the drying unit L advances again into the space S for the laminated layer to cause the spacer insulating layer 273 to be semi-hardened state.

FIG. 42(*g*):

After the drying unit L is retracted, the electrode forming unit E advances into the space S for the laminated member, discharges the conductive paste through the selected paste injection nozzle to form the bier electrode 274.

FIG. 42(*h*):

After the electrode forming unit E is retracted, the bier electrode 274 is semi-hardened at the drying unit L.

FIG. 42(*i*):

When the drying unit X is retracted, ceramics slurry is injected through each of the selected slurry injection nozzles in the insulating layer forming unit B advancing into the laminating space S except the distal end of the bier electrode 274 is injected to form an insulating layer 275.

FIG. 42(*j*):

When the insulating layer forming unit C is retracted, the insulating layer 275 is semi-dried by the drying unit L. Each of the above operations will be carried out in sequence.

Then, in FIG. 42(*k*), the thin film layer is temporarily press contacted by the press plate 254.

The operations shown in FIGS. 42(*c*) to (*k*) are repeated in sequence with these operations being applied as one cycle against the temporary press contacted laminated members so as to form the laminated member A13 for an inductor having some thin film layers temporarily press contacted up to a predetermined number of film layers as shown in FIG. 42(*r*). Further, in this FIG. 42, the operations indicated in FIGS. 42(*l*) to (*q*) corresponding to FIGS. 42(*c*) to (*h*) are described in a continuous manner and some steps corresponding to the work steps (i) to (k) are eliminated.

Further, in the first preferred embodiment, since an ink get system is employed in the insulating layer forming means C and conductive layer forming means E, it is possible that after the insulating layer 270 having a bier hole is formed at a previous step by the insulating layer forming means C, a step for filling the bier electrode into the bier hole is taken at the midway step to form the laminated member.

Subsequently, the second preferred embodiment will be described, wherein the second preferred embodiment relates to an apparatus for manufacturing the laminated member for a capacitor and a basic configuration of the manufacturing apparatus is similar to that of the first preferred embodiment, so that this will be described in reference to the manufacturing step shown in FIG. 43, wherein this manufacturing step is performed such that a temporary press contacting step performed by the press plate 254 is carried out for making a thin film layer comprised of the insulating layer 270 and electrode layer 271 as a post-work step (g) of the work steps in FIGS. 42(a) to (f). Then, operations shown in FIGS. 42(a) to (g) are repeated in sequence as one cycle of (h) to (n) to form a laminated member A14 for a capacitor having some thin film layers temporarily press contacted to each other up to a predetermined number of film layers as shown in the step (f')

Then, a third preferred embodiment shown in FIGS. 44 to 46 will be described as follows, wherein this preferred embodiment is an example in which the laser punching means P is mounted on the front supporting table 250 of the machine body 251, a bier hole is opened in the insulating layer by the laser punching means P and the bier electrode can be filled in the bier hole.

The laser punching means P is a device in which a long supporting arm 290b facing in a rightward or leftward direction (X-axis direction) is arranged at the distal end of a supporting arm 290a constituted by a motion controlling means 290 such as a ball screw mechanism and a guide or the like with an electrical controllable motor being applied as a driving source in such a way that its motion can be controlled in a Y-axis direction to move toward or away from the machine body 251 at its front side, the laser unit P having a laser head is supported at the supporting arm 290b in such a way that its motion can be controlled in an X-axis direction, the laser unit P is connected to a laser generator, the laser unit P is advanced from a front releasing segment of the machine body 251 into the space S for the laminated member under combination of a controlling motion of the motion control means 290 in the Y-axis direction and a controlling motion of the laser unit P in the X-axis direction in respect to the supporting arm 290b, a laser beam is radiated from the laser head to punch at a desired position in the insulating layer.

Then, some work steps for manufacturing the laminated member for an inductor by the manufacturing apparatus shown in FIG. 46 will be described.

Although the work steps shown in FIGS. 46(a) to (d) are the same as those of the first preferred embodiment, as the work step shown in FIG. 46(e), a step for filling slurry in a notch fitting segment 272 left in the electrode layer 271 and for forming an insulating layer 275 over an entire region above the filled slurry is carried out, a drying step in FIG. 46(f) is performed and a temporary press contacting step shown in FIG. 46(g) with a press plate 254 for the thin film layer comprised of the insulating layer and electrode layer is performed. Then, as the work step shown in FIG. 46(h), the laser punching means P is controlled to punch a hole of the bier hole 274a at a desired position in an upper layer of insulating layer 270 by applying a laser work, and as the work step shown in FIG. 46(i), the bier electrode 274 is formed by filling conductive paste into the bier hole 274a and the bier electrode 271 is formed by injecting conductive paste under a predetermined wiring pattern and the electrode layer 271 is dried, FIG. 46(j). Then, a work step shown in FIG. 46(k) in which slurry is filled again in the notch fitting segment 272 left at the electrode layer 271 and the insulating layer 275 is formed over an entire area above it is carried out, the drying step shown in FIG. 46(l) is carried out and the temporary press contacting step is performed at a work step shown in FIG. 46(m).

Subsequently, the work steps shown in FIGS. 46(h) to (m) are applied as one cycle and repeated in sequence to form the laminated member A15 for an inductor having some thin film layers temporarily press contacted up to their predetermined number as shown in FIG. 46(g'). In FIG. 46, the work steps (n) to (p) corresponding to the work steps (h) to (j) are described in sequence and the work steps corresponding to the work steps (k) to (m) are eliminated.

A fourth preferred embodiment shown in FIGS. 47 to 49 will be described as follows. This preferred embodiment illustrates an apparatus for manufacturing a laminated member in which not only a temporary press contacting, but also a main press contacting is carried out within the machine body 251.

Configurations of this preferred embodiment different from those of the first to third preferred embodiments consist in an arrangement in which the machine body 251 shows a box-like shape having an inner hollow shape, an arrangement in which the insulating layer forming means C, drying means L and conductive layer forming means E can be loaded into or unloaded from releasing segments 251b, 251b formed at the opposing sides of the machine body 251, and an arrangement in which there are provided a shielding means H for closing the two releasing segments 251b, 251b to cause the space S for laminated member on the work stage ST not to be communicated with surrounding atmosphere and a vacuum means I for making vacuum atmosphere in the space S for laminated member.

In this figure, this indicates a manufacturing apparatus not using any laser punching means, wherein either a window segment or a shutter which can be slid in an upward or downward direction is arranged at the releasing segments 251b, 251b opposed to each other at the machine body 251 Lo constitute the shielding means H the releasing segments 251b, 251b are closed by the shielding means H and the releasing segments 251b, 251b are closed by the shielding means H to enable the inside part of the space S for laminated member not to be communicated with surrounding atmosphere.

The vacuum means I is constructed such that a discharging device (a multi-blade fan and an axial fan) for use in discharging air in the space S for laminated member is mounted on the upper plate 251c of the machine body 251. In addition, in this preferred embodiment, the press contacting means R' used for performing a temporary press fitting operation is also acted as a press contacting means at the time of main press contacting operation.

In the case of the manufacturing apparatus shown in the third preferred embodiment provided with the laser punching means, it is preferable that the apparatus is of three-sides released type having a releasing segment also at the front side of the machine body 251, the releasing segment is also provided with either a window or a shutter which can be slid in an upward or downward direction to constitute the shielding means H.

Then, in this preferred embodiment, each of the releasing segments 251b . . . is released at the time of forming the insulating layer and at the time of forming the electrode layer, the insulating layer forming means C, drying means L, conductive layer forming means E and laser punching means P as required are loaded into or unloaded from the space S for laminated member through the releasing segments 251b . . . , and each of these means C, L, E and P performs a temporary press contacting operation every time the desired number of thin films are formed during the manufacturing process where they return to a mechanical position of origin (a retracted position).

After they are temporarily press contacted up to their predetermined number of thin film layers, each of the releasing segments 251*b* . . . is closed by the shielding means H, the space S for laminated member is not communicated with the surrounding atmosphere, air in the space S for laminated member and the laminated member CS is pressed with a stronger predetermined pressure than that applied at the time of temporary press contacting while discharging air in the space S for laminated member with the vacuum means I to perform a main press contacting operation (g') (refer to FIG. 49).

The insulating layer forming means C, drying means L, conductive layer Forming means E and laser punching means P as required can be loaded into or unloaded from the space S for laminated member through the releasing segments 251*b* . . . of the machine body 251 communicated with one space S for laminated member and released at two to four sides as described above, and at the same time the releasing segments 251*b* . . . can be closed by either a window or a shutter or the like, there is provided a vacuum means I making a vacuum of the space S for laminated member, thereby these means C, L, E and P are collected around the machine body in a compact layout, although it is possible to provide an apparatus for manufacturing the laminated member while executing the operation starting from the temporary press contacting operation to the main press contacting operation.

Then, a fifth invention will be described, wherein the fifth invention uses an insulating sheet and an electrode is formed on the insulating sheet.

Figure 50:
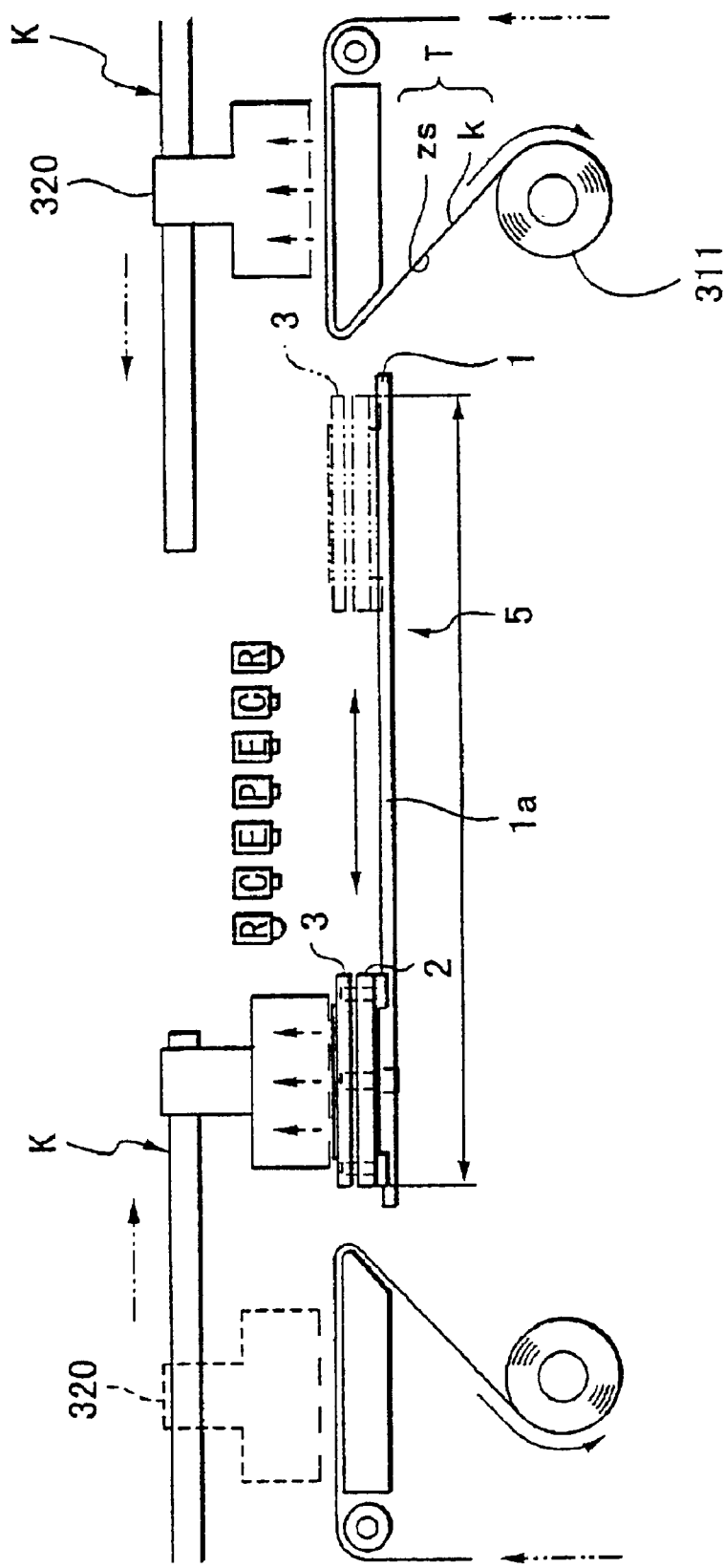
FIG. 50 is a schematic front elevational view for showing an apparatus for manufacturing the laminated member in accordance with a fifth invention.

A schematic arrangement of the manufacturing apparatus of the fifth invention will be described in reference to FIG. 50, wherein the apparatus for manufacturing the laminated member is similar to that of the preferred embodiment of the first invention in view of the fact that it is arranged within a machine frame not shown, the movable table 2 is arranged at the guide rail 1 installed in a linear horizontal state in such a way that it can be reciprocated, a stainless steel base plate 3 which can be moved up and down is arranged at the upper surface of the movable table 2 to constitute the work table 5, and a segment path 1*a* having the base plate 3 reciprocated is formed by the guide rail 1.

The segment path 1*a* is a linear path having approximately the same width as that of the base plate 3, wherein an ink jet nozzle acting as the insulating layer forming means C and an ink jet nozzle acting as the conductive layer forming means E are arranged side by side above the path, further a press roll acting as the pressing means R, or a laser punching unit acting as the laser punching means P is properly added and they are arranged side by side, and a length of the segment path is about 1.5 to 2 m. An insulating sheet laminating means K is arranged at each of both sides of the segment path 1*a*.

The movable table 2 reciprocates in a longitudinal direction (X direction) of the segment path by the driving source of a usual type servo-motor or pulse motor and a screw shaft rotated by the driving source to cause the base plate 3 to be moved along the segment path and its moving direction and speed are controlled by a controller.

The base plate 3 is also moved up and down by the driving source of the servo motor or pulse motor and the screw shaft rotated by the driving source, and its moving-up or moving-down operation is controlled by a controller in such a way that the base plate descends in sequence in response to the laminating step.

The ink jet nozzles acting as the insulating layer forming means C and conductive layer forming means E are made such that many nozzles are arranged side by side with a fine clearance in a direction crossing the segment path, and the pressing means R is also extended in a direction crossing the segment path.

Figure 55:
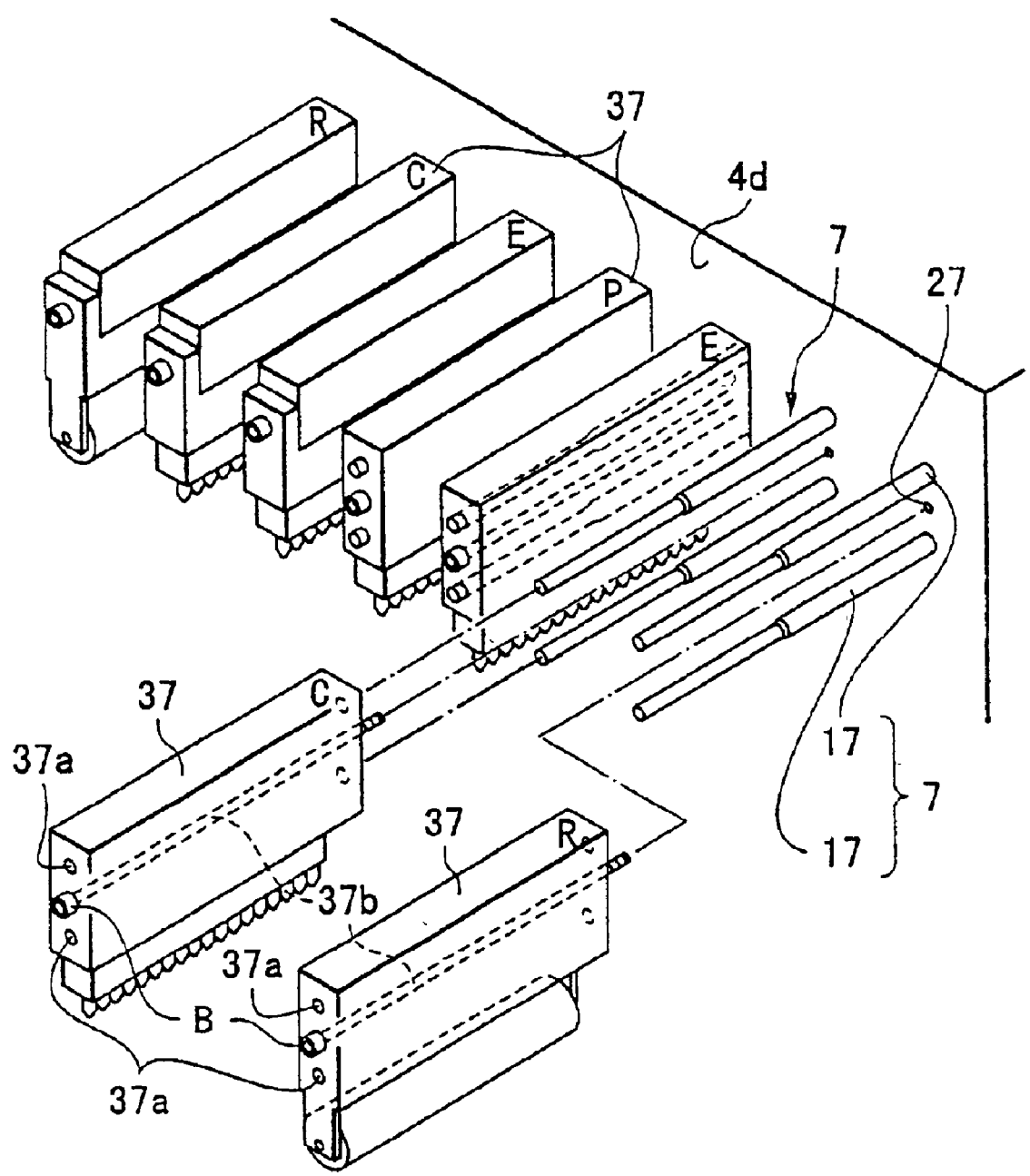
FIG. 55 is a perspective view for showing one example of a configuration in which each of an insulating layer forming unit, an conductive layer forming unit and a pressing unit is removably attached in respect to a supporting wall.
Figure 56:
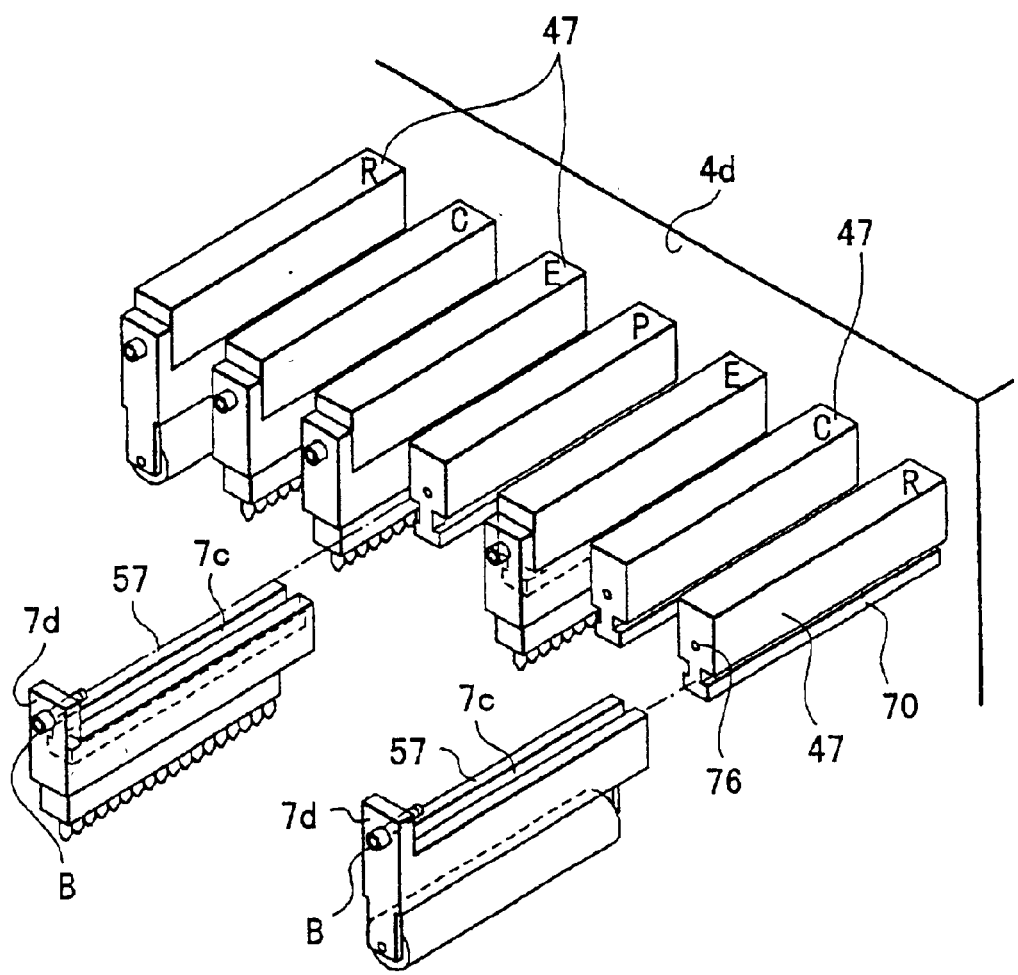
FIG. 56 is a perspective view for showing another example of a configuration in which each of an insulating layer forming unit, an conductive layer forming unit and a pressing unit is removably attached in respect to a supporting wall.

Further, it is preferable that the insulating layer forming means C, conductive layer forming means E, pressing means R and laser punching means P are made into a unit, they can be fixed or removed at a proper time as required and their mounting positions can be adjusted, and as shown in FIGS. 55 and 56, for example, the fact that the supporting wall 4*d* is arranged at a location in the work table 5 acting as its back surface and each of one or a plurality of unified insulating layer forming means C, conductive layer forming means E, pressing means R and laser punching means P are removably attached to the supporting wall 4*d* is the same as that of the second invention, so that similar reference symbols are applied to them and their description will be eliminated.

Figure 54:
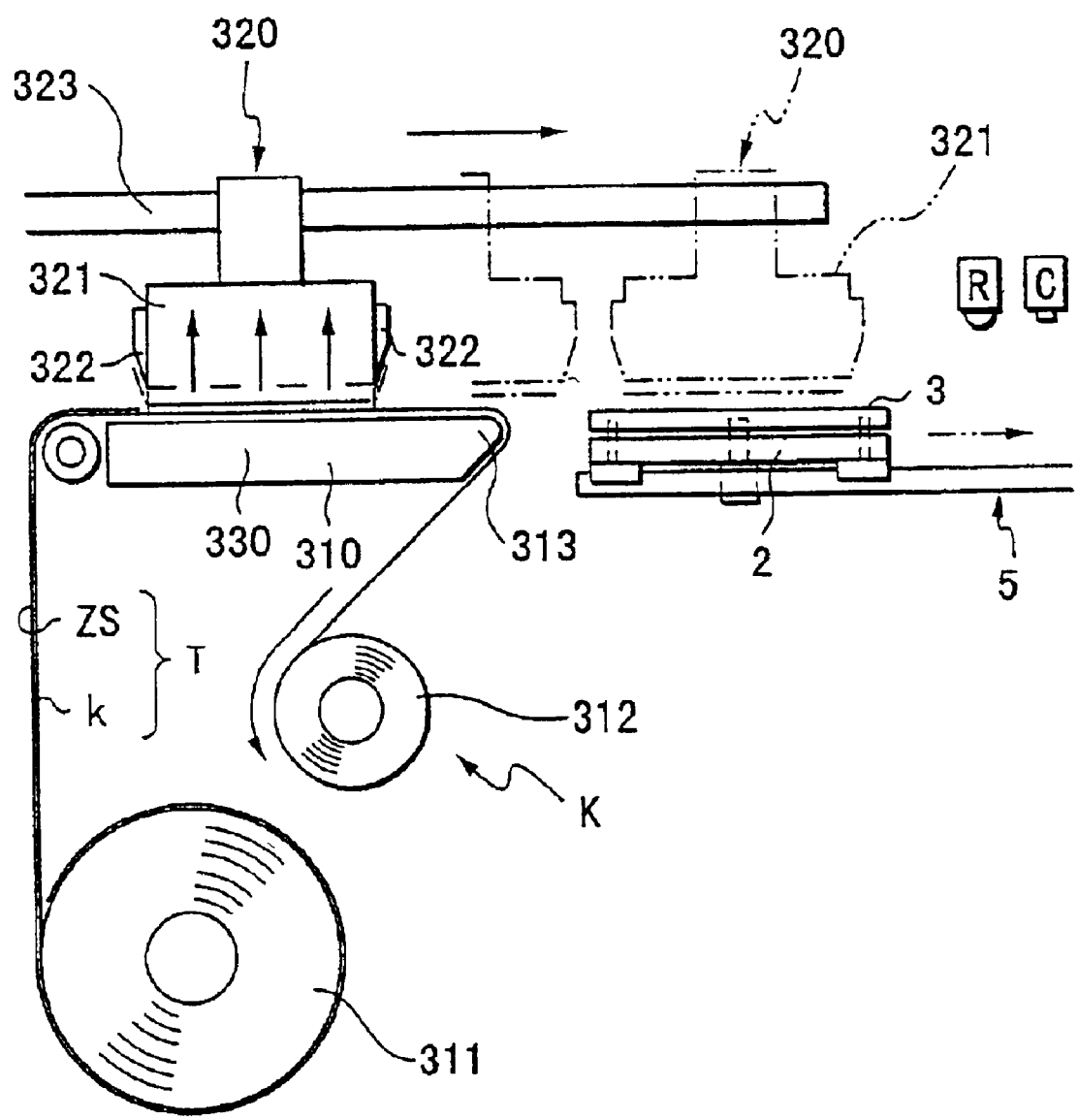
FIG. 54 is an enlarged view for showing an insulating sheet laminating means.

As shown in detail in FIG. 54, the insulating sheet laminating means K is comprised of a feeding-out mechanism 310 for feeding out a tape-like item T having an insulating sheet ZS adhered thereto, and a sucking transferring mechanism 320 for sucking the insulating sheet ZS peeled from the tape-like item T and transferring it onto the base plate 3.

The tape-like item T is made such that the insulating sheet ZS acting as a thin plate-like ceramics green sheet is adhered to the surface of a tape-like carrier film (k) comprised of synthetic resin film such as polyethylene terephthalate or the like.

The feeding-out mechanism 310 is constructed such that the tape-like item T fed out of a feeding-out roller 311 is wound up by a taking-up roller 312, a peeling mechanism 330 having an acute angle segment 313 at a downstream end (an end part in a feeding direction) is arranged at a midway part between the feeding-out segment and the taking-up segment in such a way that it is slidably contacted with the tape-like item T facing against the carrier film (k) and then the tape-like item T to be transferred is bent at an acute angle.

Then, in accordance with this feeding-out mechanism 310, the tape-like item T is bent in an acute angle by the acute angle segment 313 and the insulating sheet ZS adhered to the surface is peeled.

The sucking transferring mechanism 320 is made such that a sucking part 321 for sucking or releasing the insulating sheet ZS by the vacuum mechanism is installed in such a way that it can be ascended or descended in a vertical direction and it can be moved in a horizontal direction along the guide rail 323, a downward directed cutting blade 322 is installed at a side surface of the sucking part 321, the insulating sheet ZS peeled from the tape-like item T by the feeding-out mechanism 310 and cut into a predetermined shape by the cutting blade 322 is sucked, transferred and overlapped at a predetermined position on the base plate 3.

Further, although one example of the insulating sheet laminating means K constructed to cause the tape-like insulating sheet ZS to be cut and overlapped is shown, it is also applicable that the insulating sheet ZS formed into a predetermined shape in advance is overlapped on the base plate 3.

Thus, in accordance with the manufacturing apparatus above, each of the steps of an insulating sheet laminating step for overlapping the insulating sheet ZS (refer to FIGS.

Figure 52:
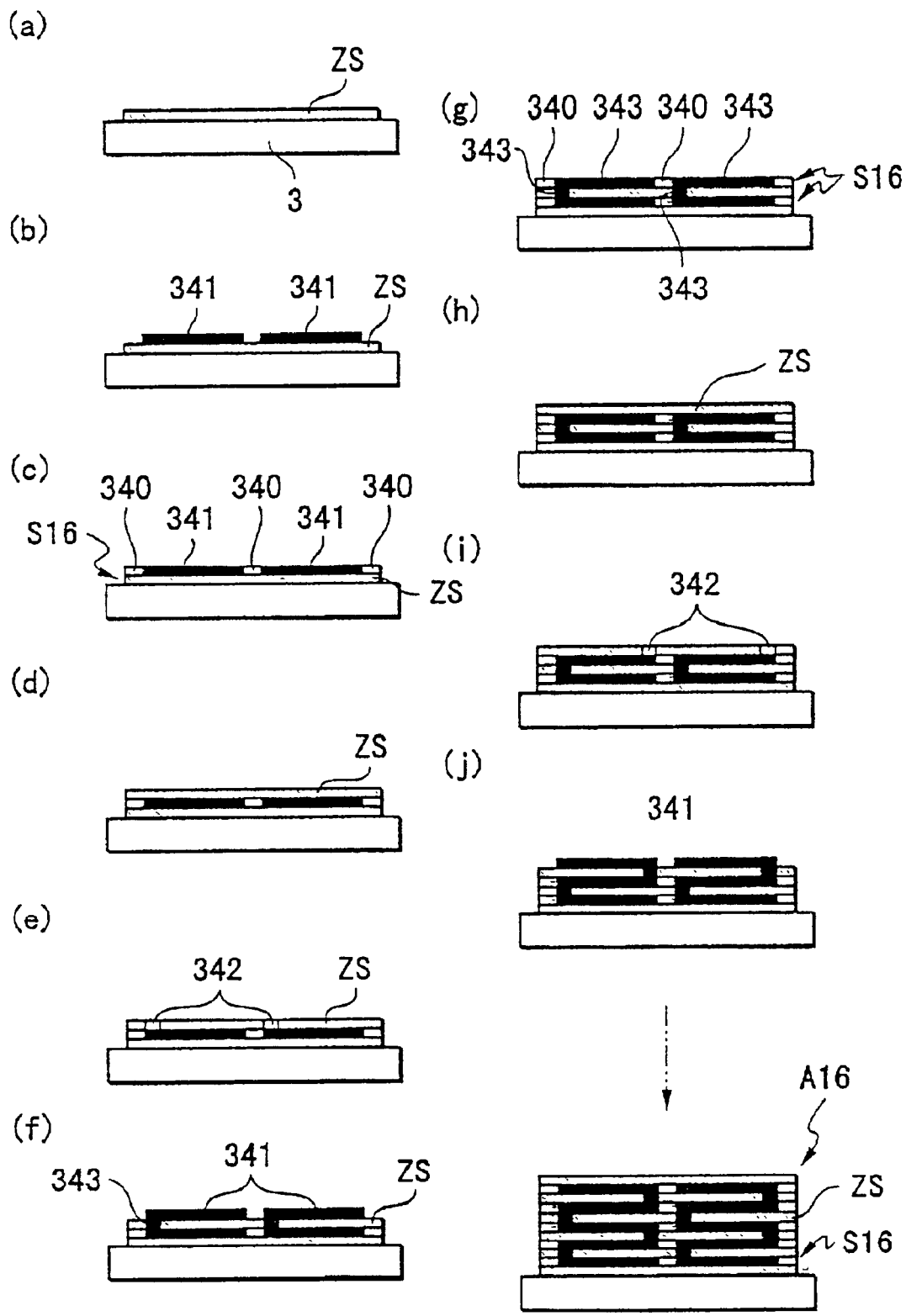
FIG. 52 is a sectional view for showing in more detail some manufacturing steps for the laminated member.

52(*a*), (*d*) and (*h*)), a conductive layer forming step for injecting conductive paste on the insulating sheet ZS (refer to FIGS. 52(*b*), (*f*) and (*j*)) and an insulating layer forming step for discharging ceramics slurry for a spacer on the insulating sheet ZS (refer to FIGS. 52(*c*), (*g*)) is repeated to form the laminated member A16 having a thin film layer with a predetermined electrode-pattern arranged therein between each of a plurality of insulating sheets ZS.

The manufacturing steps will be described in detail as follows in reference to one example in the case that the laminated member for an inductor is manufactured.

Figure 51:
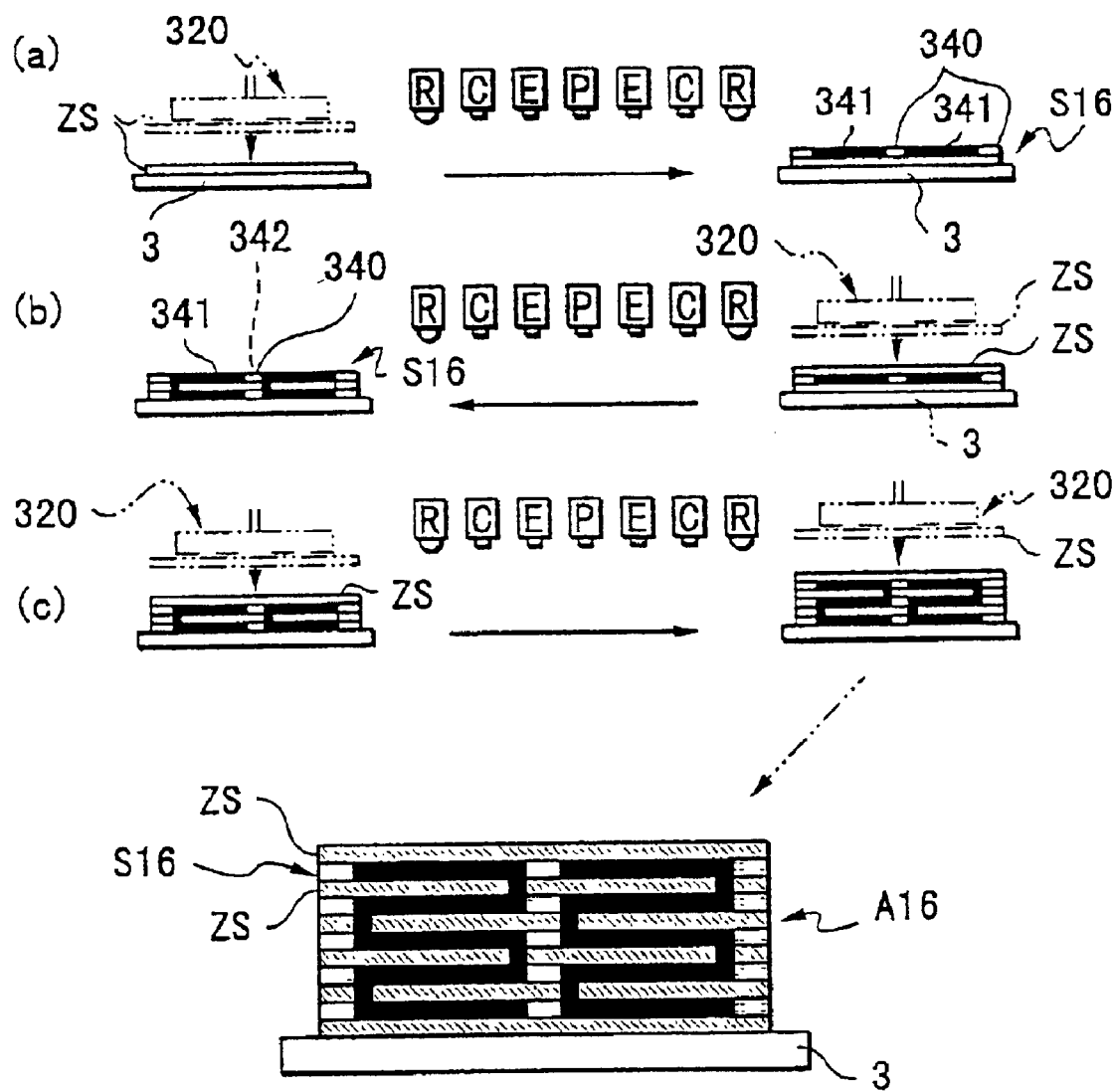
FIG. 51 is a sectional view for showing some manufacturing steps for the laminated member manufactured by the manufacturing apparatus.

The insulating sheet ZS is placed on the base plate 3 by the sucking and transferring mechanism 320 in the left side insulating sheet laminating means K (refer to FIG. 51(*a*) and FIG. 52(*a*)).

Subsequently, when the base plate 3 is moved from the left end to the right end, conductive paste is injected from the ink jet nozzle of the right conductive layer forming means E (refer to FIG. 51(*a*)), an electrode layer 341 having a predetermined area is formed on the insulating sheet ZS (refer to FIG. 52(*b*)) and then ceramics slurry is injected through the ink jet nozzle of the insulating layer forming means C (refer to FIG. 51(*a*)), an insulating layer 340 is formed between the electrode layers 341 on the insulating sheet ZS and at the adjoining part of the electrode layer 341 and then a thin film layer S16 comprised of the electrode layer 341 and the insulating layer 340 is formed (refer to FIG. 52(*c*)).

Then, the insulating sheet ZS is laminated on the upper surfaces of the electrode layer 341 and insulating layer 340 by the right sucking and transferring mechanism 320 (refer to FIG. 51(*b*) and FIG. 52(*d*)).

Further, when the base plate 3 is moved from the right end to the left end, the insulating sheet ZS at the uppermost layer is press contacted against the electrode layer 341 below it and the insulating layer 340 prefer to FIG. 51(*b*)), a bier hole 342 is punched at a predetermined position in the insulating sheet ZS of the upper-most layer during motion of the base plate 3, conductive paste is injected from the ink jet nozzle of the left conductive layer forming means E (refer to FIG. 51(*b*)) during motion of the base plate 3, the bier hole 342 is filled with electrode paste to form a bier electrode 343 and the electrode layer 341 having a predetermined area is formed on the insulating sheet ZS (refer to FIG. 52(*f*)), and then ceramics slurry is injected through the ink jet nozzle of the left side insulating layer forming means C (refer to FIG. 51(*b*)), the insulating layer 340 is formed between the electrode layers 341 on the insulating sheet ZS and the adjoining part of the electrode layer 341 to form a thin film layer S16 comprised of the electrode layer 341 and the insulating layer 340 (refer to FIG. 52(*g*)).

After this operation, a step in which the insulating sheet ZS is laminated on the upper surfaces of the electrode layer 341 and insulating layer 340 by the sucking and transferring mechanism 320 and a step in which the pressing means R, laser punching means P, conductive layer forming means E and insulating layer forming means C are operated in sequence are repeated (FIG. 51(*c*) and FIGS. 52(*h*) to (*j*)) and the laminated member A16 for an inductor is constituted on the base plate 3.

Figure 53:
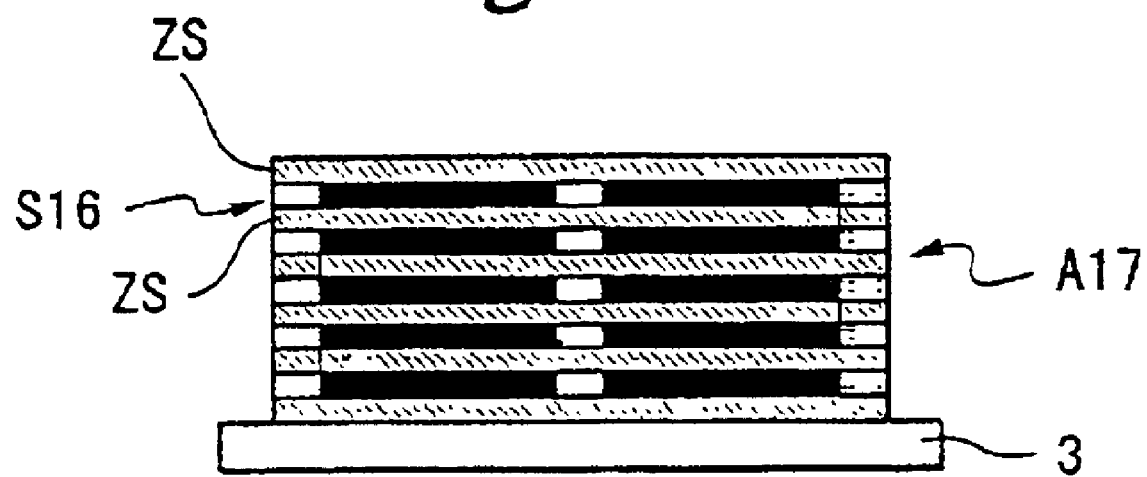
FIG. 53 is a sectional view for showing another example of the laminated member manufactured by the manufacturing apparatus.

Further, as the step above, although the step for manufacturing the laminated member for an inductor has been illustrated, it is also possible to manufacture a laminated member A17 for a capacitor illustrated in FIG. 53.

Although the step in this case is not described in detail, this step becomes a step in which the operation performed by the laser punching means P in the aforesaid step is eliminated.

Then, the apparatus for manufacturing the laminated member of a sixth invention shown in FIG. 57 will be described.

Figure 57:
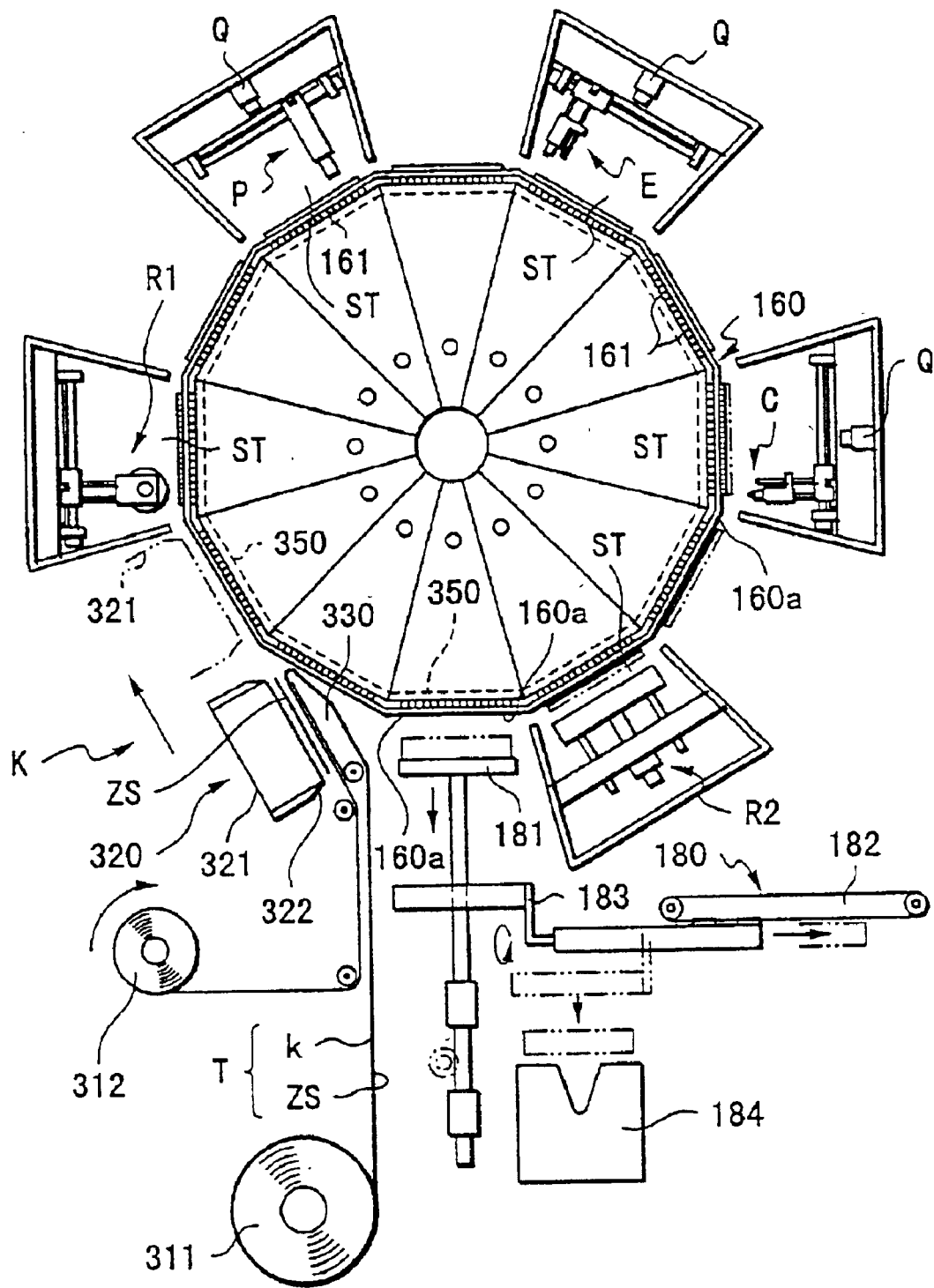
FIG. 57 is a front elevational view for showing an apparatus for manufacturing the laminated member in accordance with the sixth invention.

FIG. 57 illustrates a summary of the manufacturing apparatus, wherein the rotary drum 160 is rotatably attached to a vertical supporting wall not shown, the insulating sheet laminating means K for overlapping the insulating sheet ZS on the work surface 160*a* of the drum substantially in the same manner as that of she insulating sheet laminating means K in the manufacturing apparatus in the fifth invention is arranged near the lower one side of the rotary drum 160, and the laminated member recovering mechanism 180 for recovering the manufactured laminated member is arranged just below the rotary drum 160.

In addition, although not shown, the manufacturing apparatus is provided with a motor for driving the rotary drum 160, its deceleration control segment, a slurry tank for storing ceramics slurry, a paste tank for storing conductive paste, a vacuum mechanism for sucking inside the rotary drum 160 in vacuum, a control box and a wired equipment or the like.

The rotary drum 160 is a metallic stainless steel polygonal-shaped drum similar to that of the third invention (dodecagonal shape in the figure), wherein a flat work surface 160*a* is defined at its outer circumferential surface in a continuous manner and suction holes 161 . . . for generating sucking action with vacuum are opened at each of the work surfaces 160*a*.

The sucking holes 161 are arranged at a rear surface of the work surface 160*a* and released by a slide shutter 350 driven to slide when the insulating sheet ZS is sucked, and closed when the insulating sheet ZS is removed.

This rotary drum 110 is set to be rotated continuously or intermittently, the insulating sheet ZS supplied from the sucking and transferring mechanism 320 of the insulating sheet laminating means K is sucked against the work surface 110*a* opposing against the sucking part 321 of the sucking and transporting mechanism 320 during stopped state of rotation.

Although the insulating sheet laminating means K is not described in detail because it has the same configuration as that of the insulating sheet laminating means of the manufacturing apparatus of the fifth invention, the tape-like item T comprised of the insulating sheet ZS and the carrier film (k) is fed of the roller 311 and wound onto the taking-up roller 312, the insulating sheet ZS is peeled from the tape-like item T by the peeling mechanism 330 in the midway part of a path between the feeding-out and the taking-up and at the same time the insulating sheet is cut to a predetermined shape by the cutting blade 322, the cut insulating sheet ZS is sucked by the sucking part 321, transferred up to the position opposing against she work surface 160*a* and then it can be overlapped on the work surface 160*a*.

In addition, the rotary drum 160 is made such that there is arranged either the work stage or a preliminary stage for applying each of the works in opposition to each of the work surfaces 160*a* under a stopped state during its intermittent rotation, a first pressing means R1, laser punching means P, conductive layer forming means E, insulating layer forming means C and a second pressing means R2 or the like are arranged properly at each of these work stages ST in a clockwise direction, and further each of the laser punching means P, conductive layer forming means E and insulating layer forming means C is provided with the CCD camera unit Q as required.

Each of the first pressing means R1, laser punching means P; conductive layer forming means E and insulating layer forming means C can be moved on the wok surface 160a in an X-axis direction (a circumferential direction of the rotary drum 160) and a Y-axis direction (a width direction of the rotary drum 160), its moving amount is controlled and at the same time, it is-movably arranged in a Z-axis direction (a direction moving toward or away from it) where it is moved up and down at a right angle over the work surface 160a, and its moving amount is controlled.

In addition, as the second pressing means R2, the press plate moved up and down in a Z-axis direction over the work surface 160a is illustrated, the laminated member laminated on the work surface 160a is pressed at a final stage through descending operation of the press plate, a close fitness among the insulating sheet, electrode layer and insulating layer is increased to cause each of the layers to be unified.

In addition, the CCD camera unit Q is a CCD camera in which it takes a photograph of a reference mark on the insulating sheet, transmits it to the image processing device, thereby the laser punching means P, conductive layer forming means E, and insulating layer forming means C are controlled in their positions in an X-axis direction and Y-axis direction so as to perform a positional alignment or find out a pin hole in the insulating layer or a broken line in the electrode layer or the like.

In addition, the laminated member recovering mechanism 180 receives the laminated member by the recovering table 181 at the final stage where the laminated member is formed on the work surface 160a through a predetermined number of rotation of the rotary drum 160, and stores it in the recovering magazine 184 with the recovering arm 183 (refer to FIG. 31).

Further, the laminated member is released from the sucking force produced by the vacuum in the rotary drum 160 while the sucking hole 161 of the work surface 160a is closed by the slide shutter 350 at the rear surface side of the work surface 160a opposing against the recovering table 181 when the laminated member is received by the laminated member recovering mechanism 180.

Thus, in accordance with the manufacturing apparatus above, the insulating sheet laminating means K, first pressing means R1, laser punching means P, conductive layer forming means E, insulating layer forming means C, second pressing means R2 and laminated member recovering mechanism 180 opposing against each of the work surfaces 160a are operated at the proper time when the rotating drum 160 intermittently rotated in a clockwise direction is stopped, resulting in that the laminated member is manufactured.

Although the operating order of each of the means and operating mechanisms is not described in detail, for example, if the laminated member for an inductor is manufactured, each of the means and mechanisms above opposing against each of the work surfaces 160a is operated under the stopped state at an intermittent rotation time of the rotary drum 160 in such a way that it becomes a laminating order shown in FIG. 52 described above, resulting in that the laminated member for an inductor is manufactured.

In addition, although a preferred embodiment provided with the pressing means comprised of the first pressing means R1 and the second pressing means R2 has been illustrated as the manufacturing apparatus, it is also possible that there is provided a configuration saving any one of the pressing means and non-saved one pressing means presses over the insulating sheet every time the insulating sheet is laminated or after the final insulating sheet is laminated.

Figure 58:
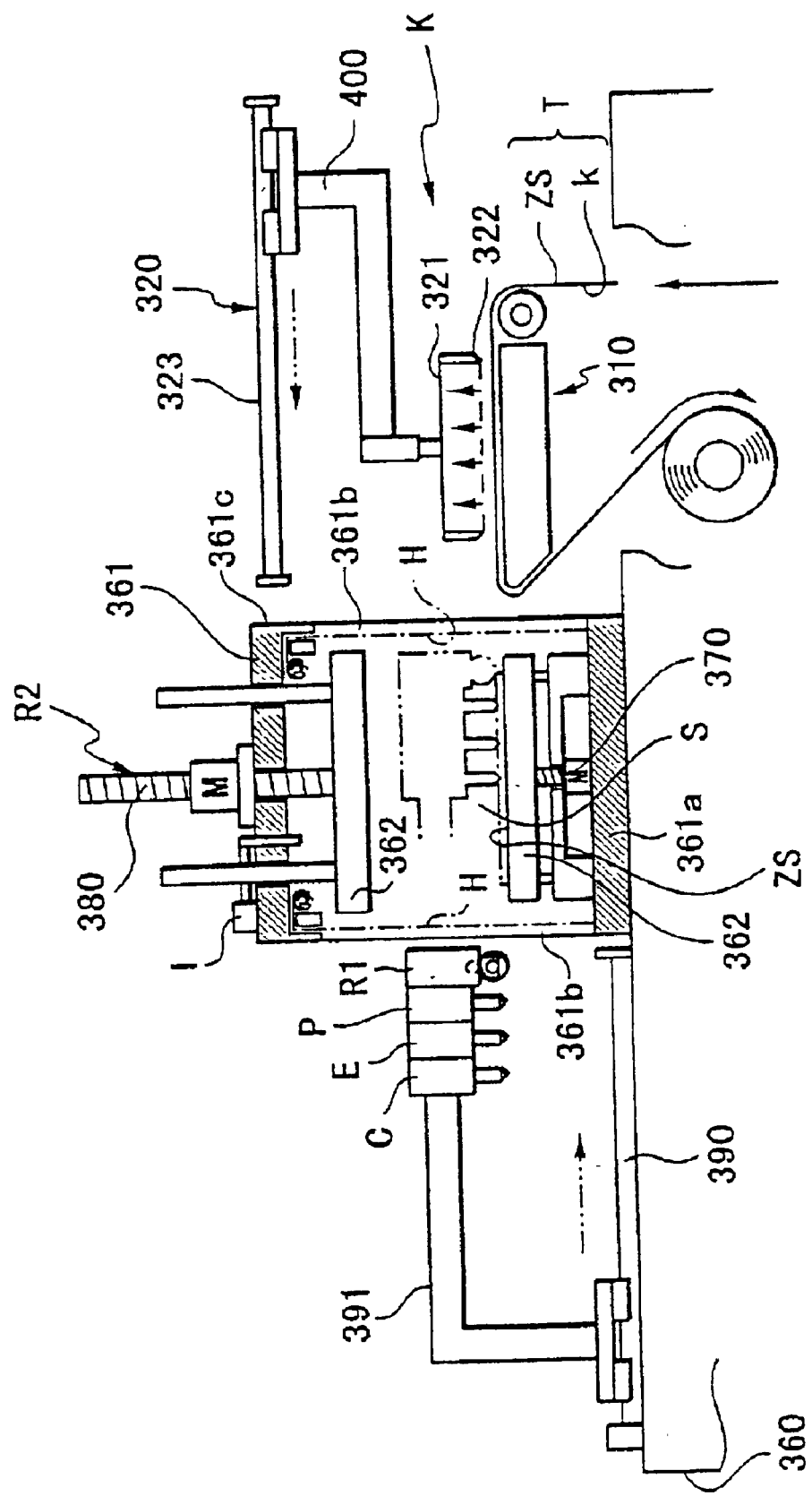
FIG. 58 is a front elevational view for showing an apparatus for manufacturing the laminated member in accordance with a seventh invention.

Then, referring to FIG. 58, an apparatus for manufacturing a laminated member of a seventh invention will be described.

This manufacturing apparatus is constructed such that the machine body 361 is mounted on the upper surface of the supporting table 360, the insulating layer forming means C for discharging ceramics slurry, conductive layer forming means E for injecting conductive paste, laser punching means P for punching a bier hole on the insulating sheet ZS and the first pressing means R1 for pressing the upper surface of the insulating sheet ZS with a roller are mounted at one of right and left positions (the position in the X-axis direction) while holding the machine body 361 and the insulating sheet laminating means K is mounted at the other position.

The machine body 361 is constructed such that a base plate 362 is arranged on a lower plate 361a at a box-like main body having openings 361b, 361b formed at opposing two side surfaces in such a way that it can be moved up and down (its motion can be controlled in a Z-axis direction), the second pressing means R2 opposing against the base plate 362 is supported at an upper plate 361c of the main body in such a way that its moving-up and moving-down motions can be controlled (its motion can be controlled in a Z-axis direction), and a space between the upper surface of the base plate 362 and the second pressing means R2 is utilized as a space S for lamination of the laminated member.

Further, the machine body 361 is constructed such that shielding means H, H for opening or closing the openings 361b, 361b with a slidable window or shutter are arranged at each of the lower surfaces at both ends of the upper plate 361c, and on the upper surface of the machine body 361 is mounted the vacuum means I for changing a space S for laminated member when it is made non-communicated with the surrounding atmosphere by both shielding means H, H into a vacuum atmosphere.

The base plate 362 is constituted such that its moving-up and moving-down motions can be controlled by a stage controlling mechanism 370 comprised of a ball screw mechanism with some electric controllable motors such as a servo-motor and a stepping motor communicated with the supporting member arranged below the base plate being applied as driving sources and a guide segment, the second pressing means R2 in this preferred embodiment is constructed such that the press place is supported at the upper plate 361c of the main body in such a way that its moving-up and moving-down motions can be similarly controlled by a press controlling mechanism 380 comprised of a ball screw mechanism with an electric controllable motor being applied as a driving source and a guide segment or the like.

Each of the insulating layer forming means C, conductive layer forming means E, laser punching means P and a first pressing means R1 is arranged side by side at a distal end of the supporting arm 391 in a horizontal direction, and at the same time the supporting arm 391 is moved (toward or away from) from the side part to the machine body 361 by a motion control means 390 such as a ball screw mechanism with some electric controllable motors such as a servo motor and a stepping motor or the like being applied a driving source, a guide segment and the like.

The insulating sheet laminating means K is comprised of a feeding-out mechanism 310 for peeling the insulating sheet ZS from the tape-like item T fed out by the same structure as that of the insulating sheet laminating means K of the manufacturing apparatus described above, cutting it and feeding it out, and a sucking and transferring mechanism 320 for sucking the insulating sheet ZS peeled from the tape-like item T and transferring it onto the base plate 362.

The sucking and transferring mechanism 320 is constructed such that the sucking part 321 for sucking or removing the insulating sheet ZS by a vacuum mechanism is arranged at the distal end of the supporting arm 400 in such a way that it can be ascended or descended in an upward or downward direction, the rear end of the supporting arm 400 is arranged such that it can be moved in a horizontal direction along the guide rail 323 fixed to a supporting wall not shown, the downward-directed cutting blade 322 is arranged at a side surface of the sucking part 321, the insulating sheet ZS peeled, cut and fed out by the feeding-out mechanism 310 can be sucked, transferred and overlapped at a predetermined position on the base plate 362.

In this way, in accordance with the manufacturing apparatus described above, the insulating sheet laminating means K, insulating layer forming means C, conductive layer forming means E, laser punching means P and a first pressing means R1 are loaded into or unloaded from the space for laminated member to form a thin film layer having a predetermined electrode pattern arranged on the insulating sheet ZS on the base plate 362, loading or unloading of each of these means is repeated to form the laminated member, thereafter each means is retracted, both openings 361$b$, 361$b$ are closed by both right and left shielding means H, H, the laminated member is pressed (main press contacting) with the second pressing means R2 while air in the space S for laminated member being evacuated by the vacuum means I, air left between the insulating sheet ZS and the thin film layer and inside the thin film layer is evacuated and at the same time a close fitness between the insulating sheet ZS and the thin film layer is improved to cause each of the layers to be unified.

Although an operating order of each of the aforesaid means and mechanisms is not described in detail, for example, when the laminated member for an inductor is to be manufactured, it is satisfactory that each of the aforesaid means is loaded into or unloaded from the space S for laminated member in such a way that the order becomes an order of lamination shown in FIG. 52.

Further, although the manufacturing apparatus En described above shows the preferred embodiment in which both first pressing means R1 and second pressing means R2 are provided as the pressing means, this configuration saves the first pressing means R1 and it is also possible to apply both a temporary press contacting and a main press contacting over the insulating sheet by the second pressing means R2 every time the insulating sheet ZS is laminated or after the last insulating sheet ZS is laminated.

In addition, the manufacturing apparatus above is constituted as one saving the shielding means and/or vacuum means and it is also possible to attain that the upper surface of the insulating sheet is pressed within atmospheric atmosphere.

In addition, in the case of manufacturing steps for the laminated member shown in FIG. 52, it can be applied that one step in which the electrode layer is formed and the other step in which the insulating layer is formed (FIGS. 52($b$), ($c$) and FIGS. 52($f$), ($g$)) are reversed.

Further, as the laminated member to be manufactured in the present invention, this is not limited to an inductor and a capacitor to be described, but it contains some electronic laminated component parts such as a laminated substrate, a resistor, a magnetic member and a filter or the like.

In accordance with the present invention, the insulating layer forming means, conductive layer forming means and drying means are arranged side by side at a linear segment path where the base plate is reciprocated, a predetermined operation is carried out effectively at each of the steps at the time of moving forward and returning of the base plate, so that it is possible to perform an efficient manufacturing of each of the thin films of the laminated member and at the same time, the manufacturing time for these laminated members can be shortened to enable a productivity to be increased.

Then, since it is satisfactory that a requisite minimum number of insulating layer forming means, conductive layer forming means and drying means are arranged side by side, it is possible to provide a small-sized device capable of being practically applied in which a requisite length of the segment path can be set short and a less-expensive manufacturing device by the minimum requisite number of each of the forming means.

Then, since at least one of the drying means is arranged at a substantial central part an the segment path as described in 2nd aspect, some work steps such as a forming step for the insulating layer and a forming step for the conductive layer (for example, an electrode layer, a resistor and a magnetic member and the like) can be carried out effectively and a small-sized formation of the device can be promoted with the moving segment path of the base plate being made minimum.

In addition, in accordance with 3rd aspect employing an ink jet system in at least one of the insulating layer forming means, it is possible to form an insulating layer in a high precision manner by filling ceramics slurry or insulating resin paste to the notch fitting part between the conductive layers (electrode layers) and further in accordance with 4th aspect, a flatness of the thin film layer is assured to eliminate the cause of occurrence of the void and it is possible to assure a high quality of electronic parts to be manufactured.

In addition, since the conductive layer forming means injects conductive paste through the ink jet system, it is possible to inject the conductive paste directly onto the electrode pattern by the conductive layer forming means to form the bier electrode in a high precision and fast manner without opening any bier hole in it (5th aspect).

In turn, in accordance with 6th aspect, even in the case that the bier hole is punched by the laser punching system, it is possible to form the bier electrode in a precise and positive manner by filling the conductive paste by the conductive layer forming means.

Further, in accordance with 7th aspect, since the upper surface of the formed thin film layer is temporarily press contacted, some corrugations on the upper surfaces of the ceramics insulating layer and electrode pattern formed by the insulating layer forming means and the conductive layer forming means are made flat to make them in flush to each other, and at the same time a laminating accuracy of a next thin film layer is increased, a close fitness between it and the lower thin film layer is increased to cause each of the layers to be unified in quality, resulting in that it is possible to provide a high quality laminated member.

Then, in accordance with 8th aspect, in addition to the temporary press contacting function, some fine particle pieces of ceramics slurry and conductive paste are removed and they are not mixed to each other, so that it is possible to manufacture a higher quality laminated member (9th aspect).

Since a predetermined operation is carried out effectively at each of the steps at the time of advancing operation and returning operation of the base plate, it is possible to manufacture each of the thin film layers of the laminated member in an efficient manner and at the same time it is possible to shorten a manufacturing time for these laminated members and increase a productivity.

Then, each of the insulating layer forming unit, conductive layer forming unit and drying machine unit is formed into a unit shape and is removably attached to the machine frame, so that setting of each of these units can be easily performed, arrangement of each of the units is changed to enable itself to be set at an apparatus for manufacturing different laminated electronic component parts such as a capacitor or inductor, resistor and magnetic member or laminated substrate and thus a universal small-sized apparatus can be provided in less-expensive manner.

In addition, in accordance with 10th aspect, as the ink jet system is employed in the insulating layer forming unit and conductive layer forming unit, a fine minute layer can be formed and at the same time ceramics slurry is filled in the notch fitting part between the conductive layers (electrode layers), resulting in that the insulating layer can be formed in a high precision manner. In accordance with 11th aspect, even if a bier hole is opened by the laser punching system, it is possible to fill conductive paste by the conductive layer forming unit and to form the bier electrode in a precise and positive manner.

Further, in accordance with 12th aspect, since the upper surface of the formed thin film layer is temporarily press contacted, some fine corrugations at the upper surfaces of the ceramics insulating layer and the conductive pattern (electrode pattern) formed by the insulating layer forming unit and the conductive layer forming unit are made flat to cause themselves to be flush with each other, a laminating precision of a next thin film layer is improved and at the same time a close fitness between it and the lower thin film layer is increased to cause each of the layers to be uniformed and flush to each other, resulting in that a high quality laminated member can be provided.

Then, in accordance with 13th aspect, a surface state of the formed thin film layer is detected by the CCD camera unit to enable either a pin hole in the insulating layer or a broken line in the conductive layer (electrode layer) to be detected, so that a yield in the manufacturing of laminated member can be increased and a productivity can be improved, resulting in that a clogged state at the ink jet nozzle can be found and its maintenance or inspection can be easily performed.

Since a predetermined operation is carried out at each of the work surfaces under an intermittent rotation of a polygonal-snaped rotary drum, each of the thin film layers in the laminated member can be manufactured efficiently, a number of these laminated members can be manufactured once to reduce a manufacturing time and its productivity can be increased (14th aspect).

Then, each of the work surfaces is of a rotary type under application of the rotary drum, so that it is possible to provide a small-sized manufacturing apparatus having a small mounting floor area.

Further, since a carrier film wound around the rotary drum is used, it is possible to make a positive holding of the laminated state of the thin film layer at each of the work surfaces and at the same time the laminated member can be easily recovered. In addition, in accordance with 15th aspect, the carrier film can be closely contacted in tension at each of the work surfaces. Further, in accordance with 16th aspect, a required time for one rotation of the rotary drum can be shortened, a manufacturing speed of the thin film layer can be increased and a productivity can be improved.

Then, if the ink jet system is used in the insulating layer forming means, the insulating layer can be formed in dense state and an insulating accuracy can be increased. In accordance with 18th aspect, an accurate electrode pattern can be formed while positional control over the insulating layer forming means and the conductive layer forming means of the ink jet system is positively carried out.

In addition, in accordance with 19th aspect, it is possible to make the upper surfaces of the insulating layer formed by the ink jet system flat and to cause its quality to be unified. In accordance with 20th aspect, it is possible to perform an easy and positive manufacturing of the laminated member for an inductor or the like having the bier electrode. In accordance with 21st aspect, it is possible to make some fine corrugations generated at the ceramics slurry or conductive paste in the thin film layer flat and assure its flatness, to unify the laminated layer and increase a laminating accuracy.

Then, in accordance with 22nd, 23rd aspects, it is possible to perform an easy and positive recovering of the ceramics laminate member formed at each of the work surfaces of the rotary drum and at the same time a convenient arrangement structure can be installed at the mounting space for the laminated member recovering mechanism.

In 24th aspect, each of the insulating layer forming means, conductive layer forming means and drying means is mounted above the work stage in such a way that it can be loaded into or unloaded from the space, the insulating layer forming means, conductive layer forming means and drying means are loaded into or unloaded from it while the work table is kept still to perform a predetermined work and to form the thin film layer, so that each of the thin films of the laminated member can be manufactured efficiently and at the same time a manufacturing speed of these laminated members is increased, its manufacturing time can be shortened and its productivity can be improved.

Further, as described in 27th, 32nd aspects, when the ink jet system is employed as the insulating layer forming means, the electrode layer and insulating layer can be formed in a high precise and high dense manner. Then, as described in 28th aspect, ceramics paste is filled in the notch fitting part left between the electrode layers to form the insulating layer, thereby the flatness of the thin film layer is assured, thereby some causes of generating voids are removed and this state is effective in keeping quality of electronic parts manufactured at a high level.

Then, as described in 34th, 35th aspects, when a bier hole is formed by an ink jet system acting as the insulating layer forming means and the bier electrode communicating between the electrode layers with the conductive layer forming means of the ink jet system is filled in the bier hole, the bier electrode can be formed precisely and positively.

In addition, in 25th aspect where the thin film layer is temporarily pressed by the temporary press contacting means, some corrugations on the upper surfaces of the ceramics insulating layer and the conductive pattern (electrode pattern) formed by the insulating layer forming means and the conductive layer forming means are made flat and flushed to each other, a laminating accuracy in a next thin film layer can be improved, a close fitness between it and the lower thin film layer can be increased to cause each of the layers to be unified and flushed with each other, a high quality laminated member can be formed and a yield of deformation at the time of main press contacting can be prevented in advance.

Additionally, when the layout is made such that the temporary press contacting means is oppositely faced against the work stage through the space for laminated layer as described in 26th aspect, the temporary press contacting means is mounted under an effective utilization of the upper space only left around the work stage, resulting in that a more compact sized apparatus can be attained without damaging a function of each means.

Further, as described in 31st aspect, in the case of the manufacturing apparatus comprised of a shielding means for closing the space for laminated member above the work stage and causing inside part of the space for laminated member to be non-communicated with surrounding atmosphere, and a vacuum means for making the inside part of the space for laminated member vacuum atmosphere when each means (the insulating layer forming means, drying means and conductive layer forming means) is retracted, and a vacuum means for making inside part of the laminating member into vacuum atmosphere, it is possible to provide newly a small-sized and useful manufacturing apparatus in which the operations from the temporary press contacting to the main press contacting are carried out while the laminated members are being laminated in their small-occupied space.

In addition, as described in 29th, 33rd aspects, if the configuration is employed in which the laser punching means is loaded onto or unloaded from the work stage, it is possible to form the bier hole even in the case that the doctor blade system and roller coating system or the like are employed as the insulating layer forming means and to form the bier electrode in the bier hole in a precise manner.

Additionally, in 30th, 36th aspects, since the insulating layer forming means, drying means, conductive layer forming means and laser punching means are collected around the work stage, a small-sized and space-saved manufacturing apparatus can be expected in which the laminated members are laminated while both formation of the bier hole by the punching work and formation of the bier electrode are being carried out and either a temporary press contacting operation or a main press contacting operation is executed.

In accordance with 37th aspect, the thin film layer having a predetermined electrode pattern arranged therein is formed between each of the sheets in a plurality of insulating layers, so that the thin film layer is held by the insulating sheets to cause a flatness of each of the thin film layers to be improved.

In addition, since the insulating sheet is overlapped on the thin film layer, its work time can be shortened as compared with that of the prior art in which a flat insulating layer (upper and lower insulating layers of the thin film layer having electrode layer) is formed by injecting ceramics slurry.

Accordingly, it is possible to form the thin film layer having an electrode pattern in a high flatness and high precise manner, to form the upper and lower insulating layers above the thin film layer with the insulating sheet in a short time and subsequently to perform an efficient manufacturing of laminated member having a high inner accuracy and high quality.

Additionally, in accordance with 38th aspect, predetermined works are carried out effectively at each of the steps at the time of advancing forward and returning operations of the base plate, so that each of the thin film layers in the laminated member can be manufactured more efficiently, a manufacturing time of these laminated members can be shortened and productivity can be improved.

Then, it is satisfactory that a requisite minimum number of insulating layer forming means and conductive layer forming means are arranged side by side, so that it is possible to provide a small-sized and less-expensive manufacturing apparatus in which a requisite length of the segment path can be set short, its practical application can be realized and a requisite minimum number of each of the forming means are applied.

Further, in accordance with 39th aspect, each of the insulating layer forming means and conductive layer forming means is formed into a unit type and removably attached to a machine frame, so that each of these units can be easily set, it can be adapted for a manufacturing of various kinds of laminated members by changing arrangement of each of the units and a universal small-sized apparatus can be provided in a less-expensive manner.

Further, in accordance with 40th aspect, a predetermined work is carried out at each of the work surfaces through an intermittent rotation of a polygonal-shaped rotary drum, so that each of the thin film layers of the laminated member can be manufactured efficiently and at the same time a large number of these laminated members are manufactured at once, its manufacturing time is shortened and its productivity can be improved.

Then, this is formed into a system in which the rotary drum is used to cause each of the work surfaces to be rotated, so that it is possible to provide a small-sized manufacturing apparatus having a small mounting floor area.

Further, in accordance with 41st aspect, each of the insulating sheet laminating means, insulating layer forming means and conductive layer forming means is installed above the base plate in such a way that they can be loaded onto or unloaded from the base plate, and the insulating sheet forming means, insulating layer forming means and conductive layer forming means are loaded or unloaded while the work table is kept still to perform a predetermined work and to form the thin film layer, so that each of the thin film layers of the laminated member can be efficiently manufactured by the low cost apparatus having a less number of insulating layer forming means and electrode layer forming means and further a manufacturing speed of these laminated members is increased, its manufacturing time is shortened and productivity can be increased.

Further, in accordance with 42nd aspect, the upper surface of the insulating sheet can be pressed and mainly press contacted by the pressing means under a state in which the space for laminated member is vacuum evacuated by the shielding means and the vacuum means, so that the upper surface of the insulating sheet is made flat to increase a laminating accuracy of a next thin film layer, air left between the insulating sheet and the thin film layer and inside the thin film layer is evacuated, a close fitness between the insulating sheet and the thin film layer is increased, quality of each of the layers is unified, each of the layers is integrally formed, resulting in that a high quality laminated member can be formed.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. An apparatus for manufacturing a laminated member in which a base plate is mounted along a linear predetermined segment path for reciprocation along the path and to be moved up and down, and in which at least one insulating layer former that discharges ceramics slurry or insulating resin paste, at least one conductive layer former that injects conductive paste by an ink jet system, and at least one dryer that dries said slurry and/or paste, are arranged side by side along the path, and in which a thin film layer having a predetermined conductive pattern arranged thereon is formed on a ceramics insulating layer during reciprocation of said base plate along the path, wherein plural of the thin film layers are formed to produce the laminated member, and at least one temporary presser is arranged along the path to selectively contact and press upper surfaces of said thin film layers, wherein said temporary presser is a pressing roll configured to contact the slurry and/or paste dried by the dryer, and having a quite fine adhering characteristic at its surface, and a dust removing roller having an adhesive characteristic, and configured to contact said pressing roll.

2. An apparatus for manufacturing a laminated member, wherein each of an insulating layer former that discharges ceramics slurry or insulating resin paste, an electrode layer former that injects conductive paste through an ink jet system, and a dryer that dries the slurry and/or the paste, are mounted above a work stage in such a manner that they can be loaded or unloaded;

said insulating layer former, dryer and electrode layer former are loaded or unloaded above the work stage, thereby a thin film layer having a predetermined conductive pattern arranged on an insulating layer is formed on the work stage, the loading or unloading of the insulating layer former, the dryer and the electrode layer former repeatedly forms the laminated member comprised of plural of the thin film layers;

a presser is arranged above the work stage, and each of the insulating layer former, the dryer and the electrode layer former are mounted between said work stage and the presser in such a manner that they can be loaded or unloaded;

a shield is provided to cause a space for the laminated member above the work stage to be isolated from a surrounding atmosphere when the insulating layer former, the dryer and the electrode layer former are retracted, and a vacuum source is provided for reducing pressure in the space for the laminated member; and the thin film layers are pressed by the presser as they are formed, and the laminated member is pressed by the presser while the space for the laminated member is isolated by the shield and the vacuum source is operated.

3. An apparatus for manufacturing a laminated member according to claim 2, wherein said insulating layer former injects ceramics slurry or insulating resin paste through an ink jet system to form an insulating layer.

4. An apparatus for manufacturing a laminated member according to claim 2, wherein a laser puncher that forms a bier hole in the insulating layer, and the presser, are mounted above the work stage, and conductive paste is filled by said electrode layer former into the bier hole formed by said laser puncher to form a bier electrode.

5. An apparatus for manufacturing a laminated member according to claim 4, wherein the insulating layer former, dryer, electrode layer former and laser puncher are positioned around the work stage.

6. An apparatus for manufacturing a laminated member, wherein there are provided an insulating sheet laminator that overlaps an insulating sheet, a conductive layer former that injects conductive paste on the insulating sheet, and an insulating layer former that discharges ceramics slurry on the insulating sheet;

repeated operation of the laminator, conductive layer former and insulating layer former forms a laminated member having a thin film layer with a predetermined conductive pattern being arranged between each of a plurality of insulating sheets;

each of said insulating sheet laminator, said insulating layer former and said conductive layer former are mounted above a base plate in such a manner that they are loaded or unloaded;

the insulating sheet laminator, insulating layer former and conductive layer former are loaded or unloaded above the base plate to form the thin film layer having the predetermined conductive pattern arranged on the insulating sheet above the base plate;

repeated loading or unloading of the insulating sheet laminator, insulating layer former and conductive layer former forms the laminated member;

a presser that selectively presses the insulating sheet is arranged above the base plate;

a shield is provided to isolate a space for the laminated member above the base plate from a surrounding atmosphere when the insulating sheet laminator, conductive layer former and insulating layer former are retracted, and a vacuum source is provided for reducing pressure in the space for the laminated member; and the laminated member is pressed by said presser while the space for the laminated member is isolated by said shield and said vacuum source is operated.

* * * * *